(12) United States Patent
Hirata et al.

(10) Patent No.: US 7,757,464 B2
(45) Date of Patent: Jul. 20, 2010

(54) MANUFACTURING METHOD FOR PACKAGING ELECTRONIC PRODUCTS IN A BAND-SHAPED PACKAGE

(75) Inventors: Katsuyasu Hirata, Hyogo (JP); Osamu Shimada, Hyogo (JP); Kazuhiro Ohashi, Hyogo (JP); Takayuki Iizuka, Hyogo (JP); Hiroshi Shintani, Hyogo (JP)

(73) Assignee: Toshiba Matsushita Display Technology Co., Ltd., Tokyo (JP)

( * ) Notice: Subject to any disclaimer, the term of this patent is extended or adjusted under 35 U.S.C. 154(b) by 1448 days.

(21) Appl. No.: 11/096,091

(22) Filed: Apr. 1, 2005

(65) Prior Publication Data

US 2005/0241988 A1 Nov. 3, 2005

(30) Foreign Application Priority Data

Apr. 2, 2004 (JP) ............................. 2004-110503

(51) Int. Cl.
*B65B 11/50* (2006.01)

(52) U.S. Cl. ............................. 53/452; 53/450; 53/455; 53/558; 53/562

(58) Field of Classification Search .................. 53/450, 53/452, 455, 459, 466, 176, 558, 559, 562, 53/550, 444, 456, 158
See application file for complete search history.

(56) References Cited

U.S. PATENT DOCUMENTS

| | | | | |
|---|---|---|---|---|
| 2,194,451 A | * | 3/1940 | Soubier | 206/526 |
| 2,718,105 A | * | 9/1955 | Ferguson et al. | 53/548 |
| 2,993,313 A | * | 7/1961 | Hogan | 53/410 |
| 3,162,539 A | * | 12/1964 | Repko | 426/119 |
| 3,199,756 A | * | 8/1965 | Davy | 226/76 |
| 3,340,669 A | * | 9/1967 | Farquharson | 53/455 |
| 4,411,362 A | | 10/1983 | Itemadani et al. | |
| 4,944,979 A | | 7/1990 | Gagliano et al. | |
| 5,090,113 A | | 2/1992 | Umetsu et al. | |

(Continued)

FOREIGN PATENT DOCUMENTS

CN 1458044 A 11/2003

(Continued)

OTHER PUBLICATIONS

U.S. Appl. No. 11/540,579, filed Oct. 2, 2006, Hirata, et al.

*Primary Examiner*—Hemant M Desai
(74) *Attorney, Agent, or Firm*—Oblon, Spivak, McClelland, Maier & Neustadt, L.L.P.

(57) ABSTRACT

A method for manufacturing electronic or electric products such as flat-panel display devices, for coping with change or variations of dimensions of the products and for curbing damage or fracture on the products and reducing recovery cost for containers, according to one embodiment, comprising; sequentially placing first flat electronic or electric products as to be sandwiched by a resin-sheet band formed of one or pair of band-shaped flat resin sheet and as to be arrayed in a row; forming joined areas by bonding faces of the resin-sheet band as to form receptacles respectively for the first flat electronic or electric products; thus forming a band-shaped package; and then transporting or storing such array of the first flat electronic or electric products in the band-shaped package as to be used for producing second electronic or electric products.

19 Claims, 27 Drawing Sheets

U.S. PATENT DOCUMENTS

| | | | |
|---|---|---|---|
| 5,210,993 A * | 5/1993 | van Boxtel | 53/455 |
| 5,682,731 A | 11/1997 | Althouse | |
| 5,823,350 A | 10/1998 | Ward | |
| 6,170,237 B1 * | 1/2001 | Wipf | 53/455 |
| 7,516,596 B2 * | 4/2009 | Henderson et al. | 53/411 |
| 2003/0215590 A1 | 11/2003 | Kambara | |

FOREIGN PATENT DOCUMENTS

| | | |
|---|---|---|
| EP | 0 443 502 | 7/1994 |
| JP | 53-23788 | 3/1978 |
| JP | 58-027398 | 2/1983 |
| JP | 59-23799 | 2/1984 |
| JP | 60-129390 | 8/1985 |
| JP | 60-190100 | 12/1985 |
| JP | 62-132909 | 8/1987 |
| JP | 62-175378 | 8/1987 |
| JP | 63-162757 | 10/1988 |
| JP | 02-265850 | 10/1990 |
| JP | 3-256856 | 11/1991 |
| JP | 4-41860 | 4/1992 |
| JP | 2578902 | 5/1998 |
| JP | 2000-310785 | 11/2000 |
| TW | 189615 | 8/1992 |
| TW | 554900 | 9/2003 |

* cited by examiner

MANUFACTURING METHOD FOR PACKAGING ELECTRONIC PRODUCTS IN A BAND-SHAPED PACKAGE

FIELD OF THE INVENTION

This invention relates to a process for manufacturing electronic or electric products such as flat-panel display devices as well as packages for such process and products. The term of electronic or electric products will be used to encompass not only final products but also semifinished products, intermediate products and all kinds of electronic or electric parts or elements. The term of electronic or electric products encompasses; for example, display panels and light-guide plate of small dimensions (1-3 inch in diagonal length of viewing area) or medium dimensions (4-10 inch in the diagonal length); as well as semiconductor chips and printed circuit boards in small thickness dimensions.

BACKGROUND ART

Recently, markets of liquid crystal display devices and other flat-panel display devices grow rapidly. In particular, sharply growing are the markets of small and medium sized ones including those used in mobile phones, personal digital assistants and car navigation systems. In a manufacturing process of the flat-panel display devices, display panels proper or without annexes are manufactured and then mounted with connector boards such as flexible printed circuit boards (FPC) as to form display panels with annexes. Subsequently these are assembled with backlight devices or the like to form "display panel modules". In common circumstances, processes for the display panels proper, the display panel modules and final or consumer products are made in manufacturing facilities or compounds separate with each other. Thus, display panels proper and display panel modules are transported between them.

For transporting the display panels or the like, so-called traveling trays have been widely used, each of which has a plurality of receptacles. Please see JP-2002-332023A, JP-2004-018094A, JP-2002-337951A, which are Japanese unexamined patent publications. JP-2002-332023A, for example, discloses that receptacles are formed in a matrix manner on a small-depth traveling tray having elasticity, and display panels (display panels proper of its modules) are respectively fitted into the receptacles in a stable manner. In this way, damage or fracture on the display panels due to mechanical shocks or vibrations are curbed even during transportations by trucks, railways or airplanes. Also curbed is coming out of the panels from the receptacles due to the mechanical shocks or vibrations. Please see the JP-2004-018094A for example.

For miniature electronic parts such as semiconductor packages, various investigations are made for using carrier tapes in packaging and transportation of such parts. Please see JP-2003-095216A, JP-2001-348008A for example. The carrier tape is a tape of plastic film provided thereon with a row of receiving recesses in a constant interval. A cover film is used, when necessary, as to be air-tightly attached on fringes of the carrier tape for sealing off the miniature electronic parts such as semiconductor packages, as shown in the JP-2003-095216A. The receiving recesses may be formed by embossing process as in the JP-2003-095216A; or by punching a base film and then attaching an underlying film on such punched film, as shown in the JP-2001-348008A.

In otherwise, JP-2001-348008A proposes a method using a thin and flat band of stainless steel in place of the carrier tape. Semiconductor chips are placed on the band with a certain interval and then retained as covered with a cover film that is attached on the band. The JP-2001-348008A reads that, in this way, fracture or chipping away is curbed which otherwise be caused by collision among the semiconductor chips; and also reads that the band of steel with the semiconductor chips thereon may be wound around a reel.

The carrier tapes mentioned before are transported in a state being wound around a reel, after a process of placing of the electronic parts respectively in the receiving recesses on an embossed tape or the like and attaching the cover film, as shown in JP-2004-231257A.

Meanwhile, so-called cell cassettes or cell racks have been used for containing the display panels, glass substrates or other intermediate products, when the transportation is made among near-by facilities or near-by process lines within a same building or in a same compound. Please see JP-2000-310785A. The cell rack is formed of a rectangular casing that has a front opening and inward projections on right-hand and left-hand sidewalls, the projections being elongated in a front-rear direction as to catch dozens of the panels or the like that are vertically arrayed in the casing. When for subjecting the display panel or the like to vacuuming process or heating process or the like, the cell rack arrayed with the panels or the like is placed in a chamber for the vacuuming or the heating.

Conventional methods of using the traveling tray or the carrier tape require that dimensions of the electronic or electric parts almost agree with corresponding dimensions of the receiving recesses. Thus, in response to every switching or changing among types or variations of the electronic or electric products, the trays or tapes having other dimensions of receiving recesses have to be prepared. Meanwhile, the carrier tapes are designed to be solely applicable for miniature-sized electronic or electric parts, thus are difficult to be given with shock absorbency. Hence, no other method than using the traveling trays is imaginable when to transport electronic or electric parts such as the display panels, which have rather large dimensions and are highly susceptible to fracture or damage.

The transportation with the traveling trays causes generation of dusts or particles because edges of the display panel abrade catching surfaces of the trays. Moreover, the transportation system using the traveling trays requires sending back of emptied ones of the traveling trays if to be reused instead of abandoning them; for example after the traveling trays are used for transporting the display panel modules from its production sites to a worksite the consumer products are assembled. In particular, the traveling tray is not able to be baled in a folded-in or compressed form so that procedures of sending back the trays require large space in loading and high cost. Additionally, it is rather difficult to seal off inside of the traveling trays, thus is not easy to avoid intrusion of small particles or of moisture. For enabling the sealing off, it requires a procedure of wrapping up the traveling trays in a piled-up state, with a thick resin sheet, for example.

Meanwhile, the method of attaching electronic parts on a steel sheet is solely applicable to non-fragile ones such as the semiconductor chips having an enough thickness. This method should be not applicable to the display panels as needless to say, and even to semiconductor chips having thin configuration. Moreover, weight load in transportation increases due to use of the steel sheet.

At a worksite for loading the electronic or electric products as to be filled into the traveling trays, it requires a space for piling up the traveling trays before and after the loading. A procedure of the loading in a sequential manner requires sequential shifting of loading position as well as taking a not-filled one of the traveling trays on an already filled one. Thus, the procedure of the loading is troublesome and requires a lot of working load. Even when using a robot arm, it requires a complicated process.

The method of using "cell racks" for transportation to and from near-by sites requires less workload for the loading procedure. Nevertheless, the method requires spaces for placing and storing the cell racks. When dimensions of the display panel is changed or switched to another ones, the cell racks have to be de-assembled and reassembled so as distance between the sidewalls and/or projection-wise dimensions of the projections on the sidewalls to be adjusted. In otherwise, the cell racks are switched over to another ones in preparation. However, it requires a large stock of the cell racks in various dimensions, thus also increasing spaces for the cell racks. Such reassembling requires a considerable work time and skilled work because precise adjustment is needed. In the cell racks, glass substrates or display panels formed thereof may collide with or abrade inner wall faces of the cell racks so as to cause problems such as fracture or chipping off on glass substrates and forming of "shaving" or dust particles.

In view of the above drawbacks, it is aimed to cope with change or variations on dimensions of the electronic or electric parts in a swift manner with low cost, to curb damages on the parts and dust formation, and to omit or decrease costs for reusing the packages or containers.

BRIEF SUMMARY OF THE INVENTION

A method for manufacturing electronic or electric products, according to a preferred embodiment, comprising: sequentially placing first flat electronic or electric products as to be sandwiched by a resin-sheet band formed of one or pair of band-shaped flat resin sheet and as to be arrayed in a longitudinal direction of the resin-sheet band; forming joined areas by bonding or fusing faces of the resin-sheet band as to form receptacles respectively for the first flat electronic or electric products; thus forming a band-shaped package in which the first flat electronic or electric products are arrayed in a row with a predetermined interval; and then transporting or storing such array of the first flat electronic or electric products in the band-shaped package as to be used for producing second electronic or electric products.

The term "electronic or electric products" in present invention encompasses a wide variety of products and intermediate products in fields of electronics and electrics, as well as a wide variety of parts, devices and elements to be assembled into such products. The term "resin sheet" encompasses not only sheets of relatively large thickness but also films of relatively small thickness, insofar as being formed of resin.

A method for manufacturing electronic or electric products, according to another preferred embodiment, comprising: forming joined areas between faces of a resin-sheet band formed of one or pair of band-shaped flat resin sheet, thereby forming receptacles in a row for respectively receiving flat electronic or electric products or parts; then placing such products or parts in the receptacles of the resin-sheet band as to form a band-shaped package; and subsequently taking out such products or parts from the band-shaped package.

A band-shaped package for electronic or electric products, according to a preferred embodiment, comprising: a resin-sheet band formed of one or pair of band-shaped flat resin sheet; joined areas joining faces of the resin-sheet band by adhesion or fusion; receptacles formed by the joined areas; flat electronic or electric products arrayed in a row in one or more predetermined interval, each of said flat electronic or electric products being received in one of the receptacles and as being held in a predetermined position on the resin-sheet band by the joined areas; and fringe extension areas extended from the resin-sheet band on opposite sides on a row of the receptacles.

A method of producing a band-shaped package for electronic or electric products, according to a preferred embodiment, comprising: providing a first joined areas between the obverse and reverse sheet parts of a resin-sheet band formed of one or pair of band-shaped flat resin sheet, along one of its fringes, as to form receiving space for the electronic or electric products; then, horizontally feeding the resin-sheet band while keeping the resin-sheet band as tilted as said one fringe to come to lower position; continuously widening gaps or distance between said obverse and reverse sheet parts at along another fringe opposite to said one of fringes, during said feeding; and inserting the electronic or electric products from said another fringe, during said feeding.

A packing device according to a preferred embodiment, comprising: a horizontally feeding area for feeding a resin-sheet band formed of one or pair of band-shaped flat resin sheet, in a substantially horizontal direction while keeping the resin-sheet band as tilted as one of its fringe to come to lower position; and a guide for widening gap or distance between obverse and reverse sheet parts of the resin-sheet band as to form an insert area for inserting flat electronic or electric products.

An unpacking device according to a preferred embodiment, comprising: a first driving roller for pulling first part from the resin-sheet band as being wound around the first driving roller as taken from the band-shaped package; a second driving roller for pulling second part of the resin-sheet band as being wound around the second driving roller as also taken from the band-shaped package; a sheet band separating area into which the band-shaped package is sequentially fed in, and in which said first and second parts are separated from the band-shaped package as being pulled in opposite directions, such sequential feeding and tract-wise separating being driven solely by the first and second drive rollers; and a retrieve area which is located between the sheet band separating area and the first driving roller and at which the electronic or electric products are laid on said first part of the resin-sheet band as to be readily taken away.

By the invention, it is easy to cope with change or variation on dimensions of the electric or electronic products, and is able to curb damage on the products and dust generation so as to decrease cost for packaging and recycling the packages or the like.

DETAILED DESCRIPTION OF THE INVENTION

Figure 1:
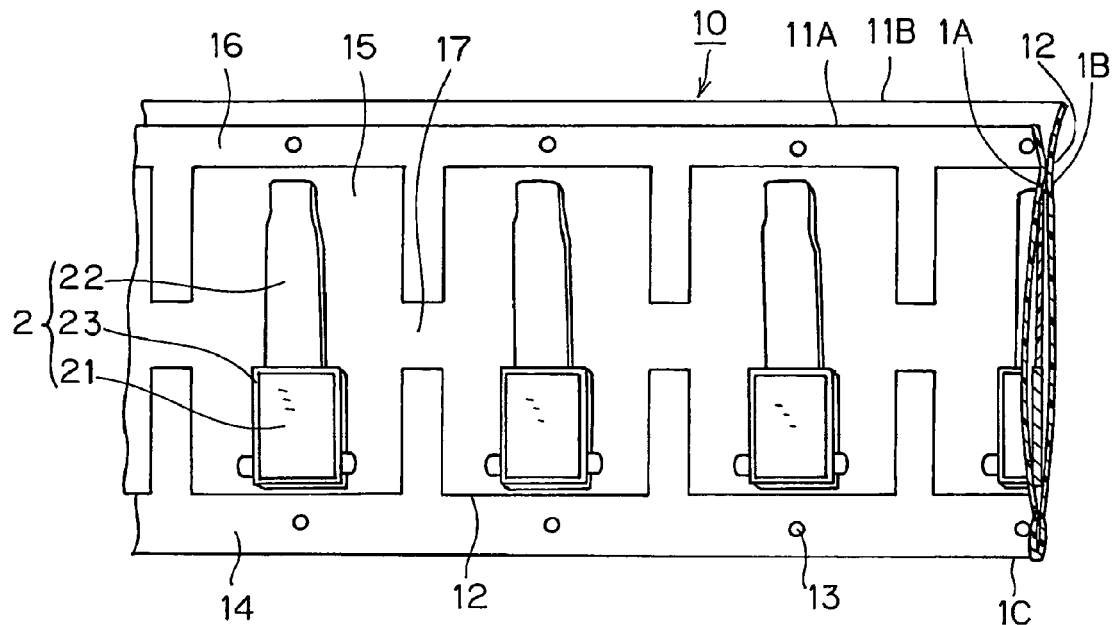
FIG. 1 is a plan-view-wise perspective view schematically showing an example of a band-shaped package having display panel modules.

In view of the drawbacks of the conventional techniques mentioned earlier, the chief inventors have investigated packaging materials for replacing the traveling trays and/or the cell racks. The investigation is made in particular on foamed materials and laminated composite materials in order to fulfill difficult requirement of satisfying both of following; placing shock absorbent materials as to avoid fracture and/or chipping off, and positioning the display panels or the like as to avoid positional shifting.

On course of the investigation, the inventors have accidentally tried a simple method of placing the display panels between flat sheets of a general-purpose resin and heat-sealwise connecting the sheets at some or necessary portions. As a result, it was totally surprising that both of holdfasting of the display panels and protecting them from shocks and damages are achieved in occasions under proper conditions. A package in a band shape similar as the carrier tape is also achieved and such band-shaped package was woundable on a reel and was able to be fed from the wheel.

On course of further investigation, the inventors found that the band-shaped package may be folded in or folded back at proper portions and be held in such folded state, thus wounding around the reel is not necessary. Moreover, by forming such band-shaped package, holding and/or packaging of the electronic or electric parts may be made by processes and devices simpler than those for the tape carrier.

On course of still further investigation, such unconventional band-shaped package is found to be usable in place of the "cell racks", when pockets in the band-shaped package are not closed after inserting of the electronic or electric parts and are oriented in a state the openings of the pockets face upward.

For the band-shaped package, any resin sheet is adoptable if the sheet has some extent of tensile strength, toughness, durability and flexibility and is capable of being bonded together by adhesion or fusion. For such fusion bonding, thermoplastic resin is desirable, whereas laminated sheets having fusion-bonding layer are also adoptable. When bonding is made by adhesive, adoptable are any resin sheets having some adhesiveness, for example, resin sheets having surfaces roughened or polarized by some surface treatment. The resin sheets are possibly formed of elastic resin or foamed resin.

The resin-sheet band is preferably transparent at least either for obverse and reverse faces of the band-shaped package, is more preferably transparent at both of the obverse and reverse faces. Through a transparent sheet, types and states of the electronic or electric products in the package are easily identified and confirmed. For example, production lot numerals or name of variations printed or curved in the electronic or electric products are readily readable, and defective products having failure or breakage in their contour are easily detected. When only either of obverse and reverse part of the resin sheet is formed of transparent sheet, other part may be formed of the foamed resin.

The resin-sheet band preferably has antistatic property on at least either of the obverse and reverse sheet parts of the band-shaped package. Antistatic materials may be blended into resin for forming whole of either of the resin sheet parts. In otherwise, an antistatic layer may be provided on at least either of the resin sheet parts. In such way, undesirable static electricity and damage thereby are curbed during each of packing, transportation and unpacking processes. The antistatic property may also be given by providing a transparent conductive layer that is dispersed with conductive particles formed of Indium-doped tin oxide (ITO) or Indium-doped zinc oxide (IZO), for example. Non-transparent conductive particles such as carbon particles are possibly used for forming an antistatic layer. In a detailed example, a resin sheet disclosed in JP-07(1997)-175592A may be used, which is formed of; a base layer of low-density polyethylene or ethylene-unsaturated ester copolymer; and a surface layer of potassium ionomer of the ethylene-unsaturated ester copolymer. Such layer of the ionomer that is for the antistatic property also facilitates fusion bonding and peeling apart.

Fusion bonding for forming the joined areas may be made by anyone of widely used methods, such as ultrasonic sealing or ultrasonic welding, and impulse heat sealing. When adhesion bonding is to be made, reactive and non-reactive hotmelt adhesives are adoptable as well as other adhesives widely used for plastics. Obverse and reverse sheet parts of the band-shaped package are formed of same material in a preferred embodiment, and are formed by one piece of resin sheet that is folded at around its centerline in an especially preferred embodiment. By such a manner, fusion-bonding property is easily given and feeding and recovering of the resin sheet or the like are facilitated. Thickness of the resin sheet is preferably 10 through 300 μm and more preferably 30 through 80 μm.

The electronic or electric products to be placed in the band-shaped package are flat in configuration. Ratios of thickness to length and breadth of the products are at least 1/5 and typically 1/10 through 1/100. The electronic or electric products encompasses not only flat panels or flexible sheets but also substrates mounted with a various small parts for example, and is possibly be panels having some curvature. In a preferable manner, the electronic or electric products in same kind are arrayed in the band-shaped package at a constant interval. Nevertheless, the two or more kinds of the electronic or electric products may be arrayed in some proper order and interval between them may be suitably adjusted, for example, by taking a large interval between the receptacles at which production lot is switched to other one. In other wise, a set of parts for assembling one electronic or electric product may be placed in consecutive receptacles in a row, as a kit. Meanwhile, when diameter of the electronic or electric products is no more than 3 inches and if the obverse and reverse sheet parts are separate resin sheets, it is possible to array the products in two or three rows in a longitudinal direction of the band-shaped package.

In a preferred manner, positioning of the electronic or electric products is given when the receptacles are formed by the joining. That is, the products arrayed in a resin-sheet band are further adjusted in their position and secured in such position, at a time of the joining. For example, due to tensional stress of the sheet applied on edges or corners of the products, they are kept as not to be positionally shifted. If some extent of positional shifting in widthwise direction of the band-shaped package is allowed, positioning and securing of the products may be made in respect of longitudinal direction of the band-shaped package, at the time of the joining.

The electronic or electric products especially suitable for being contained in the invention-wise band-shaped package are display panels before and after attaching connector boards; preferably those of diagonal dimension of the viewing area of no more than 10 inch, more preferably no more than 8 inch, further preferably no more than 4 inch. The display panels are typically liquid crystal display panels, whereas the same goes for organic EL (electro luminescence) panels, inorganic EL panels or the like. The display panels to be contained are preferably those formed of glass substrate or the like that are relatively susceptible to damage or fracture. Other examples of the flat electronic or electric products are backlight devices, light-guide plates, driver circuit boards or the like, for flat-panel display devices, which have dimensions substantially equal to the above-mentioned display panels, that is, for small and medium sized flat-panel display devices.

The band-shaped package preferably has fringe extension areas extended from the resin-sheet band on both sides on the row of the receptacles. The fringe extension areas take a role as shock absorber or cushioning when the band-shaped package is wound around an axis or folded in.

When to take out the electronic or electric products from the band-shaped package, it is necessary to successively open up the band-shaped package, preferably in a manner to make the products successively retrievable, as to successively supply the products to a next processing or the like. In a preferred embodiment, the band-shaped package is easily opened up by applying a tensional stress necessary for separating the obverse and reverse sheet parts of the resin-sheet band. In another preferred embodiment, the obverse sheet part is provided with a to-be-broken portion along a fringe of the band-shaped package so that tearing of the obverse sheet part may be made successively from one end of the band-shaped package in a manner the receptacles are opened up successively.

When for facilitating the retrieving by peelable or separatable joined areas, the band-shaped package preferably has a double-margined fringe extension area at which two fringe areas of the resin sheet(s) are overlaid as not joined together. Separation of the sheet parts is easily made by successively drawing apart the two fringe areas. In otherwise, by drawing apart of the two fringe areas, one of the receptacles may be opened up at any position on an intermediate between two ends of the band-shaped package as to facilitate sampling inspection of the products. For example, a display performance test as called as dynamic operating inspection is made to a display panel module. At the double-margin fringe area preferably, one of the fringe extension areas preferably jutted out from another one as to facilitate the tearing apart.

When for facilitating the retrieving by the to-be-broken portion, the to-be-broken portion is provided on one of the obverse and reverse sheet parts, preferably on the obverse sheet part. The to-be-broken portion is preferably broken when undergoing some separating-apart-wise stress; thereby enabling easy and separate opening of one of the receptacles at intermediate portion between ends of the band-shaped package. The to-be-broken portion is for example formed by openings in a row such as dotted line or broken line or by scraping surface of the sheet part in a sectional shape of a notch as to be extending in a line.

By adopting a manner of the successive packing and unpacking, storage spaces for the traveling trays and/or retrieving mechanisms for the trays are omitted at nearby of the assembling sites. The packing may be made immediately and successively after production of the electronic or electric products and the unpacking of the products may be made just before a subsequent assembling, so that attaching of foreign particles are minimized.

In a preferred embodiment in the method for producing the band-shaped package, the package is formed by a following manner of feeding of the electronic or electric products. While a resin sheet is folded as to form a V-shaped section opened upward, the electronic or electric products are dropped into or slid into such opening of the V-shaped section. By some stopper action, the products are stopped before arriving bottom end of the V-shaped section and positioned in width direction of the band-shaped package.

In another preferred embodiment in the method for producing the band-shaped package, pockets are provided on beforehand, by joining obverse and reverse sheet parts of the flat resin-sheet band, at necessary or appropriate areas. A packing device for producing the band-shaped package has horizontally feeding area and vertically feeding areas. In the horizontally feeding area, distance or space between the sheet parts is opened up along opening of the pockets by a sheet-opening guide; and in such opened state, the electronic or electric products are successively inserted to the pockets. Transition from the horizontally feeding area to the vertically feeding area is made by sliding on a curved face that makes path length of the resin-sheet band constant and has a cutout. The vertically feeding area is provided with a heat sealer that is for closing the pockets if necessary or appropriate. By combining the horizontally and vertically feeding areas in this manner, space for placing the packing device become small. Moreover, when the pockets are closed during feeding of the resin sheet downward, the resin sheet is fully stretched so that wrinkle and stress or torsion are avoided when forming the joined areas.

In a preferred embodiment of the band-shaped package, vacant receptacles are formed at interval of certain number of the receptacles, which enables folding of the band-shaped package in a winding form or in a zigzag form. One ends of the band-shaped package is made to be a lead portion that is formed of a consecutive row of the vacant receptacles or of a sheet part without joined areas.

In a preferred embodiment, the band-shaped package is wound around by itself or around a shock-absorbent core, as to be kept or transported in such a state. In another preferred embodiment, the band-shaped package is alternately folded in a waveform as to be kept or transported in such a state. In either of these states, the air or other gas contained in the receptacles may serve as a shock absorber. When folded alternately in the waveform, in a preferred embodiment of encasement of the band-shaped packages, storage casing such as cardboard box has a plurality of compartments that are separated from adjacent ones and from outer wall by shock-absorbent gaps and layers.

In a preferred embodiment in respect of the receptacles, these are sealed off from the air, and thereby, the electronic or electric products contained in the receptacles are protected from intrusion of foreign particles and moisture. The receptacles may be sealed off independently from each other, or in otherwise, may be continuous with each other through adequate communication channels or ports. At a time of the sealing off, inside of the receptacles may be replaced with inert gas such as nitrogen or carbon oxide gas, or in otherwise may be vacuumed to be vacated with oxygen. For example, the sealing off is made in a vacuum chamber, and under the air, the resin sheet is tightly contacted on outer faces of the electronic or electric products that are contained in the package. Moreover, moisture absorbent and/or deoxidizer may be placed in the receptacles when these are sealed off from the air. For example, a layer of polyvinyl alcohol is provided on inner face of the resin sheet as a moisture absorbent layer.

In one of the band-shaped package, a series of parts or elements such as a display panel proper, frame and connector board are placed as repeated in this order in the receptacles of the band-shaped package. In other wise, these parts may be placed separately in respective ones of the band-shaped package that are respectively placed in the compartments in a cardboard box.

In another preferred embodiment in respect of the receptacles, the pockets are remained as opened as the electronic or electric products are readily taken out and reinserted. Namely, an insertion opening of the each pocket is remained to be opened. In this manner, the resin-sheet band with receptacles is repeatedly used for transporting the electronic or electric products, between nearby work sites for example. Moreover, the electronic or electric products may be charged into an autoclave, a reactor vessel, or a processing chamber in a state contained in the receptacles of the resin-sheet band, as to be subjected to processing such as vacuuming, pressurization, heating, cooling, pressing, warm air blowing, gas substitution, aging, cleaning and the like. In other words, the resin-sheet band with receptacles may be used in place of the cell rack.

When for using repeatedly or as a multi pocket holder for processing, the resin-sheet band is preferably formed of resin with high durability or high heat resistance. Other than the polyethylene (PE) or its copolymers mentioned above, polypropylene (PP), polymethylpentene or the like may be used. As resins with higher durability or heat resistance, polyethylene terephthalate (PET), polyethylenenaphthalate or the like may be used; and in some occasions, fluorocarbon resins such as ethylene tetrafluoro-ethylene copolymer (ETFE), fluoroethylene-propylene copolymer (FEP) may also be used. For imparting antistatic property to these resins, a mesh layer formed of electric conductive fibers may be overlaid as attached.

The resin sheet of the band-shaped package may be printed with alphabetical or other letters, or with marks or symbols for indicating information such as device types, device variations, production lots, production dates, destination sites, destination devices and alarms on handling. For example, instead of making an engraved mark or attaching a label on the electronic or electric product, information or alarming necessary for subsequent processing may be indicated by a bar code, a row of marks or letters for alarming, or the like as to be read out when the products are taken out from the band-shaped package.

The band-shaped packages and method of packing explained hereto may also be used for shipping of the intermediate or final products. By such way of packing, the products may be placed in the package immediately after finishing, one after the other or in sequence; and then taken out from the package as to be used or sold, one after the other or in sequence.

Such taking out may be made totally by manual labor or by a robotics device. Nevertheless, by using an unpacking device at below, working efficiency is improved, and at the same time, possible damage or fracture incurred on the products due to erroneous dropping of the products is curbed. The unpacking device receives the band-shaped package from one side of the device as fed into the device, continuously or intermittently, and at same time opens the receptacles of the package one by other or in sequence, by tearing apart at the to-be-broken portions or by peel-wise separating or cutting of the resin-sheet band. Thus, the electronic or electric products are laid as readily be transferred to next process step machine or line, by one and one or by a certain number at each transfer operation by manually or by transferring device such as a robot arm. In a preferred embodiment, the to-be-broken portions or to-be-peeled off portions are provided along both fringes of the band-shaped package. Then, the unpacking device sequentially separating the obverse sheet part or its portion from reverse sheet portion or its portion by pulling in opposite directions so as to unpack the band-shaped package and make the products contained in it to be retrievable.

1. First Embodiment

Embodiment 1-1

Figure 2:
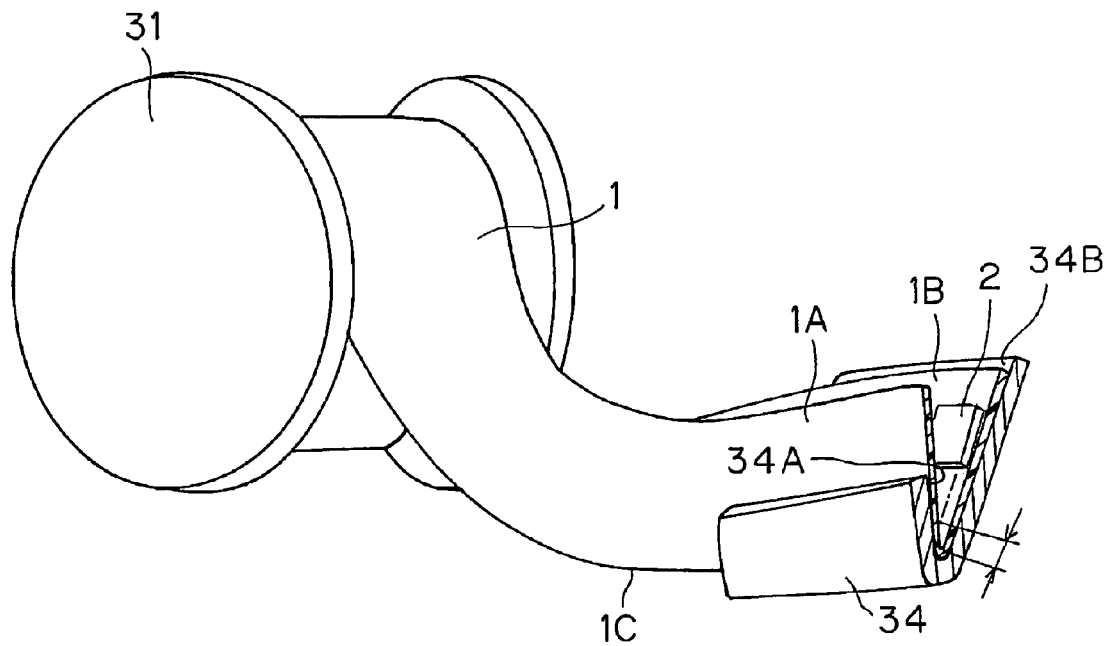
FIG. 2 is a perspective view schematically showing a process of placing the electronic or electric products as to be sandwiched by a resin-sheet band.
Figure 3:
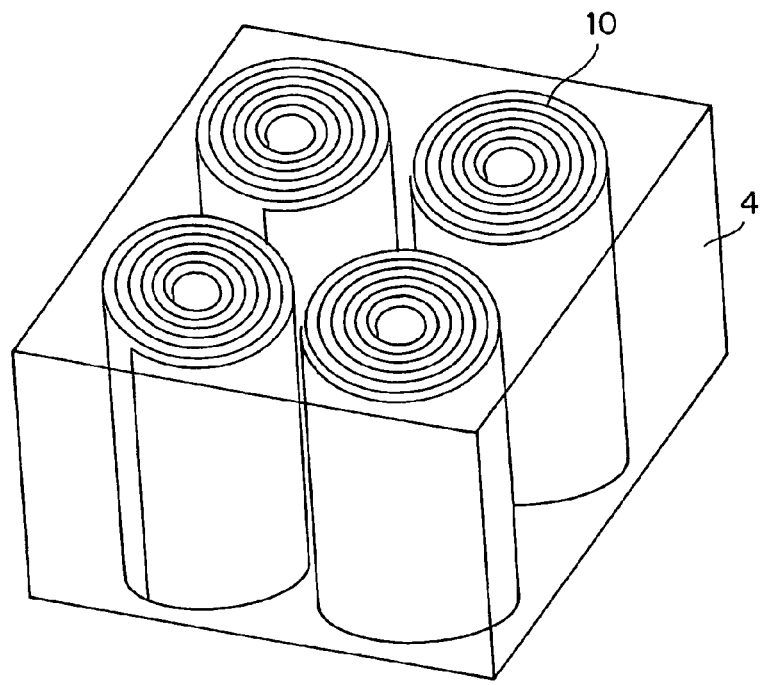
FIG. 3 is a perspective view showing an example of placing the band-shaped packages in a cardboard box.
Figure 4:
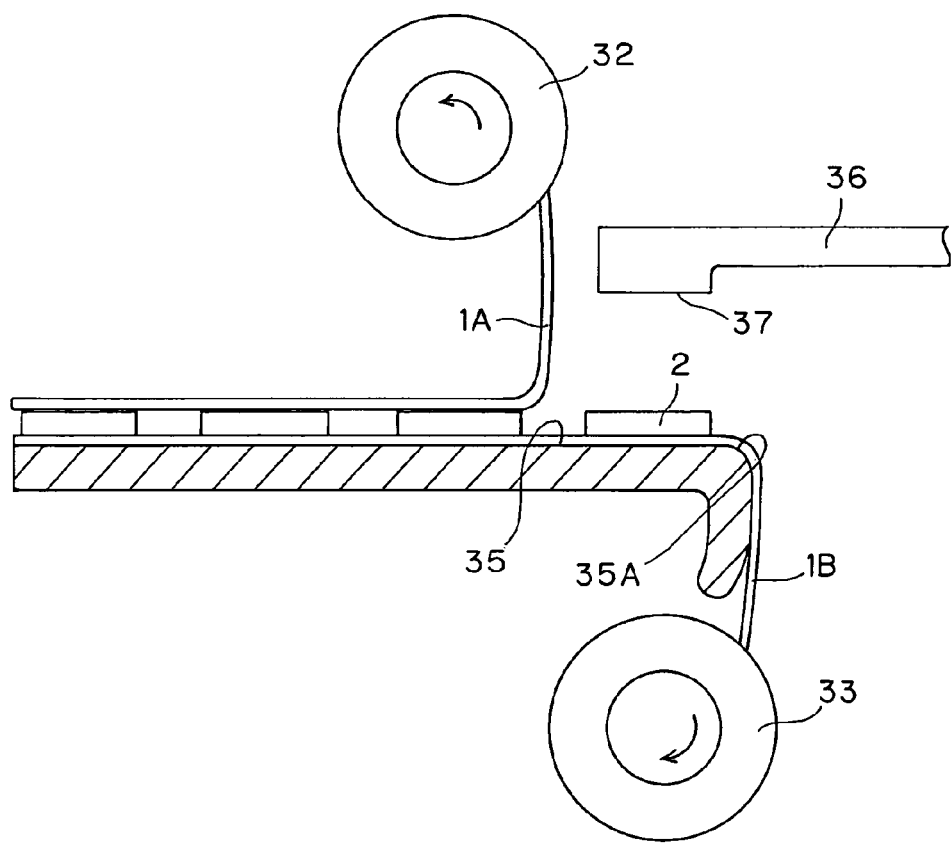
FIG. 4 is a sectional view schematically showing a process of separating the resin-sheet band into two sheet parts as to make the electronic or electric products as retrievable.

Embodiment 1-1 in respect of the band-shaped package and manufacturing method of the electronic or electric products will be explained by use of FIGS. 1-4. The products contained in the package are the display panel modules 2. FIG. 1 shows a band-shaped package 10 of the Example 1-1;

FIG. 2 shows a process of placing the electronic or electric products as to be sandwiched by a resin sheet; FIG. 3 is a perspective view showing a manner of placing the band-shaped packages in a cardboard box; and FIG. 4 is a sectional view schematically showing a process of separating the resin-sheet band into two sheet parts as to make the electronic or electric products as retrievable.

The display panel module 2 is comprised of a display panel proper 21 (not including connector wiring board or other attachments), a connector wire board 22 connected to the display panel proper 21, a frame 23 for retaining a periphery of the display panel proper 21, and a backlight device. In a detailed example, the display panel module 2 is to be assembled into a foldable mobile phone and the connector wiring board 22 is formed of a flexible printed circuit board (FPC) and controllers or the like attached thereon. The display panel proper 21 is formed of a pair of glass substrates and a liquid crystal material filling a minute gap between the substrates as to be enclosed in the gap. The display panel proper 21 is, for example, one having a polysilicone TFT (thin-film transistor) on each of pixel dots as a switching element, and has a 3-inch diagonal dimension for the viewing area.

A resin sheet 1 comprising the band-shaped package 10 is, in a detailed example, a transparent sheet that is formed of; a base layer consisting of a non-cross linked low-density polyethylene; and an antistatic sealing-resin layer consisting of potassium ionomer of the ethylene unsaturated ester copolymer.

As shown in FIG. 1, the resin sheet 1 is folded at vicinity of its centerline as to sandwich the display panel modules 2. In other words, the display panel modules 2 are sandwiched as retained by obverse sheet part 1A and by reverse sheet part 1B that is folded back while folded portions 1C makes a fringe of a resin-sheet band or a folded resin sheet. The antistatic sealing-resin layer comes inside of the resin-sheet band.

At along fringe of the resin-sheet band opposite to the folded portions 1C, a free-end fringe area 11A of the obverse sheet part 1A is overlaid on a free-end fringe area 11B of the reverse sheet part 1B, and protrudes in detail by a small dimension from the fringe area 11B of the reverse sheet part 1B. In a detailed example illustrated in FIG. 1, the obverse and reverse sheet parts 1A and 1B are joined together by joined areas 12 that extend in a pulse waveform. Fusion-wise joining of the sheet parts 1A and 1B for forming the joined areas 12 is made by applying a tool of a predetermined configuration successively on a predetermined position on the resin-sheet band as to apply an ultrasonic wave through the tool.

By the joined areas 12 extended in lines, receptacles 15 are formed as spaces for respectively receiving the display panel module 2; and at same time, communication channels 17 are formed each of which connects consecutive pair of the receptacles 15 as to be communicated with each other. Meanwhile, fringe extension areas 14, 16 are formed on both sides of a row of the receptacles 15. Positioning holes 13 are formed by punching on the fringe extension areas 14, 16, each of which holes 13 is abreast with a center point of the respective receptacle 15. Outer edge of the fringe extension area 14 is the folded portion 1C, while the fringe extension area 16 is a double-margined fringe area as mentioned above.

In a concrete example of dimensions, width of the band-shaped package 10 is 150 to 200 mm, widths of the fringe extension areas 14, 16 are 10 to 30 mm, a sheet-length-wise dimension of the receptacles 15 is 5 to 100 mm, and a distance between the receptacles 15 is 10 to 30 mm. Width of the joined areas 12 is 1 to 3 mm for example, and thickness of the resin sheet 1 is about 50 μm for example.

As shown in FIG. 2, the resin sheet 1 is wound around a roll 31 in a state folded at around a centerline. Folded portion at this state is same with the folded portion 1C after forming of the band-shaped package 10. Thus, another fringe portion opposite to the folded portion is formed as a double-margined fringe area as mentioned above as the obverse sheet part 1A protrudes slightly from the reverse sheet part 1B. The resin sheet 1 has been produced, for example by following manner: a tube is formed by an inflation molding and then is cut at one position in a longitudinal direction, and subsequently wound around the roll 31 while being folded along a certain position.

As also shown in FIG. 2, the resin sheet 1 unreeled from the roll 31 is fed forward and at same time is opened as to form a V-shaped section. Into thus opened interspace, the display panel modules 2 are dropped at a predetermined timing. The resin sheet 1 is continuously fed forward as slid along inner faces 34A, 34B of a guide 34 having a V-shaped section. In a detailed example illustrated in the figure, an inner face 34A of the guide 34 is arranged as to be substantially vertical, while the other inner face 34B of the guide 34 is arranged to be tilted from vertical line by about 10 to 25 degrees. The reverse sheet part 1B slides on such tilted inner face 34B, while the display panel modules 2 slide down on such tilted reverse sheet part 1B. Since opening angle of the guide 34 is adjusted to a proper extent, slide-wise dropping of the display panel modules 2 are stopped before reaching bottom of the V-shaped section when a ridge of the display panel abuts or rests on the inner face 34A. Thus, falling of the display panel modules 2 stops at a predetermined position distanced from the bottom of the V shape by a distance "d". In this way, the display panel modules 2 are placed in a predetermined position in width direction of the resin sheet 1. Position and intervals of the display pane modules 2 are determined by controlling the timing of dropping the modules. The inner faces 34A and 34B of the guide 34 is coated with fluorocarbon resin, if necessary.

Subsequent to such sandwiching of the modules 2 by the resin sheet 1, the joined areas 12 are formed by ultrasonic fusion-wise bonding. At a time of such bonding, further positioning of the modules 2 are made as follows; ridges of the display panels proper 21 or of the frames 23 are pressed with a tensional stress of the resin sheet 1 when the joined areas 12 are formed so that the modules 2 are positioned and retained in such position.

In an example illustrated in FIG. 1, air in the receptacles may not escape in width direction of the sheet 1, but may escape through the communication channels 17. Thus, some amount of air may be remained in the receptacles 15 for achieving shock absorbent property. Meanwhile, by forming joined areas or sealing areas also at along ends of the band-shaped package, the receptacles 15 and communication channels 17 as a whole may be sealed off from the air, as sealed by the joined areas 12. Thus, inside of the package may be filled with inert gas such as nitrogen gas or carbon dioxides as sealed off from the air because the receptacles 15 are communicated with each other through the communication channels 17. For example, nitrogen gas may be introduced as blown in from an end of the band-shaped package 10 as to be discharged at vicinity of a site where ultrasonic fusion-wise bonding takes place, so that inside of the package 10 is replaced with the nitrogen gas, before forming the joined areas at the ends of the package 10. In otherwise, after forming of the band-shaped package 10, inside of the package 10 may be vacuumed or depressurized by suction through ends of the band-shaped package 10.

FIG. 3 shows the band-shaped packages 10 that are wound in convolutions and placed as packed in a cardboard box 4. The band-shaped packages 10 is arranged in a manner as faces on the resin sheet are laid in substantially vertical direction and the fringe extension areas 14, 16 as a whole serves as a shock absorbent that vertically sandwiches the receptacles 15 in a lump. By adopting this way of packaging, volume of load is decreased to about ⅔ of the conventional packaging using the travel trays when same display panel modules 2 are loaded in same number. When the band-shaped packages 10 in the cardboard box 4 as in above had been transported by a truck through a typical paved drive way as far as several hundred kilometers, no fracture or chipping off was formed on the display panel proper 21 and no problem such as intrusion of moisture or foreign particles was arisen.

FIG. 4 shows away of retrieving the display panel modules 2 from the band-shaped package 10. In an illustrated example, the resin sheet is cut along the folded portion 1C, and in same time, the obverse and reverse sheet parts 1A and 1B are pulled in vertical opposite directions to be separated apart from each other. In course of this, while the resin sheet 1 is fed forward along a horizontal guide face 35, the obverse sheet part 1A is being separated from the reverse sheet part 1B before reaching forward end portion 35A of the guide face 35, and then wound around the roll 32. At the forward end portion 35A, the display panel modules 2 that are laid as retrievable are transferred to assembling worksite for the mobile phone, by robot arm 36 equipped with a vacuum chuck 37 for example. The guide face 35 is provided with a coating such as of fluorocarbon resin, if necessary.

Embodiment 1-2

The embodiment 1-2 will be explained by use of FIG. 5, in which only manner of placing the band-shaped packages 10 in a cardboard box 4 differs from that (shown in FIG. 3) of the embodiment 1-1. At inside of the cardboard box 4, many flat partitions 41, each of which is formed of honeycomb-core corrugated paper board as same with those forming the cardboard box 4, are arranged in a substantially vertical direction and interlocked with each other to form a lattice work in a sectional view. In this way, four compartments 42 having rectangular sectional view are formed in the cardboard box 4 and respectively receives the band-shaped packages 10 of FIG. 1 that are folded in a waveform in a vertical view. In also such manner of packing the band-shaped package 10, the display panel modules 2 are kept as vertically sandwiched by a shock absorbent of the fringe extension areas 14 and 16 in a stacked state. Each of the compartments 42 is separated from outer wall of the cardboard box 4 and from next compartment by a vacant compartment 43. Thus, the modules 2 in the band-shaped package 10 are fully protected also from external shocks or vibrations in lateral or horizontal directions.

Embodiment 1-3

Figure 5:
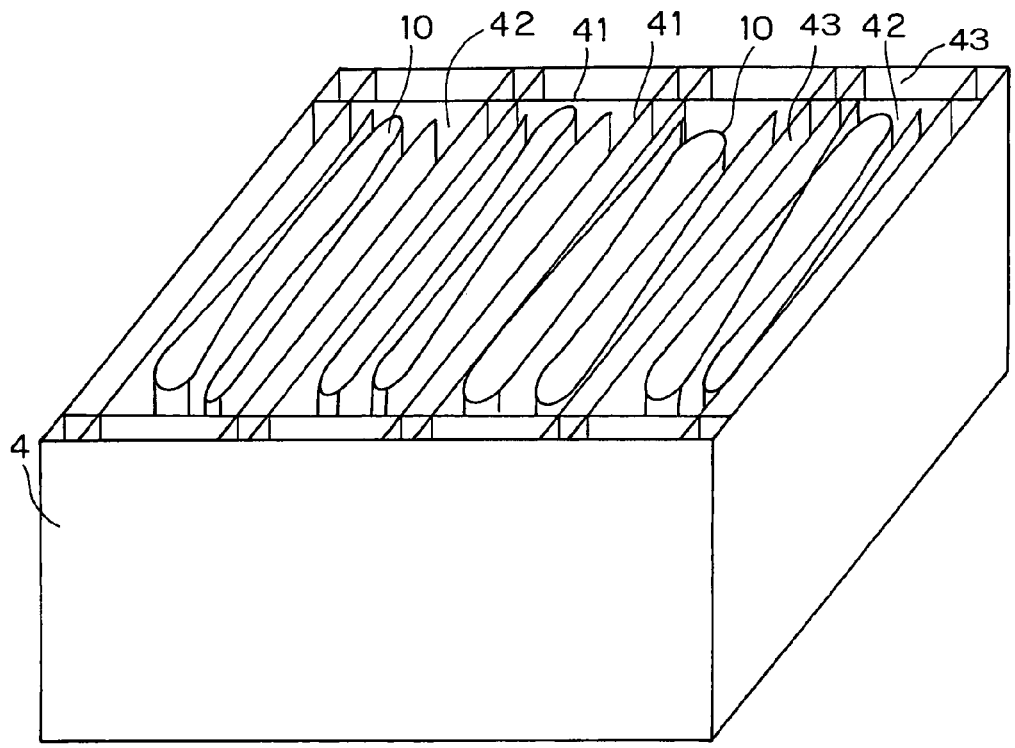
FIG. 5 is a perspective view showing another example of placing the band-shaped packages in a cardboard box.
Figure 6:
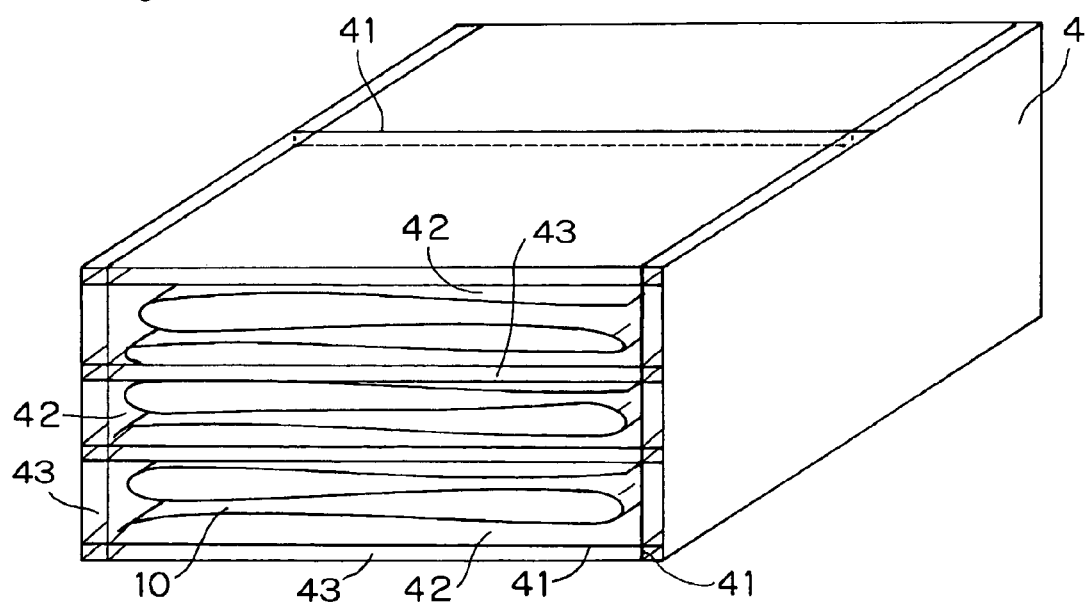
FIG. 6 is a perspective view showing a still other example of placing the band-shaped packages in a cardboard box.

The embodiment 1-3 shown in FIG. 6 differs from the way of placing and packing of the embodiment 1-2 shown in FIG. 5, solely in that the resin sheets of the band-shaped packages 10 are arranged in horizontal directions. Thus, shock absorbency by the partition 42 and the vacated compartment 43 acts in vertical direction, and it is preferable in some occasions.

Embodiment 1-4

Figure 7:
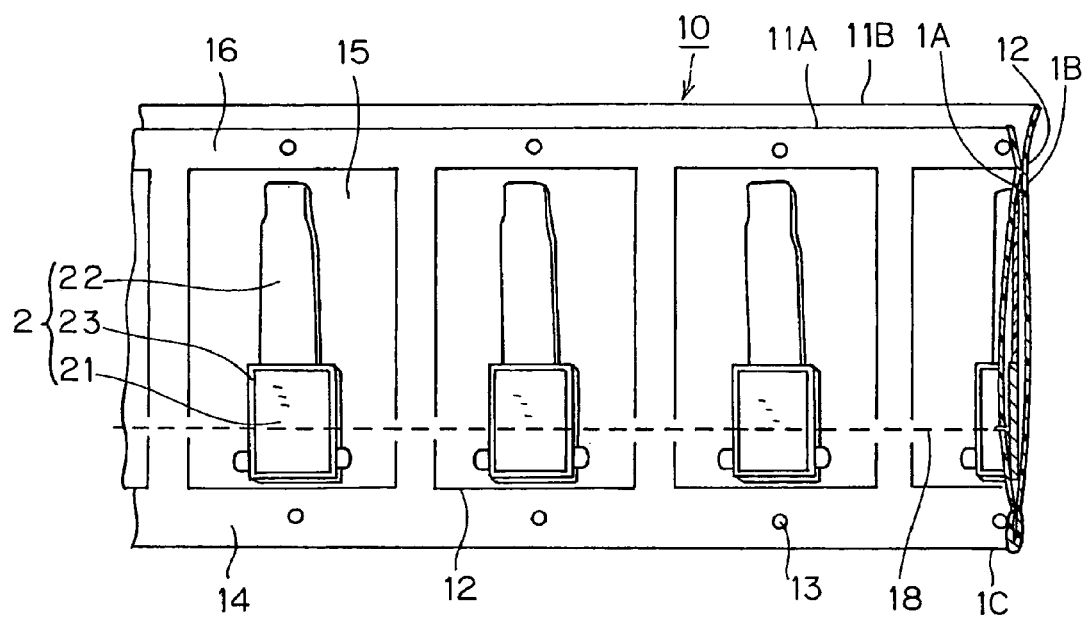
FIG. 7 is a plan-view-wise perspective view showing another example of a band-shaped package having display panel modules.

In the embodiment 1-4 shown in FIG. 7, to-be-torn line 18 or to-be-broken portion that is a perforated line or the like is provided on the band-shaped package 10, which is otherwise same with that of the embodiment 1-1 shown in FIG. 1, except that; the joined areas 12 are configured as communication channels 17 are omitted so as each of the receptacles 15 is independent from each other. The to-be-torn line 18 is provided only on obverse sheet part 1A, and extends along and in parallel with one of fringes of the band-shaped package 10. The to-be-torn line 18 may be formed at a time just before the display modules 2 is dropped and inserted by punching in a row on the obverse sheet part 1A where the resin sheet 1 is opened in a V-shaped sectional view after reeled out from the roll 31. In an illustrated example, the to-be-torn line 18 extends in vicinity of the folded portion 1C.

When the to-be-torn line 18 is torn apart as to open up the receptacles 15, the display panel modules 2 become retrievable by pulling the display panel proper 21. Because the to-be-torn line 18 is longitudinally continuous along the band-shaped package 10, the opening through the to-be-torn line 18 may be made successively and continuously from an end of the band-shaped package 10. At intermediate position on the package 10, anyone of the receptacles 15 may be opened separately from other. In an illustrated example, the joined areas 12 are omitted at portions where the to-be-torn line 18 crosses over, for facilitating smooth and continuous tearing apart along the line 18. In this example, opening of the receptacles 15 is achieved by the tearing apart along the to-be-torn line 18, the joined areas 12 do not have to be readily peelable. The to-be-torn line 18 may be formed by a portion having smaller thickness and continuous along a line, instead of the perforated line. By such to-be-torn line 18 of no perforation, the receptacles 15 may be sealed off from the air. At interspaces between consecutive receptacles 15 or on the joined areas 12, rhombus or linear openings may be provided as "cut initiating portions". Tearing on the to-be-torn line 18 may be made as starting from the "cut initiating portions", when to open the receptacles 15.

Embodiment 1-5

Figure 8:
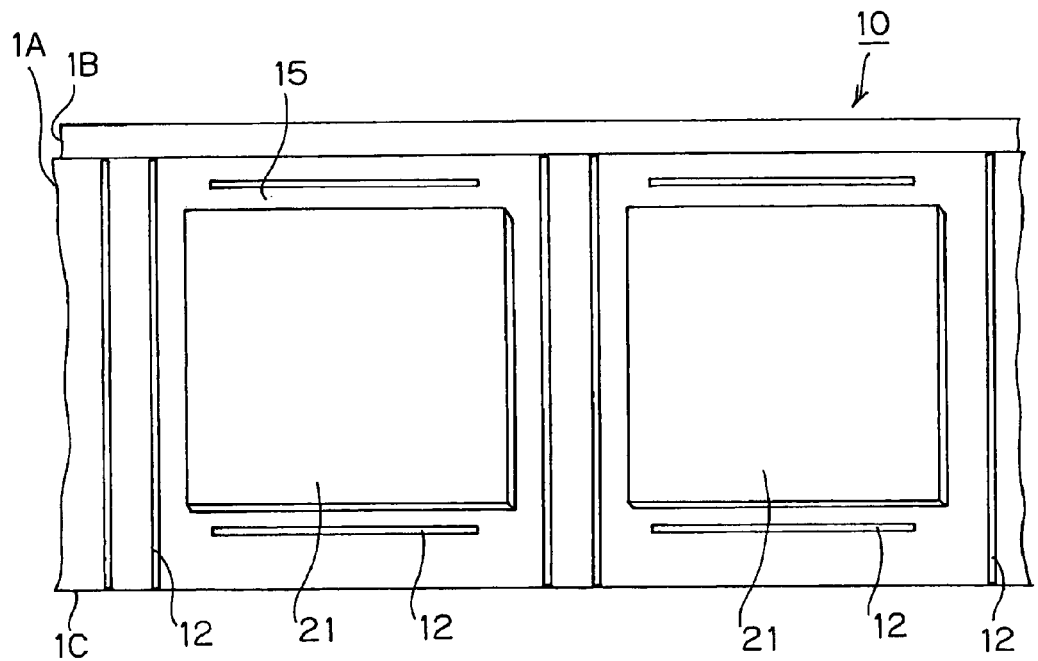
FIG. 8 is a plan-view-wise perspective view showing an example of a band-shaped package having display panels proper.

The band-shaped package 10 of the embodiment 1-5 shown in FIG. 8 contains the display panels proper 21 instead of the display panel modules 2 and is otherwise same with that of Embodiment 1-1 shown in FIG. 1, except that; the receptacles are not sealed off from the air; each of the receptacles 15 opens through its four corners to outside in width directions; and the communication channels 17 are omitted. Except for capability of sealing off or gas purging, same goes for this band-shaped package 10 with that of the embodiment 1-1.

2. Second Embodiment

Unpacking and Packing Devices and Methods 2-1. Band-Shaped Package

Figure 9:
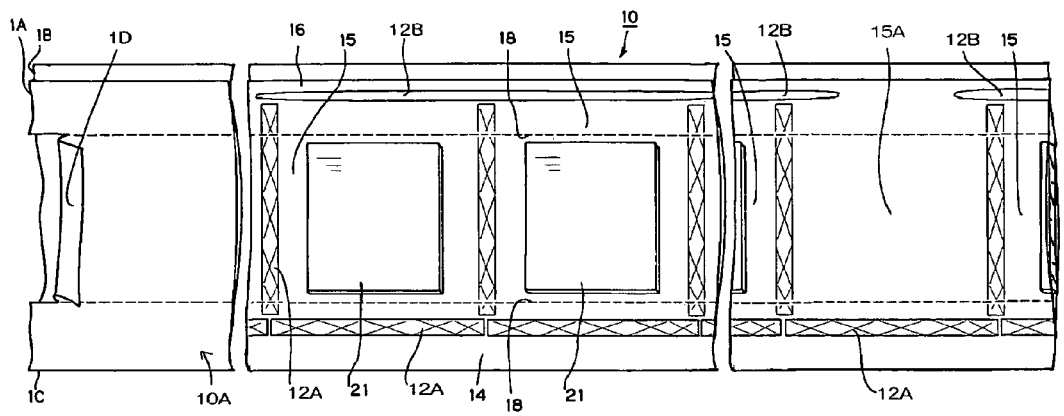
FIG. 9 is a plan-view-wise perspective view showing another example of a band-shaped package having display panels proper.
Figure 10:
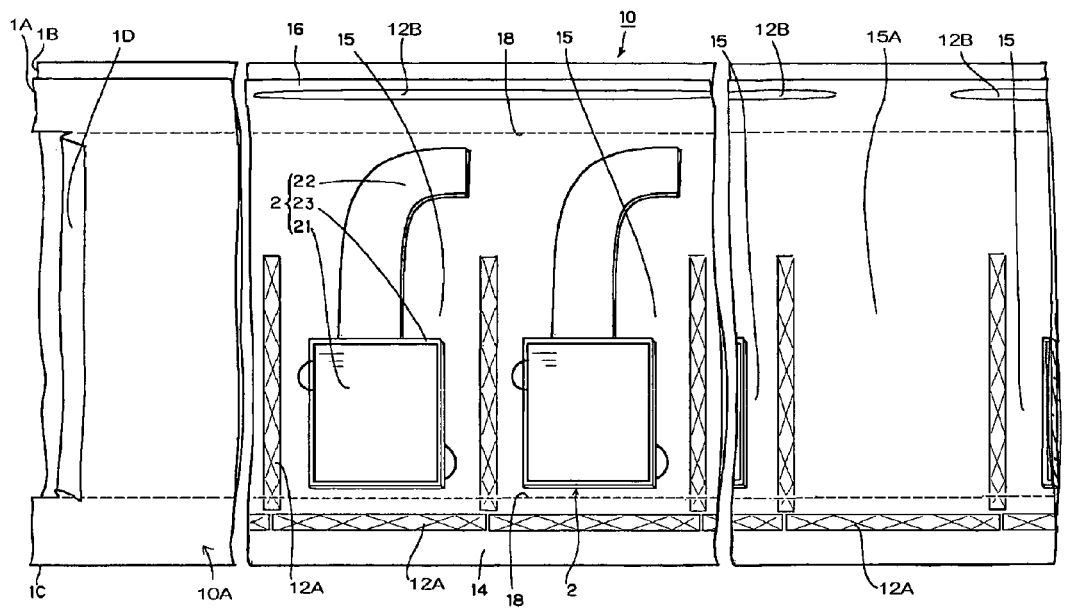
FIG. 10 is a plan-view-wise perspective view as in FIG. 9, when display panel modules are placed in a band-shaped package.

By use of FIGS. 9-28, a detailed embodiment in devices and methods for unpacking and packing will be described. FIGS. 9-10 shows band-shaped packages 10 that are subject of the unpacking and producing. In an illustrated example, at interspaces of the consecutive receptacles 15, only a broad line of the joined areas 12 is provided. As the joined areas 12, there are readily peelably joined areas 12A with pear-skin or dull looking and more firmly joined areas 12B. The peelably joined areas 12A are formed by the ultrasonic bonding as to make each pocket for respectively receiving the display panel proper 21. Meanwhile, the firmly joined areas 12B are successively formed after inserting a display panel proper 21 into the each pocket as to close the pocket, by use of heat sealer using an impulse sealer, or the like.

In a concrete example on dimensions, width of the band-shaped package 10 is 150 to 200 mm, and widths of the fringe extension areas 14, 16 are 10 to 30 mm; width of the peelably joined areas 12A is 5 to 15 mm for example, width of the firmly joined areas 12B is 1 to 3 mm for example, and thickness of the resin sheet 1 is about 50 μm for example. The display panel modules 2, the display panels proper 21, and material for the resin sheet 1 are same with those explained in the Embodiment 1-1, while the other construction not mentioned are same either.

2-2. Unpacking Device and Method

Figure 11:
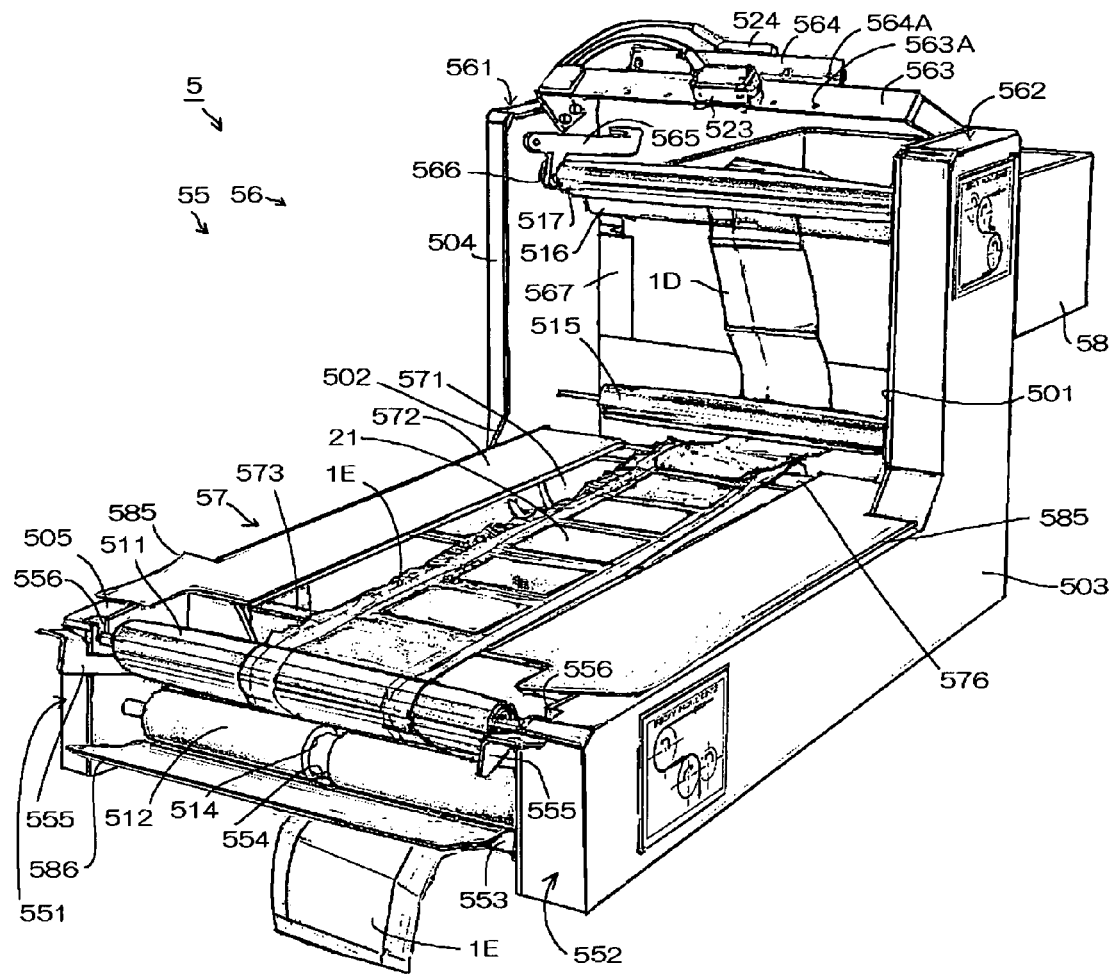
FIG. 11 is an oblique-front-wise external view of unpacking device in its operation.
Figure 12:
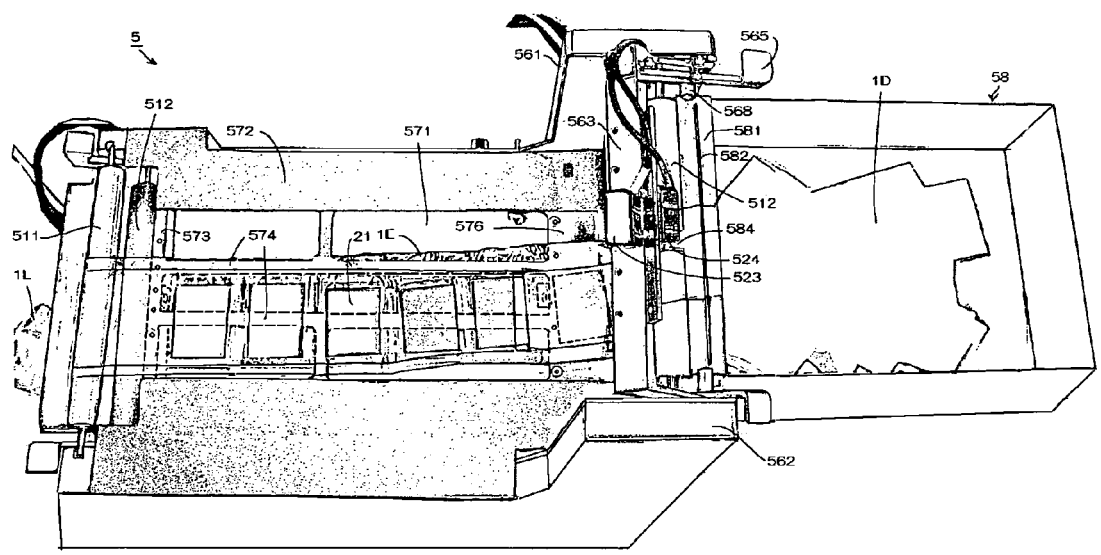
FIG. 12 is an external view seen from above, of the unpacking device shown in FIG. 11.
Figure 13:
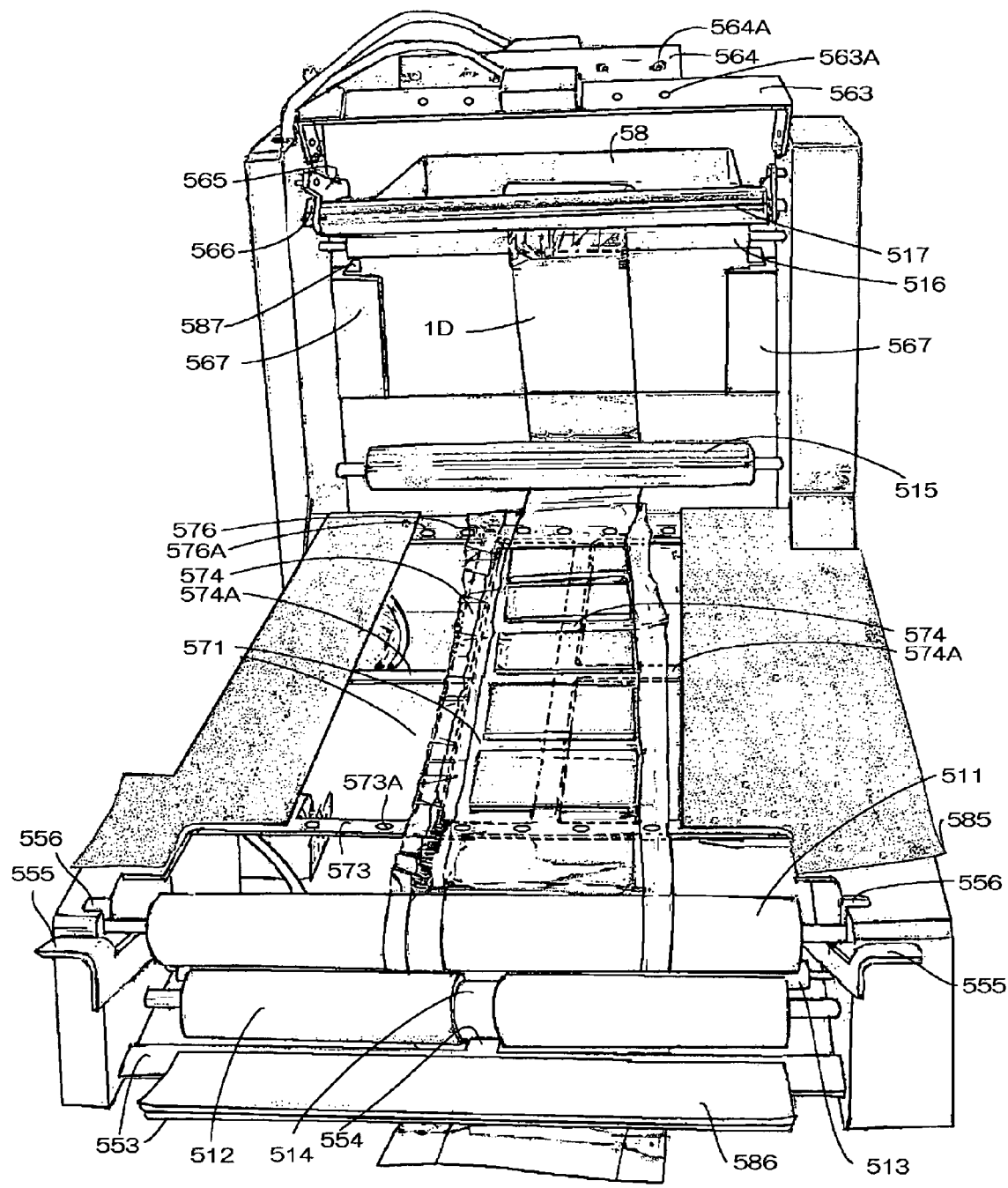
FIG. 13 is an external view seen obliquely from front upper side, of the unpacking device shown in FIG. 11.
Figure 14:
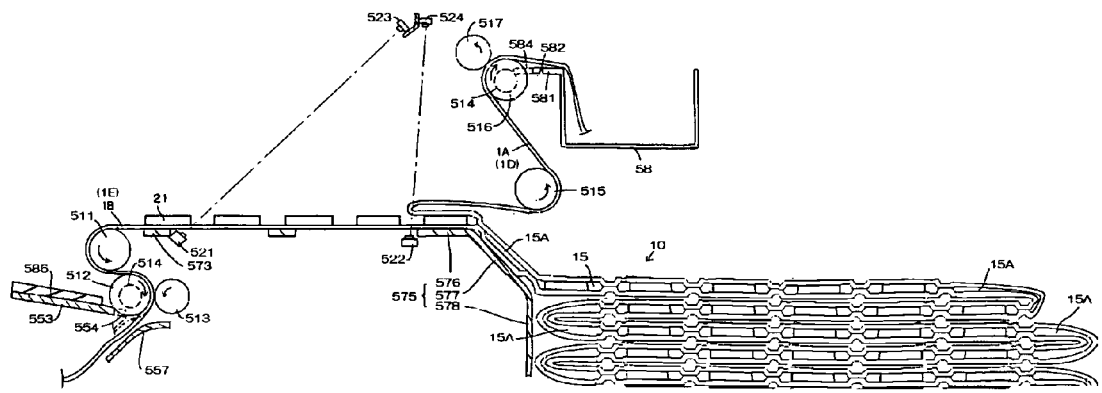
FIG. 14 is a schematic vertical sectional view for explaining operation of the embodiment of the unpacking device shown in FIG. 11.
Figure 15:
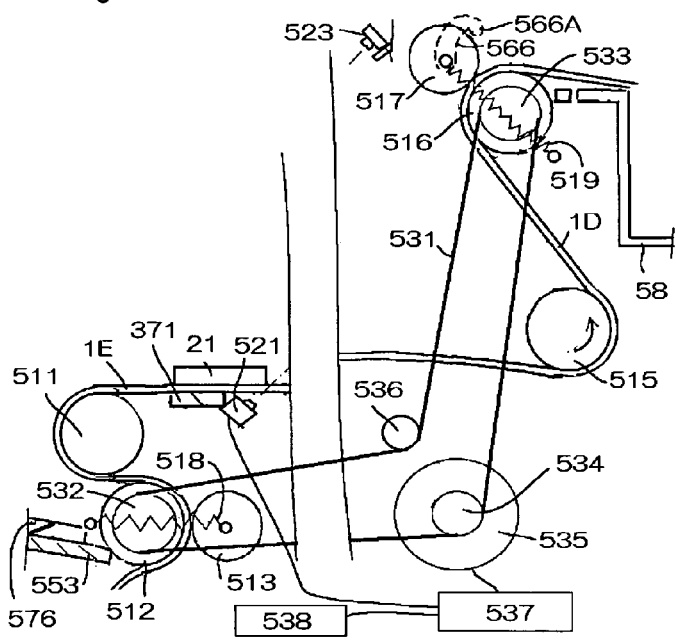
FIG. 15 is a schematic vertical sectional view for explaining driving mechanism of the embodiment of the unpacking device shown in FIG. 11.
Figure 16:
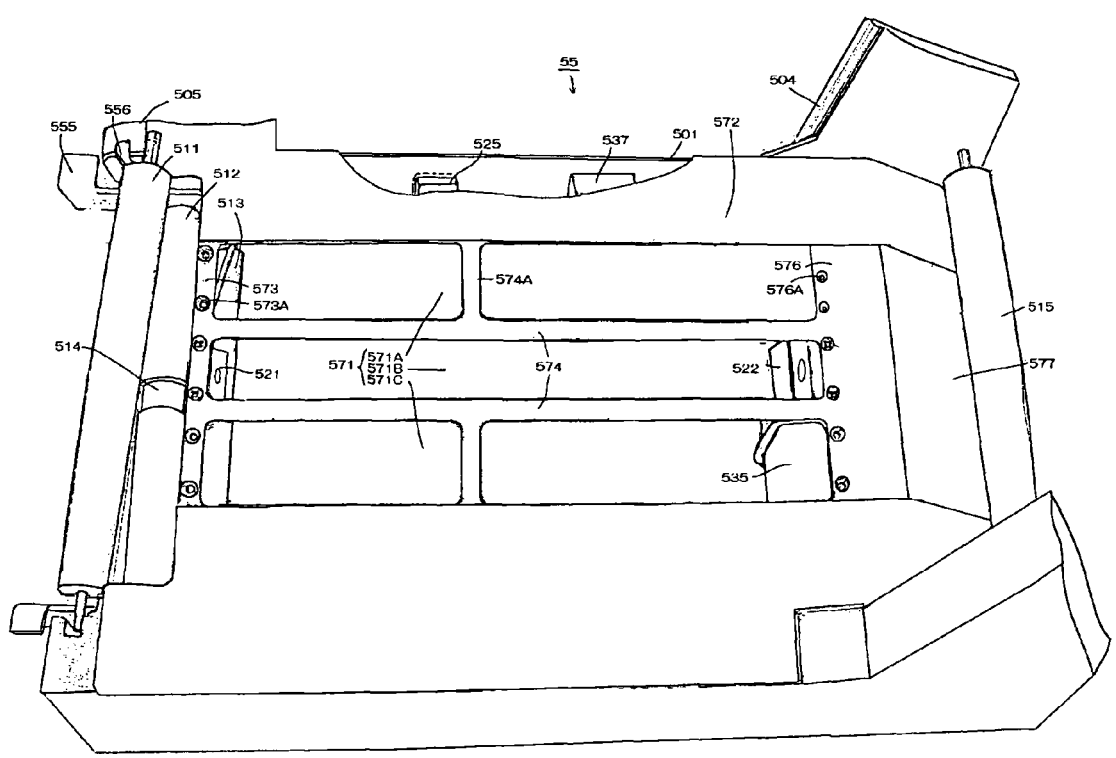
FIG. 16 is an exploded external view of platform part of the unpacking device shown in FIG. 11.

A detailed embodiment in respect of the unpacking device and method for retrieving from the band-shaped package will be described below by use of the FIGS. 11-17. FIGS. 11-13 show external appearance of the unpacking device in operation; FIGS. 14-15 are schematic vertical sectional view for explaining driving mechanisms of the unpacking device; and FIG. 16 is an exploded external view of platform part of the unpacking device. In following explaining, a side for feeding in the band-shaped package 10 will be referred as "rear" of the device, for easiness of the explaining, while the band-shaped package 10 shown in FIG. 9 or FIG. 10 is taken as an example of subject for the unpacking. While FIGS. 11-13 illustrated the display panels proper 21 as subjects to be retrieved, same goes for a case of the display panel modules 2. Thus, term of "display panel" is used occasionally.

In a detailed example illustrated in the figures, the unpacking device 5 is formed of; a rectangular platform 55 elongated in rear-front direction, and an upright part 56 extending upward from rear end portion of the platform 55, and thus being roughly an "L" shape seen from left-hand or right-hand direction. As shown in the FIGS. 11-12, on upper part of the upright part 56, a sheet collector box 58 is attached from rear; and the band-shaped package 10 to be unpacked is placed below the sheet collector box 58 as to be successively introduced onto the platform 55. The platform 55 of the unpacking device 5 is comprised of; right-hand and left-hand sidewalls 551 and 552, a front set of rollers 511-513 bridge-wise linking the sidewalls 551 and 552, and a top panel 57. The top panel 57 is comprised of; depot parts 572 for retrieved products at along right-hand and left-hand fringes of the platform 55, a broad and rectangular cutout window 571 disposed between the depot parts 572, and an introducing portion 575 having a slope 577 shown in FIGS. 14 and 16, which is disposed at rear of the cutout window 571. Meanwhile, the upright part 56 of the unpacking device 5 is comprised of; right-hand and left-hand sideboards 561 and 562 elected as gate posts as continuous from the sidewalls 551 and 552 of the platform 55; and a rear set of rollers 515-517 bridge-wise linking the sideboards 561 and 562.

Figure 17:
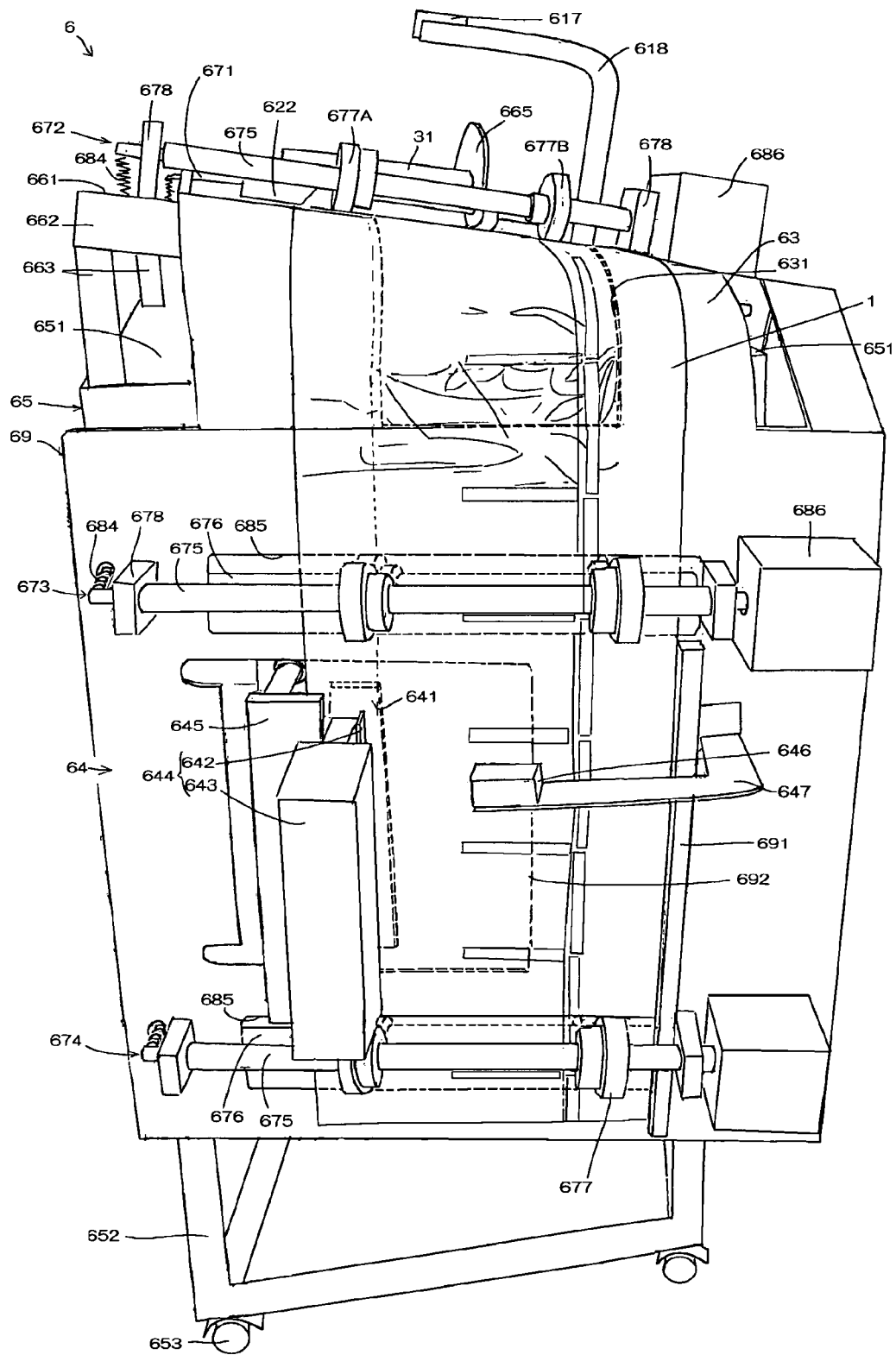
FIG. 17 is a front external view showing a packing device of the embodiment.

As shown in FIG. 17, the perforated lines 18 are formed on right-hand and left-hand fringes of the band-shaped package 10 in straight lines. The obverse and reverse sheet parts 1A and 1B are pulled apart from each other as to open the package 10 along the perforated lines 18. More precisely, a part (to be referred as cover sheet 1D hereinafter) of the obverse sheet part 1A at between the perforated lines 18 is successively separated from a remaining part (to be referred as base sheet 1E herein after) of the resin-sheet band. By roller mechanisms 51 of the unpacking device 5, the cover sheet 1D is pulled rearward and the base sheet 1E is pulled forward, in a substantially horizontal direction, as to be collected respectively.

At a time a plurality (five in the illustrated example) of the display panels proper 21 had become retrievable on top face of the platform 55, driving of the roller mechanism 51 is once stopped so that the display panel proper 21 may be taken away and supplied to a production line of assembling the display panel modules 2.

On course of proceeding of the unpacking by the tearing apart, the base sheet 1E is pulled by the rear set of the rollers 511-513 disposed on front end of the platform 55 as to be discharged. The base sheet 1E firstly wounds around a bracing roller 511 of a metal drum from upward as to be directed backward, and then passes through between a driving roller 512 of a resin rod at below and an auxiliary roller 513 of metal drum on rear of the driving roller 513; as to be discharged downward, forward or in a direction therebetween and to be collected in a not-shown collector bag or the like. Meanwhile, the cover sheet 1D firstly wounds around a bracing roller 515 of metal drum from downward as to be directed forward, and then passes through between a driving roller 516 of a resin rod at above and an auxiliary roller 517 of a metal drum at obliquely upward fore of the driving roller 516; as to be discharged obliquely up-rearward to be fallen into the sheet collector box 58.

In the unpacking device 5, no roller touches on to-be-unpacked part of the band-shaped package 10, which is pulled to be introduced onto top face of the platform 55 by pulling action of the driving rollers 512 and 516 that respectively pull the base sheet 1E and the cover sheet 1D. In other words, no separate feeding mechanism is provided in order for feeding the band-shaped package 10 into the unpacking device 5. All of loading, unpacking and tearing apart of the band-shaped package 10 as well as subsequent taking up and discharging of the resin sheet are made by driving action of a pair of driving rollers 512 and 516.

The driving rollers 512 and 516 are synchronized with each other by a timing belt 531 as shown in FIG. 15. In an illustrated example, a single time belt 531 engages with and is hung across; a toothed wheel 534 that is connected to motor 535 through a reducer; and a toothed wheels 532 and 533 respectively connected to driving shafts of the driving rollers 512 and 516. Thus, the driving rollers 512 and 516 are driven in a complete synchronization with each other when driven by the motor 535. Additionally, an auxiliary wheel 536 is disposed in vicinity of the toothed wheel 534 for the motor 535, in order the timing belt 531 is encased in an L-shaped space.

In a concrete example illustrated in the figures, the right-hand sidewall 552 of the platform 55 and the gatepost-wise right-hand sideboard 562 are formed by a single L-shaped bracing plate 501 and a like-wisely L-shaped cover casing 503. Meanwhile, the left-hand sidewall 551 of the platform 55 and the gatepost-wise left-hand sideboard 561 are formed by a single L-shaped bracing plate 502, a cover casing 504 for the sideboard 561 and a cover casing 505 for a front-end portion of the sidewall 551. Thus, all the rollers 511-513 and 515-517 are supported by the right-hand and left-hand bracing plates 501 and 502; and the toothed wheels 532-534 and the auxiliary wheel 536 are attached on the right-hand bracing plate 502 and are covered by the cover casing 503, along with the timing belt 531.

Starting and stopping of the motor 535 and the driving rollers 512 and 516 is made by an optical sensor switch 521 and a foot switch 538. The foot switch 538 is used by an operator at a time for starting of operation when proper placing and attaching of the band-shaped package 10 on the unpacking device is completed, or at a time of emergency stopping. The optical sensor switch 521 is disposed just rear of the bracing roller 511 as directed upward so as to detect arriving of the display panel proper 21 and then to stop the motor 535. Thus, the optical sensor switch 521 curbs falling of the display panel proper 21 after passing over the bracing roller 511; and in same time stops the driving at a time a predetermined number of the display panels proper 21 has been placed as unpacked on the platform 55; so as to facilitate retrieving and transferring of the display panels proper 21 by an operator or a robot arm. The optical sensor switch 521 in the concrete example detects interruption of red laser light; and based on detection signal, the microprocessor 537 stops the motor 535. A light emitter 523 for emitting the red laser light is disposed as hung on a brace 563, which is formed of a metal plate folded into angled C-shape or angled bracket and bridge-wise links upper ends of the postgate-wise sideboards 561 and 562. The brace 563 as a whole is tilted to frond-downward in a manner that the emitted laser light reaches the optical sensor switch 521. Accordingly, a light-receiving portion of the optical sensor switch 521 is directed obliquely rear-upward as to direct the light emitter 523.

In an illustrated example, the cutout window 571 is a rectangular opening defined by; a rear window frame 576 formed of a horizontal plate at fore end of the introducing part 575 having a slope 577; the right-hand and left-hand depot parts 572; and a front window frame 573 connecting front end of the depot parts 572. The optical sensor switch 521 is attached by screwing on the front window frame 573, which has six screw holes 573A in a row. The brace 563 also has six screw holes 563A in a row, accordingly, so as to enable right-left-wise positional adjusting of the optical sensor switch 521 and the light emitter 523.

At rear-end portion of the cutout window 571, disposed is another optical sensor 522 that directs upward in same manner with the optical sensor switch 521 on front side. More particularly, the optical sensor switch 522 is attached as screwed on the rear window frame 576 and receives a laser light from a light emitter 524 attached on an extended portion 564 of the brace 563, as to output a signal detecting interruption of the laser light. The optical sensor 522 is arranged as directed upward and slightly tilted rearward and is used for counting a number of the display panels or the like that have introduced to above of the cutout window 571. Signals from the optical sensor 522 are inputted to the microprocessor 537; and an accumulated number counted is displayed on a digital display 525 provided on the sidewall 551 of the platform 55. In other wise, the accumulated number is displayed on a computer screen in a process control room through LAN connection or the like. Right-left wise position of the optical sensor 522 for the counting may be adjusted in same manner with the optical sensor switch 521 for the automatic stopping, by selecting a pair from six screw holes 576A arranged on the rear window frame 576. Position of the light emitter 524 may be adjusted accordingly by selecting a pair from six screw holes 564A arranged on the extended portion 564.

As shown in the FIG. 3, the front and rear bracing rollers 512 and 516 are configured as to have a circumferential face that substantially follows an ellipsoid of revolution; in which diameter of central portion is slightly larger than those on end portions, that is, diameter smoothly decreases when tracing from the central portion to the end portions. By such configuration of the bracing rollers 512 and 516, excess deviation in right-left-wise position of the sheet band is curbed because automatic adjusting of the right-left-wise position is achieved on course of proceeding the recovering of the sheet band.

As shown in FIGS. 13-14, shaft height of the rear driving roller 516 is designed to be lower than that of the auxiliary roller 517 that is coupled to the driving roller 517 from frontward. In this way, the sheet fed upward after passing through between the rollers 516 and 517 would not fall frontward. Thus, trouble of twining of the sheet around the auxiliary roller 517 is curbed. Meanwhile, twining of the sheet around the driving roller 516 is curbed by following manner. Firstly, a fringe shelf 581 extended horizontally from upper fringe of the sheet collector box 58 is provided as to be disposed higher than the shaft of the driving roller 516 and edge of the fringe shelf 581 almost reaches roller face of the driving roller 517. Moreover, the driving roller 516 has at its central portion a smaller-diameter rod 514 to form a recess, into which a tongue-shaped protrusion 584 extends horizontally from central portion of the fringe shelf 581. In detail, the tongue-shaped protrusion 584 extends to an extent that its distal end portion almost follows a tangent line of the smaller-diameter rod 514. By the action of the smaller-diameter rod 514 and the tongue-shaped protrusion 584, twining of the sheet around the driving roller 516 is completely prevented. Additionally, the fringe shelf 584 has a slit 582 that run along longitudinal direction of the fringe shelf 584 and a shaft of the roller 517, that is, in a right-left wise direction. The slit 582 is for inserting a cutter blade as for cutting the resin sheet. The slit 582 facilitates detaching of the band-shaped package when its replacement is happened to be needed for switching a production lot in a process for assembling the display panel modules 2 from the display panels proper 21, for example. The slit 582 also facilitates cutting of the sheet when the sheet collector box is filed with the resin sheet, as to transfer them in a lump to a plastic bag or the like.

The slit 582 may be replaced by a cutter blade run along the driving roller 516. For example, a saw-toothed knife may be detachably attached at above the fringe shelf 584, by use of which the resin sheet may be easily severed solely by pulling up the sheet successively from its one of fringes upward or frontward. Meanwhile, the sheet collector box 58 attached to the gate-post-wise sideboards 561 and 562 as easily detachable in a following manner. Engaging portions 587 on right-hand and left-hand ends of front part of the sheet collector box 58 is engaged with support plates 567 inwardly protruded from rear and intermediate-height portion of the sideboards 561 and 562, as to be supported. Moreover, upper face of the fringe shelf 584 abuts pins 568 on inner face of the sideboards 561 and 562.

In front-wise beneath of the front driver roller 512, a scraper-shaped fitting 553 of metal bridge-wise links bottom-front ends of the sidewalls 551 and 552, that is, bottom-front ends of the bracer plates 501 and 502, as supported by them. Rear edge of the scraper-shaped fitting 553 run closely along roller face of the driving roller 512 in a direction of its shaft, so as to curb twining of the resin sheet around the drive roller 512. In same manner with the rear driving roller 516, twining of the sheet around the driving roller 517 is surely prevented in a following manner. The front driving roller 512 has at its central portion, a smaller-diameter rod 514 to form a recess; into which a tongue-shaped protrusion 554 horizontally extended from central portion of the rear edge of the scraper-shaped fitting 553 protrudes. The tongue-shaped protrusion 554 protrudes to an extent its distal end portion almost follows a tangent line of the smaller-diameter rod 554. An alternate dot and dash line in FIG. 15 schematically presents that the twining of the base sheet 1E is curbed by the tongue-shaped protrusion 554. Although height of the shafts of the driving and auxiliary rollers 512 and 513 are designed to be almost equal as in FIG. 15, twining of the sheet around the auxiliary roller 513 is curbed by action of a suitable guide 557 or the like when distal end of the sheet has been taken out forward on beforehand. A slit for inserting a cutter blade may be formed on the scraper-shaped fitting 553 closely along the driving roller 512 as in the fringe shelf 581. In otherwise, a saw-toothed cutter knife may be disposed at a portion of or beneath of the scraper-shaped fitting 553, as in that explained before.

As shown in FIG. 16, in the cutout window 571 of the top plate 57 on the platform 55, there are two pieces of sash bars 574 run in a front-rear direction, that is, in a direction forwarding the resin sheet and the contained products, as to extend from the rear window frame 576 to front window frame 573. In this way, the cutout window 571 is divided into three areas 571A, 571B and 571C. In an illustrated example, center portions of the sash bars 574 are connected with the depot parts 572 by auxiliary sash bars 574A extending in a right-left direction, so that only the center area 571B is not divided by the auxiliary sash bars 574A, as to form a single opening. The cutout window 571 and its openings facilitate grabbing of the unpacked display panels by fingers and a thumb of the operator or by a gripping portion of a robot arm. Thus, secure grabbing of the display panels may be made by grabbing at finger cushions and thumb cushions, whereas, with no cutout window 571, the display panels have to be grabbed by tips of the fingers and thumb. Hence, in a process of grabbing and transferring of the unpacked products, operational load is alleviated and risk or probability of dropping and damaging the products is remarkably reduced.

More detailed construction of the unpacking device and methods will be described below.

As shown in FIGS. 11-12 and so on, a rubber sheet 585 is attached on each of the depot parts 572 of the top plate 57 on the platform 55. The rubber sheet 585 alleviates shocks on the display panels proper 21 or the like when placed thereon, as to further reduce risk of the damage. The rubber sheet 585 is formed of an elastomer given with antistatic property by imparting carbon blacks for example, and is detachably attached on the top plate 57 of stainless steel by way of hook and loop fastener formed of fiber materials inter woven with carbon fibers. Additionally, a rubber sheet 586 is likewise attached on the scraper-shaped fitting 553 that is slightly tilted as front ends to come upside, on front end of the platform 55. This is to further curb damaging on the display panel even when it passes over the bracer roller 511 in event of malfunction of automatic stopping mechanism.

As shown in FIG. 15, in the platform 55, the introducing part 575 that is formed of the top plate 57 is consisting of; the rear window frame 576 on front end; a slope 577 that is smoothly continuous with rear end of the window frame 576; and a vertical wall 578 that is continuous with rear end of the slope 577. The top plate 57 is formed of a stainless steel or the like having a smooth surface, on which the resin sheet 1 such as of polyolefin may easily slide along.

As shown in FIG. 14, the band-shaped package 10 has vacant receptacles 15A, each of which is disposed to next of every five consecutive receptacles 15 filled with the display panels. The band-shaped package 10 is folded in a zigzag manner or in a waveform, as to be bended at each of the vacant receptacles 15A. The band-shaped package 10 also has a lead part 10A that correspond for about 5 to 8 consecutive vacated receptacles 15A, for attaching on the unpacking device 5. Please also see FIGS. 9-10. The lead part 10A may be formed of either of the rows of the vacant receptacles 15A and/or a part of resin sheet that is merely provided with the to-be-torn line 18 and not with the joined areas 12. In a latter case, peel-wise separating of the cover sheet 1D and base sheet 1E may be easier in some extent.

For starting the unpacking operation by the unpacking device 5, the band-shaped package 10 is on first hand placed as piled up in a zigzag manner, at a bottom in rear of the unpacking device 5 as in FIG. 4. Then, the lead part 10A is taken out from the band-shaped package 10, and is separated to the cover sheet 1D and base sheet 1E, by manual labor for example. Subsequently, the cover sheet 1D and base sheet 1E are respectively wound around and through the rear set of rollers 515-517 and the front set of rollers 511-513.

For winding around the rear set of rollers 515-517, a lead part of the cover sheet 1D have to be passed through upwardly between the driving roller 516 and the auxiliary roller 517. For facilitating this procedure, the auxiliary roller 517 is upwardly liftable. As shown in FIGS. 11-12, right-hand and left-hand levers 565 thrust rearwardly from upper-rear portions of the upright part 56. Frond ends of the levers 565 are attached on inner faces of the sideboards 561 and 562, so that the levers 565 are hinged as vertically swingable. At portions extended downward from nearby of the hinges, the levers 565 abut shafts on right and left shafts on the auxiliary roller 517. When the levers 565 are lifted, the shafts move to rear-upward within respective elongated holes 566. As shown schematically in FIG. 15, the shafts receive spring force directed to the drive roller 516 from springs 519 disposed in casing of the sideboards 561 and 562. Each of the elongates holes 566 has at its rear part a latching portion 566A, which enables holding of the auxiliary roller 517 in a lifted state. Thus, following procedures are enough for winding of the sheet on the rear set of rollers 515-517. Firstly, the levers 565 are lifted and latchwise kept in such state, and the sheet is taken to rear of the bracer roller 515; and subsequently is passed through the gap between the drive and auxiliary rollers 516-517 and then finally the levers 565 are pushed down.

For winding around the front set of rollers 511-513, a lead part of the base sheet 1E have to be passed through downwardly between the driving roller 512 and the auxiliary roller 513, above which the bracer roller 511 is disposed. For facilitating this procedure, the bracer roller 511 is liftable and detachable as shown in FIGS. 11-12. Front end portions of the sidewalls 551 and 552 are provided with notch-shaped cutouts 555 opened upward and at inner faces of the sidewalls 551 and 552. Right-hand and left-hand shafts of the bracer roller 551 are kept at bottom of the cutouts 556 as to be rotatable. In a manner passing through just beneath of the shafts as to thrust out frontward from the unpacking device 5, right-hand and left-hand levers 555 are swingably attached on innerfaces of the sidewalls 551 and 552. When either of the levers 555 is fully lifted, either shaft of the bracer roller 551 is pushed up out of the cutout 556. Then, bracer roller 551 as a whole is easily lifted by grabbing the shafts or the roller face. As schematically shown in FIG. 15, right-hand and left-hand shafts of the auxiliary roller 513 receive a spring force directed to the drive roller 512 by springs 519 in a casing of the sidewalls 551 and 552. Thus, after removing the bracer roller 511, the auxiliary roller 513 is pushed slightly rearward, and then the sheet is allowed to fall between the rollers 512 and 513. Subsequently, the bracer roller 511 is inserted beneath of the sheet and then the shafts of the bracer roller 511 are fitted into the cutouts 556, as to complete easy procedure of winding the sheet.

After completion of the winding of the sheets around rear and front sets of rollers, the cover sheet 1D and the base sheet 1E may be pulled out in a proper extent as to make the tearing apart is proceeded at vicinity of the rearmost portion of the cutout window 571.

When preparation for the unpacking is completed in this way, the operator steps the foot switch 538 to start sheet-pulling motion of the drive rollers 512 and 516. Then, the bans-shaped package 10 is successively introduced through the introducing part 575 as to be proceeded with unpacking.

Every time the display panel passes through the rearmost portion of the cutout window 571, the display panel is detected by the optical sensor 522 for counting the already unpacked ones of the display panels. When the display panel at foremost end of its row reaches foremost portion of cutout window 571, the display panel is detected by the optical sensor switch 521 for automatic stopping and then driving of the driving rollers 512 and 516 is stopped. At this time point, five display panels already unpacked are laid in a row above the cutout window 571. The operator temporally piles up the five display panels on the depot part 572, and then take over the piles of the display panels to subsequent assembling line. If tact time for retrieving the display panels is in a range from 30 second to two minutes, the tact time matches or is shorter than that of processing rate for typical assembling lines.

Casing of the unpacking device of above embodiment is easily fabricated by punching and bending of stainless steel plates; and rollers and sensors of the unpacking device are ones of general purpose; thus, fabrication of the unpacking device may be made with small cost and in small period. Operation mechanism and structure are simple, and thus, probability of malfunction is minimum and even at malfunction, repairing is easy and made swiftly. When engineering plastics such as polyacetal resin (Delrin) is used for forming the drive rollers 512 and 516, probability of distorting become minimum; and replacement of the parts or elements is not needed for long period. The unpacking device 5 is portable and may be placed on a table or benches of simple and typical ones for preceding the unpacking process. Thus, the unpacking device 5 occupies only a small patch of space and thus is extremely easy for introducing to processing lines and for adapting in response of changing of layout of the processing lines.

By the above device and method of the unpacking, picking up of the unpacked display panels may be made from same posture and location. In other words, all have to do for the operator is seating on either side of the unpacking device and taking over the display panels, when procedure of winding of the lead part is excepted. Even when a robot arm is used, the taking over may be made at constant position. For example, the display panel may be picked up at foremost position of the cutout window 571 one by one, and driving may be made intermittently at every time the display panel has been picked up by the robot arm. Such setting of the driving may be by merely changing a portion of the program stored in the microprocessor; thus, switching between the manual handling and the robot arm handling may swiftly be made in response of circumstances. On contrary, when traveling trays are used, the robot arm has to move in respect of two axes (X and Y axes) even with one piece of the tray. If a vacated one of the traveling trays is removed and further taking out has to be made, position of the robot arm should be adjusted also in vertical direction.

According to the embodiment of the unpacking device and method, a cutter blade or paddle or spatula do not have to be abutted on the band-shaped package, thus, there is no fear of damaging the display panels or other packed products on course of the unpacking itself.

In the above embodiments, it is explained that perforated lines are provided along both fringes of the band-shaped package 10, such perforated lines may be replaced by other configuration of the to-be-torn lines. In otherwise, unpacking may be made by peel-wise separating the joined areas at along the fringes of the band-shaped package so that the obverse and reverse sheet parts are separated with each other. Even in this manner, no modification on the unpacking device 5 is needed. Same goes for a case where the band-shaped package has only one to-be-torn line along its one fringe and the joined areas are peeled off at along another fringe of the package.

Meanwhile, instead of grabbing of the display panel by the robot arm, a vacuum chuck or the like may be disposed on distal end of the robot arm. When a plurality of vacuum chucks is disposed in a row, the display panels in a number of five for example may be picked up simultaneously. In respect of the platform 55, its upper face may be tilted instead of substantially horizontal one explained above where the display panels are held as substantially horizontal. For example, the display panels may be picked up while in a state tilted downward in either of right-hand and left-hand directions. In some occasion, the display panels laid as tilted on the base sheet may be pushed out by a pushing pin at beneath and sent along a chute path to a subsequent processing line. The unpacking operation of the unpacking device 5 may made continuously so that transferring is made simultaneously with the unpacking; instead of stopping the driving of the rollers 512 and 516 during the taking over from above the cutout window, as explained above.

2-3. Packing Device and Method

Figure 18:
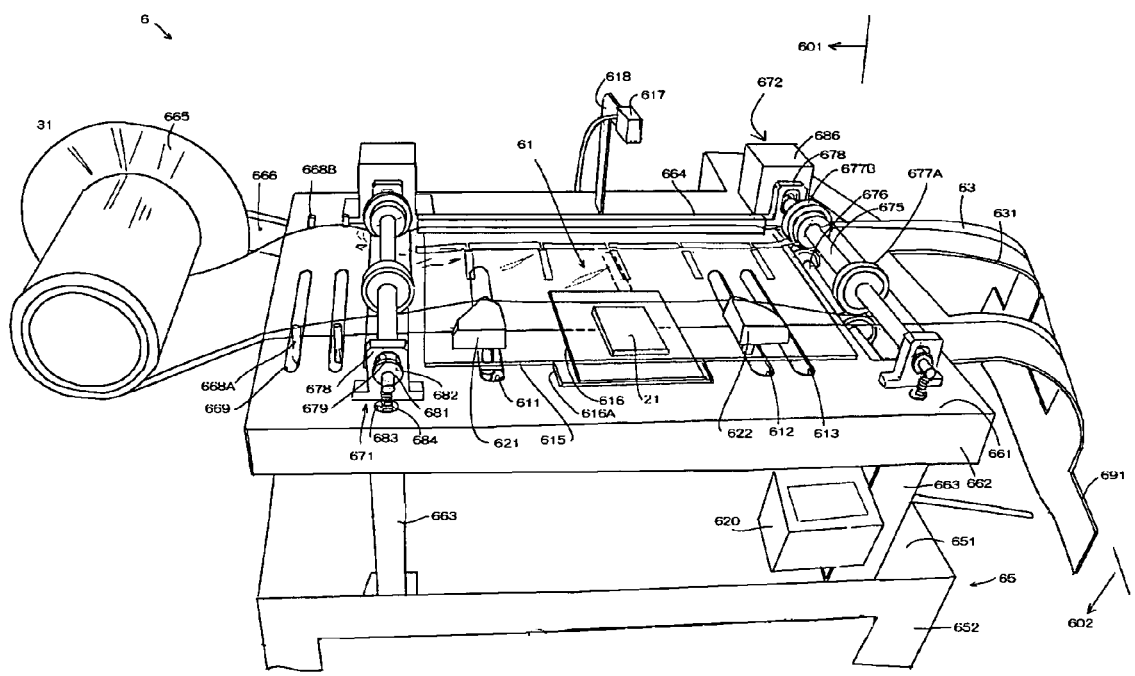
FIG. 18 is an external view seen obliquely from above showing the packing device of the embodiment.
Figure 19:
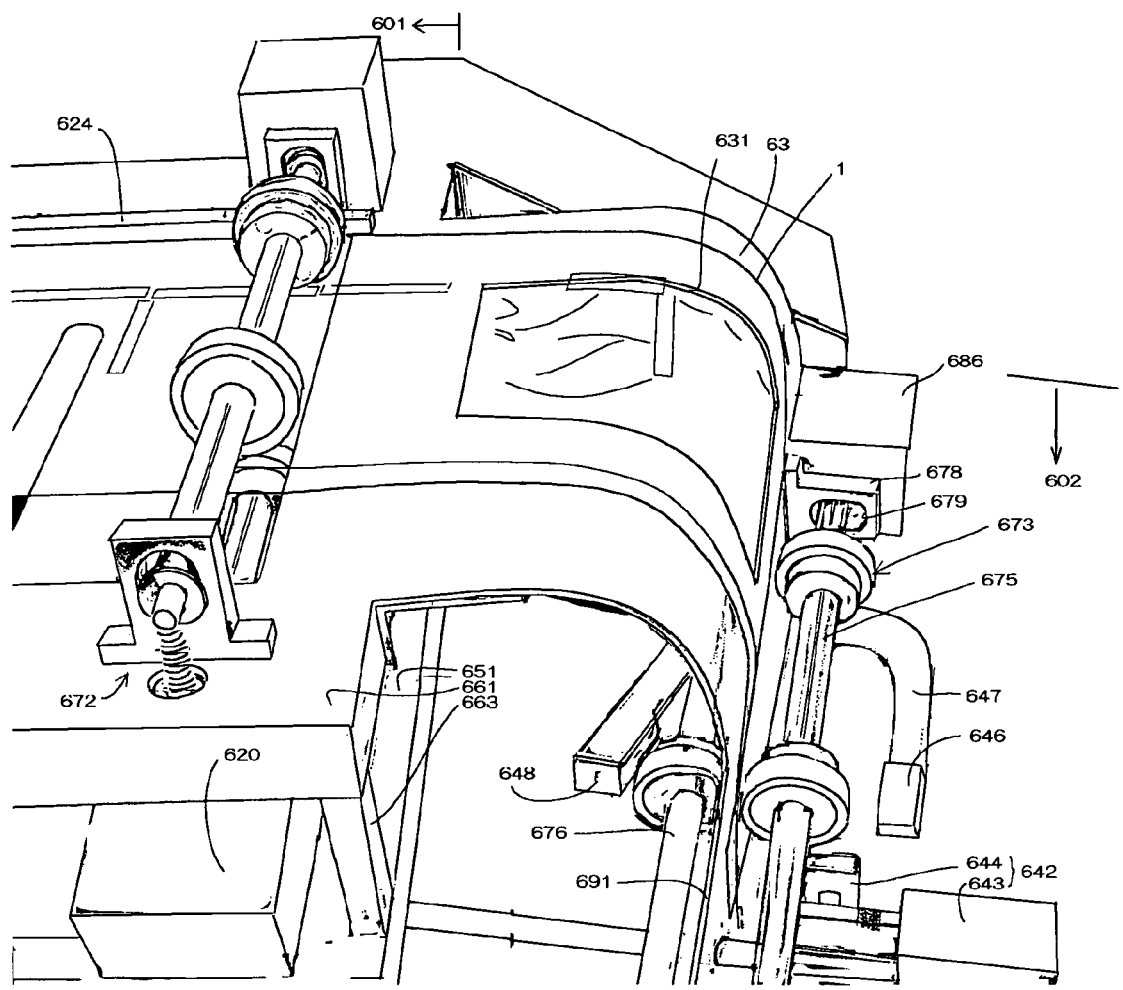
FIG. 19 is a partial external view seen obliquely from above showing curved face and its vicinity in the packing device of the embodiment.
Figure 20:
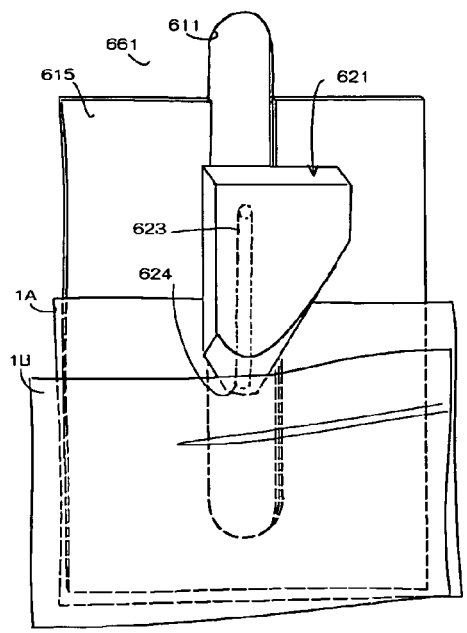
FIG. 20 is a partial external view seen from above showing a sheet-opening guide and its vicinity in the packing device of the embodiment.
Figure 21:
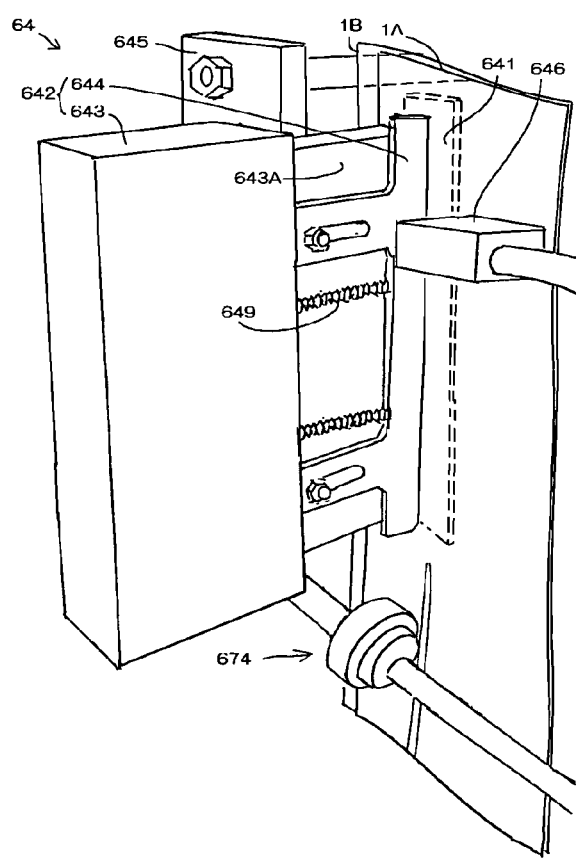
FIG. 21 is a partial front-wise external view showing a heat sealer and its vicinity in the packing device of the embodiment.

A method of manufacturing the band-shaped package 10 and a construction of a packing device therefore are explained below, by use of partial external views of FIGS. 17-21 for the device. FIG. 17 shows a vertical feeding area 602 of the packing device 6 as seen from its front; FIG. 18 shows upper part or a horizontally feeding area 601 of the packing device 6 as seen obliquely from above; and FIG. 19 shows a curved plate 63 as seen obliquely from above, which is a transition part between the horizontal and vertical feeding areas 601 and 602. FIG. 20 shows a sheet-opening guide in the horizontal feeding area 601 as seen from above; and FIG. 21 shows heat sealer 64 in the vertical feeding part 602 as seen from front. For convenience of explaining, a downstream side into which the band-shaped package 10 is discharged is referred as "front" of the packing device.

The packing device 6 is installed on upper and front sides of a rectangular steel table 65, which is a typical working table having typical height and structure. The steel table 65 has a horizontal top plate 651 that is attached on a box framework 652 formed of L-section steel bars, and has casters 563 that have stoppers and are attached on corners of bottom of the framework 652, so as movable by the casters 563. The horizontal top plate 651 is overlaid with a rectangular tilted top plate 661 that is tilted to ascend in leftward direction, that is fore of the sheet of the FIG. 18. The tilted top plate 661 is supported by steel table 65 through a rectangular framework 662 extending along outline of the tilted top plate 661 and as well as props 663 of L-section steel bars linking the rectangular framework 662 and the horizontal top plate 651. At rear of the tilted top plate 661, a roll support 665 is disposed for rotatably supporting the roll 1, around which a resin sheet 1 is wound. The roll support 665 is supported by a support bar 666 that extends obliquely from the steel table 65 at around its rear-left corner. Shafts of the roll support 665 and the roll 31 are disposed substantially in a plane of the surface of the tilted top plate 661 and extend along direction of tilting of the tilted top plate 661 (FIG. 17).

The tilted top plate 661 has at along a rear edge, an opening 685 elongated in right-left direction, along which first roller set 671 is disposed for pulling in the resin sheet 1 as reeled off from the roll 31; and has at along a front edge, a likewise opening 685, along which second roller set 672 is disposed for sending out the resin sheet 1 onto the curved plate 63. Each of the roller sets 671 and 672 is comprised of; roller shafts 675 and 676 on obverse and reverse sides of the opening 685; and resin rollers 677A and 677B disposed respectively on left and right part on each of the roller shafts 675 and 676. Each of the resin rollers 677 is shaped as a wheel or thick disk and formed of acetal resin (Delrin) or the like. The first and second roller sets 671 and 672 are identical in structure and dimensions, and in usual, also identical in positions of attaching the resin rollers 677A and 677B.

Nevertheless, in respect of the resin rollers 677A and 677B attached on obverse roller shaft 675 of the second roller set 672, diameter of the left-hand resin roller 677A is slightly larger than that of the right-hand resin roller 677B, for example by 0.03-0.2 mm. This difference in diameters is for adjusting a subtle balance in feeding of the resin sheet onto the curved plate 63.

Right-left wise attaching positions of the resin rollers 677 are easily adjusted by unfastening each attaching screw on the resin rollers 677 as to be shifted in accordance with width of the resin sheet 1. At along right edge or lowest portion of the tilted top plate 661, a sheet-feeding guide 664 is disposed, which is formed of a rectangular-section rod of steel screwed on screw holed on the tilted top plate 661. Because the resin sheet 1 is fed as sliding along the sheet-feeding guide 664, positional adjusting of the left-hand resin rollers 677A is enough for dealing with change or switching of width of the resin sheet 1.

Ends of the obverse roller shaft 675 are supported by support fixtures 678 attached on the tilted top plate 661. In detail, ring-shaped ball bearings 681 are engaged with a vertically elongated holes 679 in the support fixtures 678 as to be vertically shiftable. Into the bearings 681, ends of the obverse roller shaft 675 are inserted as to be supported by the support fixtures 678, through the bearings 681 on inner faces of the elongated holes 679. Each of the bearings 681 has a flange 681 that abuts on the support fixtures 678, from outward in respect of right-left direction; and thereby, right-left wise position of the roller shaft 675 is secured. The reverse roller shaft 676 also supported in same manner on the tilted top plate 661 through same bearings and support fixtures. The reverse roller shaft 676 may be secured in a manner not vertically shiftable. Coil springs 684 bridge-wise links the obverse and reverse roller shafts 675 and 676, between the bearings 681 or ends of the shafts, at right-left-wise outside of the support fixtures 678 through holes 683 on the tilted top plate 661, so as to be pulled to each other.

All of the obverse and reverse roller shafts 675 and 676 in the first and second roller sets 671 and 672 are driven by a single motor through one or more timing belt and toothed wheels on right ends (reverse or upper end of sheet of FIG. 18). The four roller shafts 675 and 676 are synchronized by the timing belt and driven with same rotational rate. The toothed wheels for the obverse roller shafts are respectively held in wheel covers 686.

Figure 22:
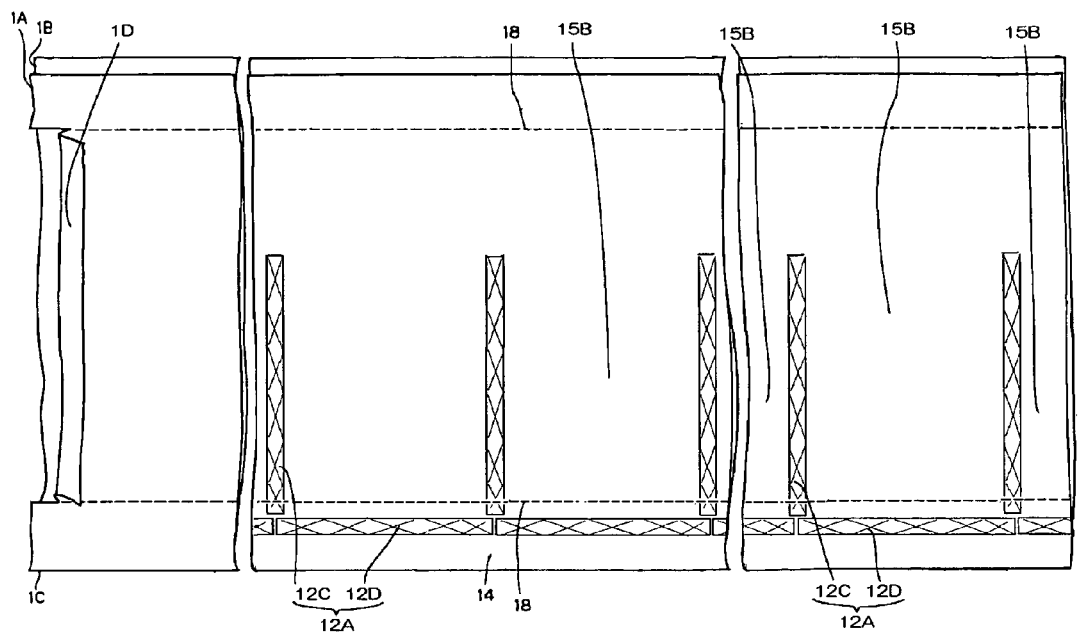
FIG. 22 is a plan-view-wise perspective view showing a resin sheet band with receptacles to be used for the packing.

On the resin sheet 1 in this embodiment, pockets 15B are formed on beforehand by the joined areas 12A as shown in FIG. 22. The joined areas 12A are dull-faced ones formed by ultrasonic bonding and readily peel-wise separated by pulling apart the obverse and reverse sheet parts 1A and 1B. In an illustrated example, one band-shaped resin sheet 1 is widthwise folded, and the joined areas 12A is comprised of; joined areas 12C linearly run along the folded portion 12C as slightly distanced therefrom; and joined areas 12D that are branch-wise extended therefrom in widthwise directions with a constant interval. On the resin sheet 1, to-be-torn lines 18 are also formed on beforehand, by perforated lines run along fringes of the resin sheet. In an illustrated example, the to-be-torn line 18 along the right-hand fringe is disposed at sheet-wise inward of the joined areas 1C. The to-be-torn line 18 along the left-hand fringe is also disposed at sheet-wise inward of a portions that are to be joined by the heat sealer 64 after being sent to the vertically feeding area 602.

The resin sheet 1 having pockets 15B formed on beforehand is reeled out from the roll 31 by pulling-wise driving motion of the first roller set 671, and then introduced into a panel-inserting area 61 that is between the first and second roller sets 671 and 672. On the tilted top plate 661 and rear of the first roller set 671, sheet guide pins 668A and 668B are provided to form rear and fore pairs that are identical in structure, dimensions and right-left-wise attaching positions with each other pair. Among them, right-hand sheet guide pins 668A are secured at fixed positions that are abreast with the sheet feeding guide 664 in respect of right-left-wise position. Right-left-wise position of attaching each left-hand sheet guide pin 668B is shiftable along a right-left-wise elongated hole 669, as to be adjusted in accordance with width of the resin sheet 1.

In an illustrated example, rectangular first acryl plate 615 is attached on the tilted top plate 661 as to cover almost whole area that is defined by the first and second roller sets 671 and 672 and the sheet feeding guide 664, as to form a sheet sliding face in this area. Front and rear sheet-opening guides 621 and 622 for opening distance or interspace between the obverse and reverse sheet parts are attached on the first acryl plate 615, as to form the panel inserting area 61 between them. As shown in FIGS. 18 and 20, each of the sheet-opening guides 621 and 622 is shaped as such; relatively thick rectangular solid piece of the resin with low friction coefficient such as of fluorocarbon resin is cut out in a right-angle triangle and then obverse ridges on an oblique line and at near distal ends are rounded up in a circular sectional shape. At inside of each of them, a gas supply pipe 623 is provided as shaped in a circular-sectional straight tube run toward the distal end of the sheet-opening guide and as to form a nozzle 624 as an end of the circular-sectional straight tube. At around the distal end, each of the guides 621 and 622 is shaped as circular or semicircular in section and tapered toward the distal end. The guides 621 and 622 are arranged such that distal ends are directed rightward (reverse or upper side in a sheet of FIG. 18) and the oblique lines of the right-angle triangle face outward as from the panel-inserting area 61. The guides 621 and 622 may be fixed at any positions on a right-left-wise elongated holes 611 and 612 formed on the tilted top plate 661. The guides 621 and 622 are positioned such that left fringe part (obverse fringe part in a sheet of FIG. 18) of the resin sheet 1 covers distal end portions of the guides 621 and 622. In an illustrated example, another elongated hole 613 in a same manner with the elongated holes 611 and 612 is provided as to cope with the situation where dimensions of the display panels are enlarged, by disposing the guide 622 as to widen the panel-inserting area 61 in front-rear-wise direction.

At midway between the sheet-opening guides 621 and 622 and at between obverse and reverse sheet parts of the resin sheet 1; disposed is a rectangular second acryl plate 616, length and breadth of which are 2 to 3 times of those of the display panels, and which is thin as 0.5-3.0 mm thickness for example. The second acryl plate 616 is at its portion, detachably attached on the tilted top plate 661 through a hook and loop fastener 616A or the like. Among a stock of the second acryl plates 616, one having proper dimensions are selected in accordance with dimensions of the display panels and is then disposed between the obverse and reverse sheet parts 1A and 1B of the resin sheet 1 after the resin sheet 1 is fed forward by a certain length.

At above the panel-inserting area, an optical sensor 617 for detecting interruption of red laser light is disposed as supported by a reverse-L-shaped bracket 618. At straight beneath of the optical sensor 617, a right-left-wise elongated hole 619 is formed on the tilted top plate 661. A red-laser-beam emitter is arranged under the elongated hole 619 so that the laser beam passing through the first acryl plate 615 reaches the optical sensor 617. Whenever the display panel is inserted, the optical sensor 617 outputs a detection signal; and accumulated number of already packed display panels is displayed on a digital display 620 attached along left (uppermost) edge of the tilted top plate 661.

Feed-wise driving of the first and second roller sets 671 and 672 is temporarily stopped when a pocket 15B comes to a just half way between the sheet-opening guides 621 and 622. Then, a display panel (illustrated is a display panel proper 21) is placed on the second acryl plate 616 and pushed in as touched up; thereby, the display panel slides down along the second acryl plate 616 and falls into the pocket 15B. Subsequently, the feed-wise driving is resumed and the display panel in the pocket 15B reaches the second sheet-opening guide 622; then, compressed air or nitrogen gas is blasted out through the nozzle 624 similar with an air gun so that the display panels is pushed in to bottom of the pocket 15B, that is to vicinity of the joined areas 12C along a fringe of the resin sheet 1. Depending on products to be packed, air or gas blowing may be made in an extent some vibration is imparted to the to-be-packed products, as to achieve further ensured inserting to bottom of the pocket 15B. Meanwhile, air or gas blown out from the fist sheet-opening guide 621 makes some contribution for fully opening interspaced between the sheet parts; but, in many occasions, air or gas from the fist sheet-opening guide 621 is not necessary because gas blasted from the second sheet-opening guide 622 may be enough for the opening of the interspace. Thus, gas supply pipe and nozzle in the fist sheet-opening guide 621 may be omitted.

As shown in FIG. 19, the curved plate 63 formed of stainless steel is continuous with the upper face of the tilted top plated 661 at its front side, as to form a single and smoothly continuous face for feeding the resin sheet. The curved plate 63 forms a smoothly curved face as to make a smooth transition from the horizontally feeding area 601 along the tilted top plate 661 to the vertically feeding area 602. Drop between the horizontally and vertically feeding areas 601 and 602 is large at left side (on obverse in a sheet of FIG. 19) and is small at right side (on reverse in a sheet of FIG. 19). Thus, the curved plate 62 is configured as to absorb such difference in drops and path length of the resin sheet between the right and left sides, so that front-rear-wise dimension of the curved plate 62 is large at right side and is small at left side. Consequently, right part of the curved plate 63 protrudes frontward, and path length of the resin sheet is constant at every position in respect of right-left direction. The curved plate 63 has a large cutout 631 that is positioned at center between right and left fringe of the curved plate 63. The cutout 631 absorbs complex distortions or stresses incurred on the resin sheet 1 when resin sheet 1 having rigid display panels in the pockets 15B slides down along the curved plate 63, as to enable smooth feeding along the curved plate 63. In an illustrated example, bottom end of the curved plate 63 is disposed as slightly lower than horizontal top plate 651 of the steel table 65.

As shown in FIG. 17, the vertically feeding area 602 is comprised of the sliding bracer plate 69; at a long top and bottom of which respectively disposed are third and fourth roller sets 673 and 674 having structure and dimensions equal to the first and second roller sets 671 and 672, as to achieve vertically downward feeding of the resin sheet. The sliding bracer plate 69 has right-left-wise elongated holes 685 in response of the resin rollers 677 of the third and fourth roller sets 673 and 674, likewise with those on the tilted top plate 661.

At between the third and fourth roller sets 673 and 674, a sheet-feeding guide 691 formed of a rectangular-section steel bar is attached on the sliding bracer plate 69 at along its right fringe, in same manner as in the horizontally feeding area 601. An area leftward of the sheet-feeding guide 691 is a rectangular opening 692 of the sliding bracer plate 69, except for its left-hand fringe portion and in vicinity of sheet-feeding guide 691.

A heat sealer 64 is disposed at the opening 692. The heat sealer 64 is comprised of; a heating element 641 that is disposed at reverse side of the opening 692 and of the resin sheet 1, as to be extended in vertical direction; and a push-abutting element 642 that is disposed at obverse side of the resin sheet 1 as to be likewise elongated in vertical direction. The push-abutting element 642 is comprised of; a pneumatic cylinder 643 elongated in vertical direction; and a vertically elongated blade 644 attached on side face of actuator part 643A of the pneumatic cylinder 643. The heating and push-abutting elements 641 and 642 are supported by a beam 645 attached on the steel table 65, where right-left-wise position of the beam 645 is adjustable. The blade 644 is attached on the main body of the pneumatic cylinder 643 through springs 649, thereby the blade 644 swiftly returns to its original position after push-abutting motion.

At a position corresponding to vicinity of upper-right corner of the opening 692, an optical sensor 646 as in the horizontally feeding area 601 is disposed as supported by a likewise reverse-L-shaped bracket 647 that is attached on the sliding bracer plate 69. The optical sensor 646 receives red laser light from a light emitter 648 disposed on reverse side of the opening 692 and of the reverse sheet 1 and detects interruption of the laser light. At a time passing down of one or more display panels are detected by the optical sensor 646, the pneumatic cylinder 643 is actuated so that the blade 644 pushes the resin sheet 1 as to abut on the heater element 643. Then, heating with impulse currency takes place for example, thereby achieving a heat-sealing operation as to close the pockets 15B by joining the obverse and reverse sheet parts 1A and 1B.

Figure 23:
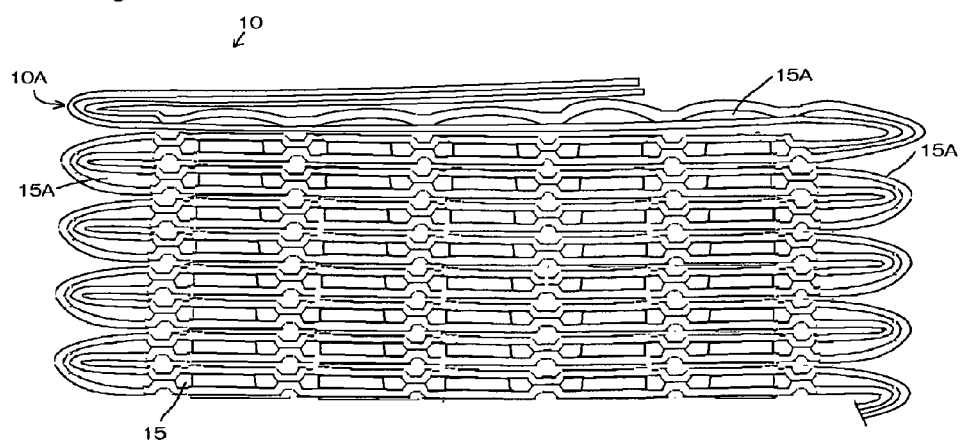
FIG. 23 is a schematically sectional view showing a packing unit in which the band-shaped package is folded at its vacant receptacles as to be zigzag-wise alternately folded and stacked.

In this way, band-shaped package 10 as shown in FIG. 9 or 10 is formed. As shown in FIG. 23, on tracking along the band-shaped package 10, disposed is one vacant receptacle 15A after every five consecutive ones of the receptacles 15 filled with the display panel. The band-shaped package 10 is folded at the vacant receptacles 15A as to form a zigzag form or waveform. In an example illustrated in FIG. 24, the band-shaped package 10 is wound around a rectangular corrugated cardboard 45 by folding at the vacant receptacles 15A. The band-shaped package 10 also has on its end, a lead part 10A that correspond for about 5 to 8 consecutive vacated receptacles 15A. The lead part 10A may be formed of either of the rows of the vacant receptacles 15A and/or a part of resin sheet that is merely provided with the to-be-torn line 18 and not with the joined areas 12. The band-shaped packages 10 are placed as packed in box and transported; in a state shown in FIG. 23 where folded in a zigzag manner, or in a state shown in FIG. 24 where packing unit 100 is formed by winding the band-shaped packages 10 around a honeycomb structured cardboard 45. The lead part 10A comes to outermost of the packing unit 100 and serves as a cushion.

By forming each of the vacant receptacles 15A after forming a predetermined number of the receptacles 15 filled with the display panels, number of the display panels in a packing unit 100 is easily counted. When folding is made after every five consecutive ones of the filled receptacles 15, the number is easily grasped by counting number of layers and multiplying it by 5.

Figure 24:
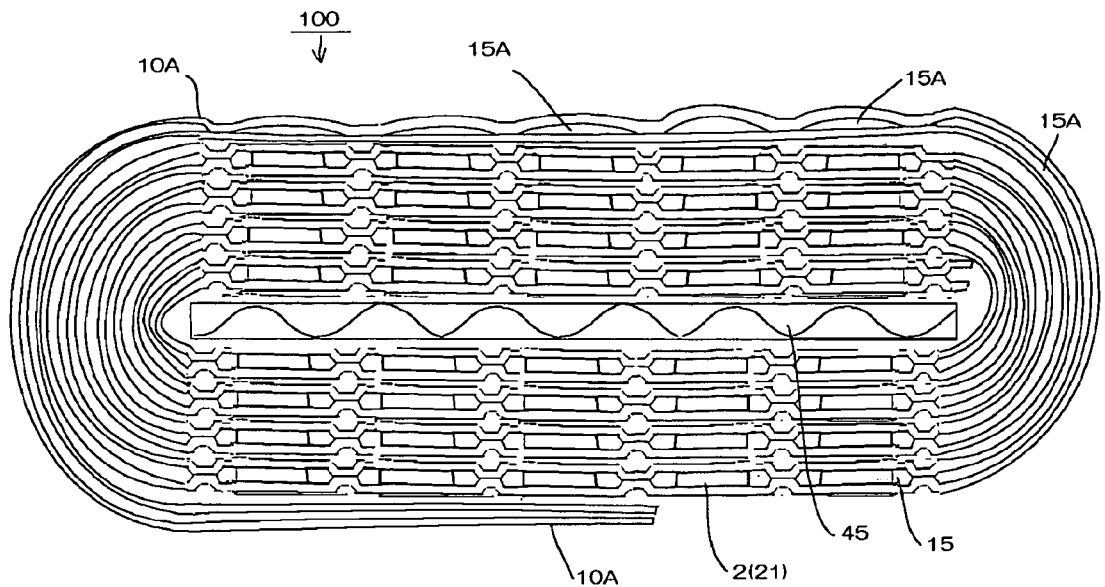
FIG. 24 is a schematically sectional view showing a packing unit in which the band-shaped package is folded at its vacant receptacles as to wound up around a corrugated paperboard.

The band-shaped package 10 as in FIGS. 9-10 where the receptacles 15 are partitioned with adjacent ones by a single linear joined portions is suitable for a manner of packing as in FIG. 23-24 where the package 10 is folded at vacant receptacles. The vacant receptacles 15A facilitates the folding, and in particular protects protruding portions of the display panel modules such as distal end portions of the connector boards that protrude into the folded portions from the receptacles 15.

Figure 25:
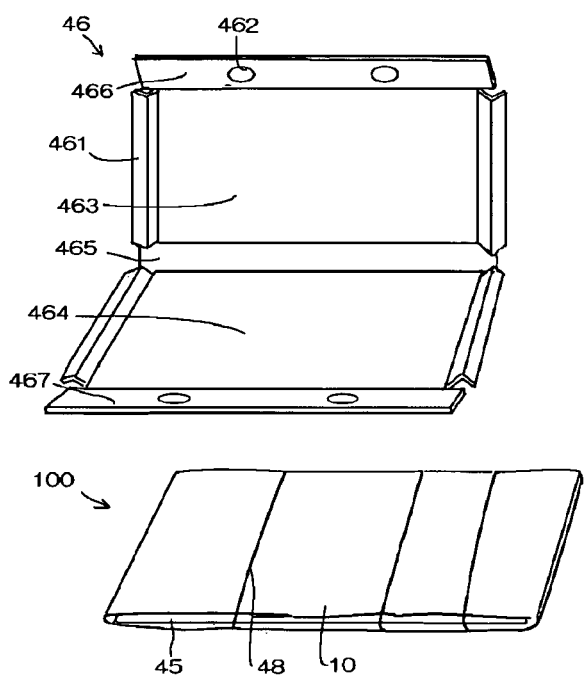
FIG. 25 is a perspective view showing an inner box at its opened-up state as well as the packing unit according to FIG. 24.
Figure 26:
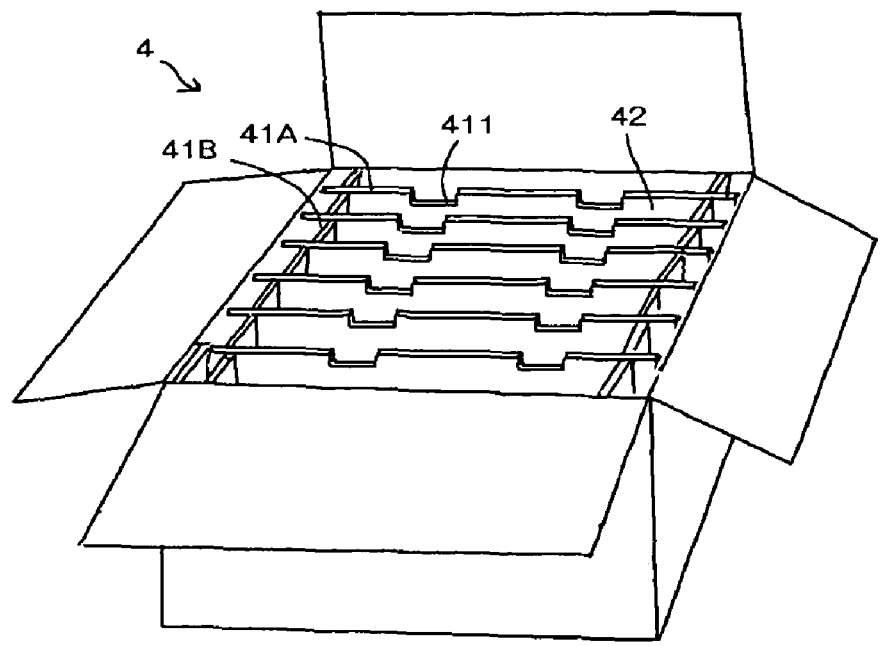
FIG. 26 is a perspective view showing an outer box provided with partitions for containing a plurality of the packing units according to FIG. 24.
Figure 27:
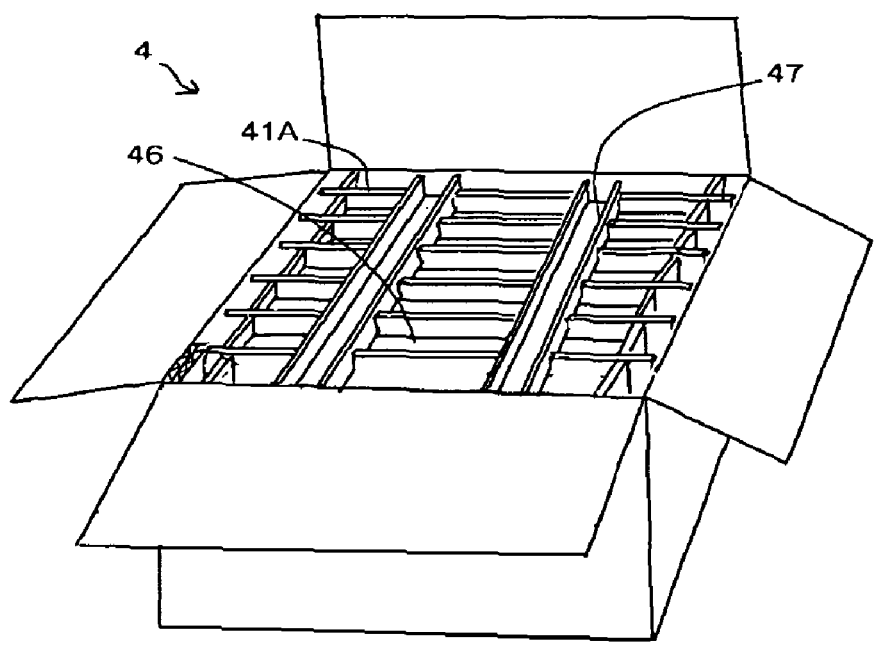
FIG. 27 is a perspective view showing a state the inner boxes of FIG. 25 are inserted into the outer box of FIG. 26.

FIGS. 25-27 show an example of placing and packing the packing units 100 in a box. FIG. 25 shows an inner box 46 for containing one of the packing units 100 in a state being opened up, along with the packing unit 100. The inner box 46 is a flat rectangular box that is formed by making non-dividing cuts in a rectangular cardboard and folding up the cardboard. The inner box 46 is comprised of; a pair of main face parts 463 and 464; an elongated bottom part 465 linking the main face parts at a long side of each part; and two lids 466 and 467, each of which shelf-wise protrudes from another long side of the respective main face part, and which are overlaid with each other when the inner box 46 is formed by the folding. L-section portions protruding from both short sides of the each main face part are clamping portions 461 for clamping fringe portions of the packing unit 100 when the inner box 46 is closed. in detail, the clamping portions 461 clamp the rectangular cardboard 45 through the vacant receptacles 15A. Each of the lids 466 and 467 has two circular holes 462 for picking up the inner box 46 when packed in a cardboard box 4.

In an illustrated example, strings 44 or braids are wound around the packing unit 100 in its widthwise direction, thereby tied up state are kept. Instead of the strings 44, adhesive tapes may used. However, such tying up may be omitted when the packing unit 100 is placed into the inner box 46 immediately after the winding around the rectangular cardboard 45.

FIG. 26 shows an outer or cardboard box 4 having partitions 41, for placing the inner boxes 46. Inside of the outer box 4 is partitioned by the partitions 41A and 41B that are formed of corrugated cardboard same with that for the outer box 4 and the inner box 46, and is arranged in vertical direction and is assembled together to form a lattice-form lateral section. Thus, five of flat rectangular storage chambers 43 or recesses are formed in a parallel arrangement. Each of the partitions 41A run in parallel with the storage chambers 43 has two angled-C-shaped cutouts 411 at each of its top and bottom sides.

FIG. 27 shows a state in which inner boxes 46 are placed in the outer box 4 of FIG. 26. Shock-absorbing spacer 47 formed of angled-C-section-wise folded cardboard are fitted into the cutouts 411 of the partitions 41A. Two of the shock-absorbing spacers 47 are disposed on each of top and bottom faces of the outer box 4 as to keep the inner boxes 46 as separated from bottom face and lids of the outer box 4.

The pockets 15B may be formed just before reaching the panel inserting area 61 by installing an ultrasonic bonding device on the packing device and thus forming peelable joined areas 12A, instead of using a resin sheet 1 already provided with pockets 15B as above. In otherwise, only the joined areas 12D along the fringe (at lowermost side on the tilted top plate 661) may be formed on the resin sheet 1 on beforehand, and then the joined areas 12C between the receptacles 15 may be formed after inserting of the display panels.

Figure 28:
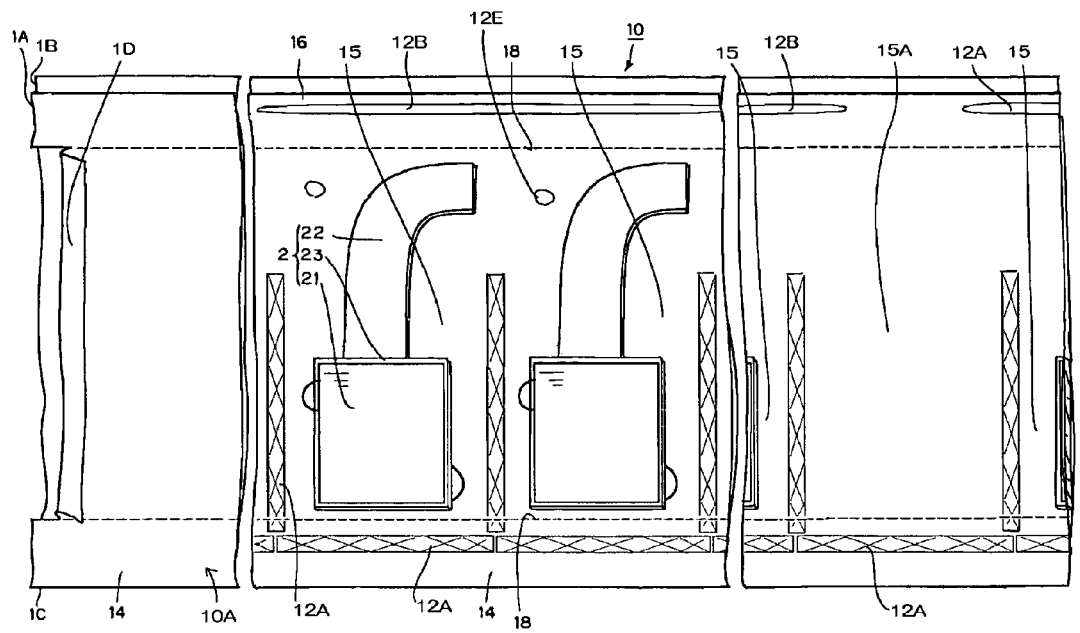
FIG. 28 is a plan-view-wise perspective view comparable to the FIG. 10, showing a modified example of the band-shaped package.

FIG. 28 shows a modified example of the band-shaped package 10, which has dot-shaped joined areas 12E for further positioning and retaining the display panel modules 2. The dot-shaped joined areas 12E may be formed by a heat-sealing technique at a time point just before reaching to the second roller set 672. For such forming, another opening may be formed on the tilted top plate 661 in vicinity of the second roller set 672, and an impulse sealer in a similar manner with the heat sealer 64 may be disposed. The dot-shaped joined areas 12E may be disposed in an occasion where the connector boards 22 is elongated and thus the display panel modules may otherwise be displaced and swayed in the receptacles. Instead of forming the dot-shaped joined areas 12E, punching for making the holes may be made as to join the obverse and reverse sheet parts 1A and 1B at pouched portions.

3. Third Embodiment

Returnable Container

Figure 29:
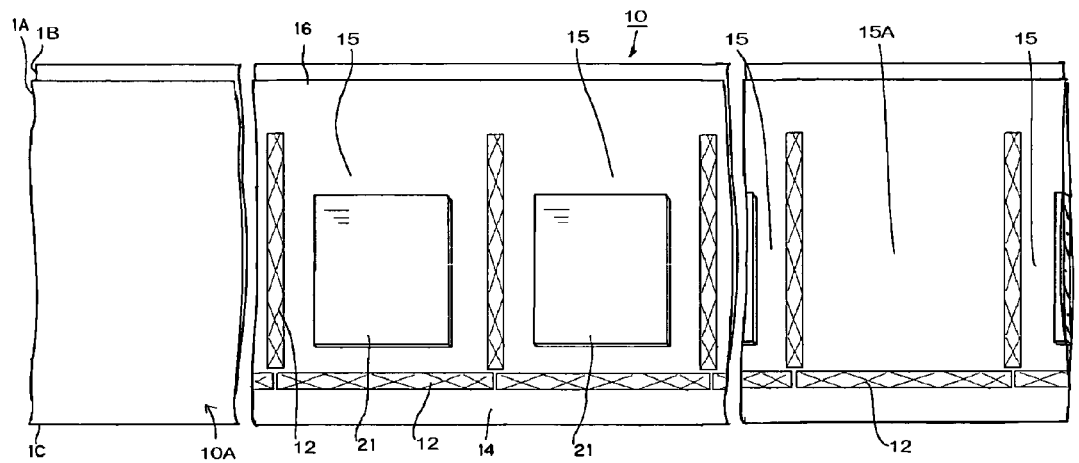
FIG. 29 is a plan-view-wise perspective view showing a band-shaped package in which the display panels proper are placed as readily retrievable and re-insertable and in which vacant receptacles are provided in a certain interval.
Figure 30:
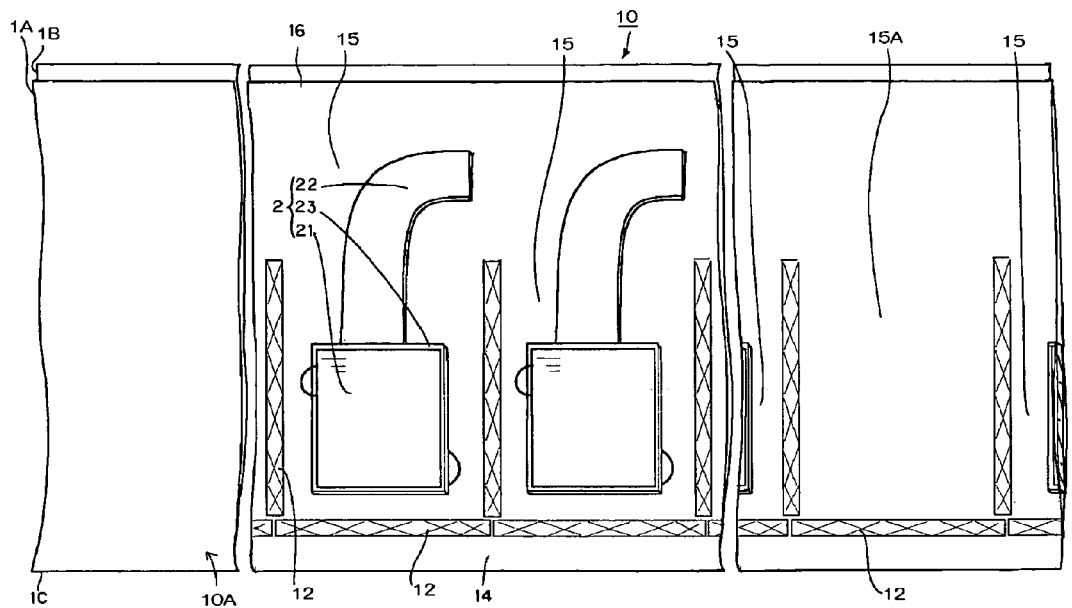
FIG. 30 is a plan-view-wise perspective view showing a band-shaped package in which display panel modules are placed and which is in otherwise same as that shown in FIG. 29.
Figure 31:
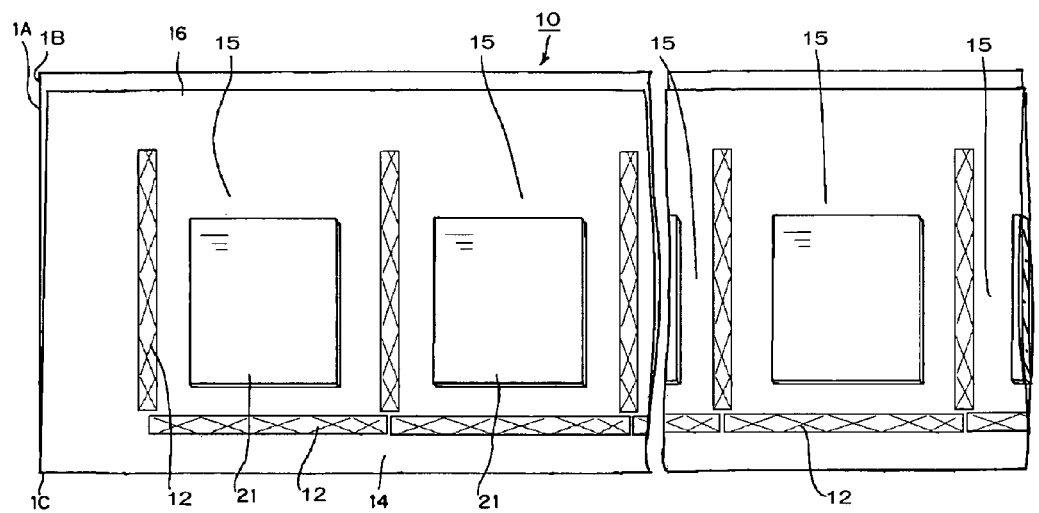
FIG. 31 is a plan-view-wise perspective view showing a band-shaped package which is omitted with the vacant receptacles and in otherwise same as that shown in FIG. 29.

An embodiment of the band-shaped package as a returnable container, or an alternative to the cell rack, is explained below by use of the FIGS. 29-31, FIG. 3 and FIGS. 23-24. FIGS. 29-31 respectively show examples of the band-shaped packages; among them, the package 10 of FIGS. 29 and 31 has the display panels proper 21 while the package 10 of FIG. 30 has the display modules 2. The band-shaped packages 10 in present embodiment are same with those explained in respect of the FIGS. 9-10, except that; the joined areas 12 are not formed along the double-margin fringe opposite to the folded portion 1C, thus, the receptacles 15 are not closed at their openings for the inserting. In a concrete example, the sheet-length-wise dimension of the each receptacles 15 is 50-100 mm and width of the each joined areas 12 is 1-10 mm for example.

Figure 32:
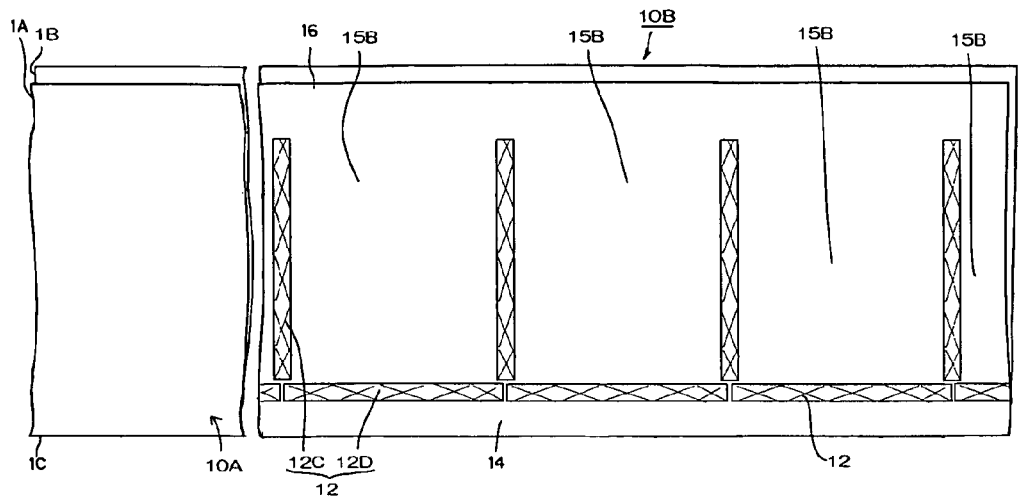
FIG. 32 is a plan-view-wise perspective view as in FIG. 1, showing a receptacles-equipped sheet band to be inserted with the display panels proper.

As shown in FIG. 32, the resin sheet 1 in a band shape is provided on beforehand with pockets 15B, as to form a receptacles-equipped sheet 10B having a band shape. In an illustrated example, the joined areas 12A is comprised of; joined areas 12C linearly run along the folded portion 12C with as slightly distanced; and joined areas 12D that are branch-wise extended therefrom in widthwise directions with a constant interval. The joined areas 12C and 12D may be made by ultrasonic bonding or by a heat-sealing technique.

As shown in FIGS. 29-31, each of the receptacles 15 are not closed, thus, taking out and reinserting of the display panels may be made. Hence, when the package 10 is placed such that the openings 15C for the insertion come to upper side, the receptacles-equipped sheet 10B may be used as a container repeatedly usable, as for replacing the cell rack.

In the band-shaped packages 10 shown in the FIGS. 29-30, each of vacant receptacles 15A is formed as to follow consecutive ones of a predetermined number of the receptacles 15 filled with display panels. The band-shaped package 10 also has on its end, a lead part 10A that correspond for about 5 to 8 consecutive vacated receptacles 15A. The lead part 10A may be formed of either of the rows of the vacant receptacles 15A and/or a part of resin sheet without the joined areas 12. In a same manner with band-shaped packages 10 in FIGS. 9-10, the package 10 may be folded at its vacant receptacles 15A, as to achieve a state shown in FIG. 23 or FIG. 24. Concrete constructions and advantageous effects are same with that explained in respect of the state in FIG. 23 and the packing unit 100 in FIG. 24.

Transportations of the band-shaped packages 10 in FIG. 29 or FIG. 30 may be made after folding them in a waveform shown in FIG. 23 and placing them respectively in the storage chambers 42 in a cardboard box 4 having partitions 41 as shown in FIG. 3.

Figure 33:
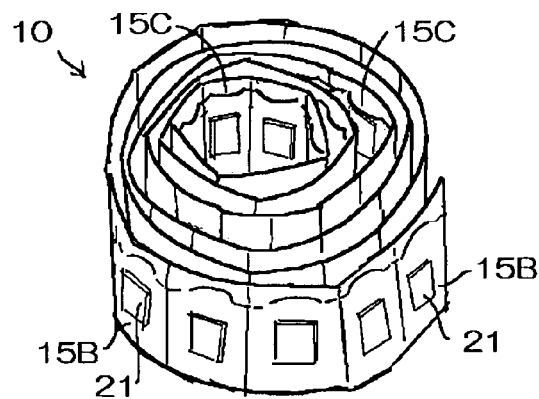
FIG. 33 is a perspective view showing the band-shaped package of FIG. 31 in a state of a convolution.

FIG. 31 shows a band-shaped package 10, in which no vacant receptacles 15A are formed and display panels proper 21 are successively inserted in the receptacles, and in which no lead part 10A is formed. FIG. 33 shows the band-shaped package 10 of the FIG. 31, in a convoluted state. In an illustrated example, no core for winding therearound is used and the obverse sheet part 1A of the FIG. 31 comes to an inward face. The band-shaped package 10 in a sate of FIG. 33 is suitable for transportation placed in a circular cage 75 shown in FIG. 34 for example. As shown in FIG. 33, an appropriate extent of strains are formed on the resin sheet 1, thus, the openings 15C for the insertion are apt to be fully opened; and this is desirable for subjecting the display panels or the like to treatment such as vacuumed heating.

Figure 34:
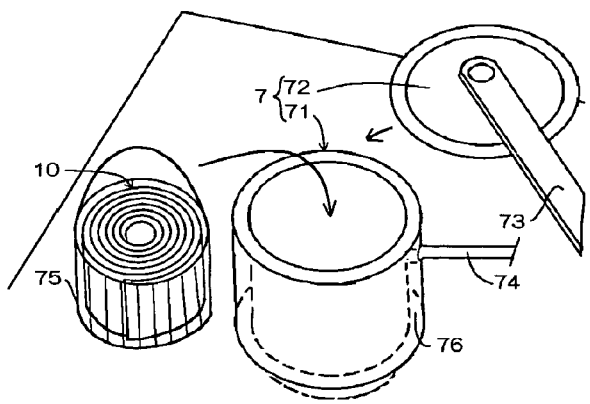
FIG. 34 is a schematic perspective view showing a state the band-shaped package as shown in FIG. 33 is placed in a bench-scale autoclave.

FIG. 34 shows a state the band-shaped package 10 of FIG. 31 is charged into a bench-scale autoclave 7. Because the package 10 is held in a space-saving form, and the openings 15C for the insertion are fully opened, the band-shaped package 10 packed in this form is suitable for charging in a reactor vessel of the like in a small volume; especially in a typical autoclave or reactor that is hollow cylindrical or in a spindle shape, due to being held in a state of circular convolution. In an example illustrated in FIG. 34, main part 71 of the autoclave 7 is equipped with piping 74 for vacuuming or pressurizing and with heater jacket 76 in which brine or the like is circulated. After charging the package 10 along with the circular cage 75 containing the package 10 into the main part 71 of the autoclave, the lid 72 hung from an arm 73 is placed on the main part 71 as to achieve sealing off the inside from the air. For example, for making treatment after attaching polarization plates on the display panels proper 21, brine preheated at 50° C. is circulated in the jacket 76, compressed nitrogen gas is introduced from the piping 74 to pressurize inside of the autoclave 7 to 5 kg/cm$^2$ (about 0.5 MPa) and the inside is held in this state for 40 minutes. When the treatment is completed, the package 10 is taken out in a state held in the circular cage 75.

Meanwhile, when for making a vacuuming or the like, a vacuum pump connected with the piping 74 for vacuuming and pressurizing is turn on after charging the package 10 in the autoclave 7. By using such band-shaped package in which the openings 15C for the insertion are opened, the vacuum treatment and keeping at some temperature or other treatment are achievable with remarkably simpler equipment or apparatus. When vacuum chambers for placing the cell racks are used, costs for equipment or facility and for management in checking safety is large and space for installation is large. Moreover, when to cope with change of the dimensions of the display panels or the like, all have to do is adjusting interspaces between the joined areas in the receptacles-equipped sheet band 10B in FIG. 32; and size-switching procedure as in using the cell racks is needed.

Methods as in above explained by use of FIGS. 33-34 may be used for the occasions where array or counter substrates are subjected to baking process. Instead of using the resin sheet formed of polyethylene or ethylene copolymer as explained above, the resin sheets with higher heat resistance and higher durability may be used when the treatment is made in a relatively high temperature.

4. Packing Modification—Mixed Packing

Figure 35:
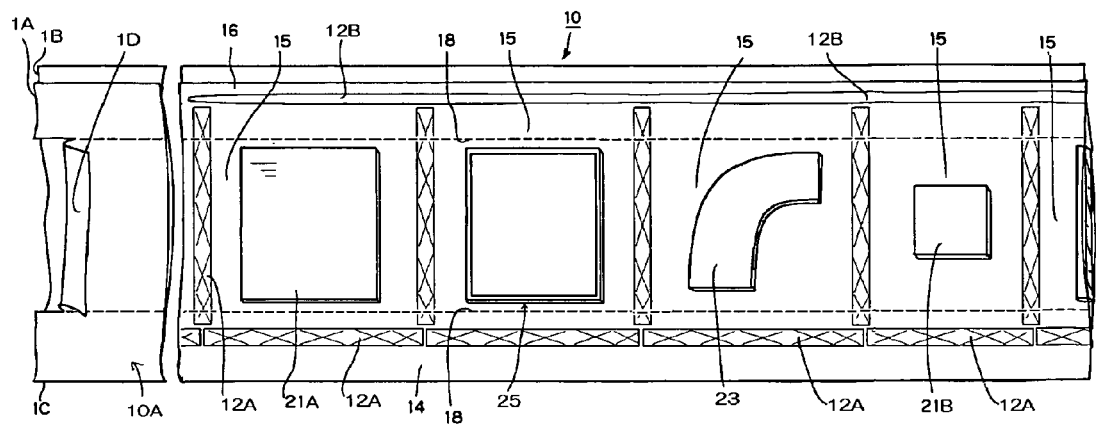
FIG. 35 is a plan-view-wise perspective view showing a band-shaped package in which each set of electronic or electric parts are placed in respective set of consecutive receptacles, and which is in otherwise same with that shown in FIG. 9.

FIG. 35 shows a band-shaped package, which has sets of parts, and in otherwise same with those shown in FIGS. 9-10.

In an illustrated example, a kit for assembling a display panel module 2 for a mobile phone is placed in each consecutive four receptacles 15, in which a main-screen display panel proper 21A, a backlight unit 25, a connector board 23 and a sub-screen display panel proper 21B are respectively placed in this order. The package 10 of FIG. 35 is continuously unpacked by the unpacking device 5 mentioned before as to supply the parts for the assembling line for the display modules 2.

Figure 36:
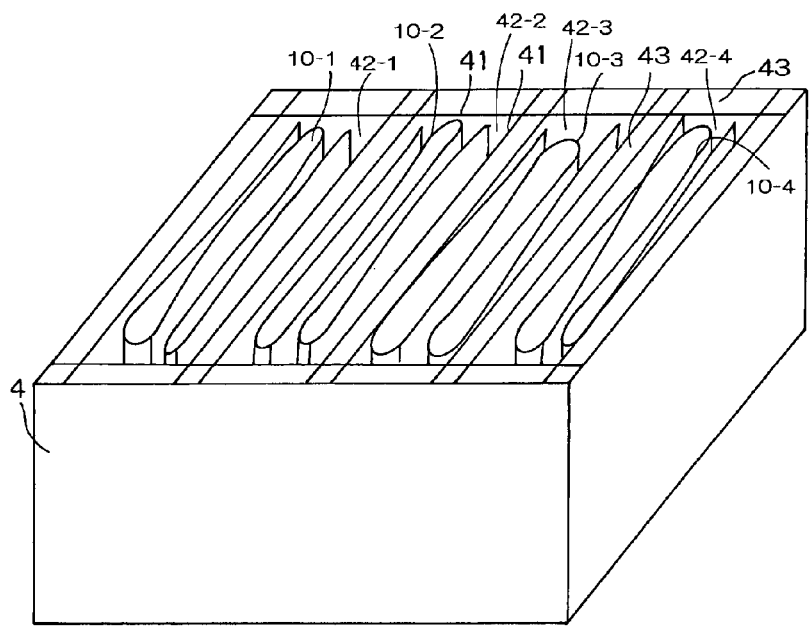
FIG. 36 is a perspective view as schematically showing a state where the band-shaped packages having different ones among a set of parts, with each other, and being placed and packed in a single cardboard box, in otherwise same with that in FIG. 5.

Meanwhile, such different parts may be respectively placed in packing units of FIG. 24, and placed in a single cardboard box 4. As shown schematically in FIG. 36, the main-screen display panel proper 21A, the backlight unit 25, the connector board 23 and the sub-screen display panel proper 21B are respectively placed in first, second, third and fourth band-shaped packages 10-1, 10-2, 10-3 and 10-4 as to be placed in first, second, third and fourth storage chambers 42-1, 42-2, 42-3 and 42-4 in the cardboard box 4 having partitions 41. The band-shaped packages 10-1, 10-2, 10-3 and 10-4 may be packed in a cardboard box as in FIGS. 24-27; in which the packages are folded up into a state of the packing unit 100 in FIG. 24; then placed in the inner boxes 46, and placed the storage chambers 42 as in FIGS. 26-27.

5. Modification or Concrete Examples in Receptacles-Equipped Sheet Band

5-1. Fringe Extension Areas

Figure 37:
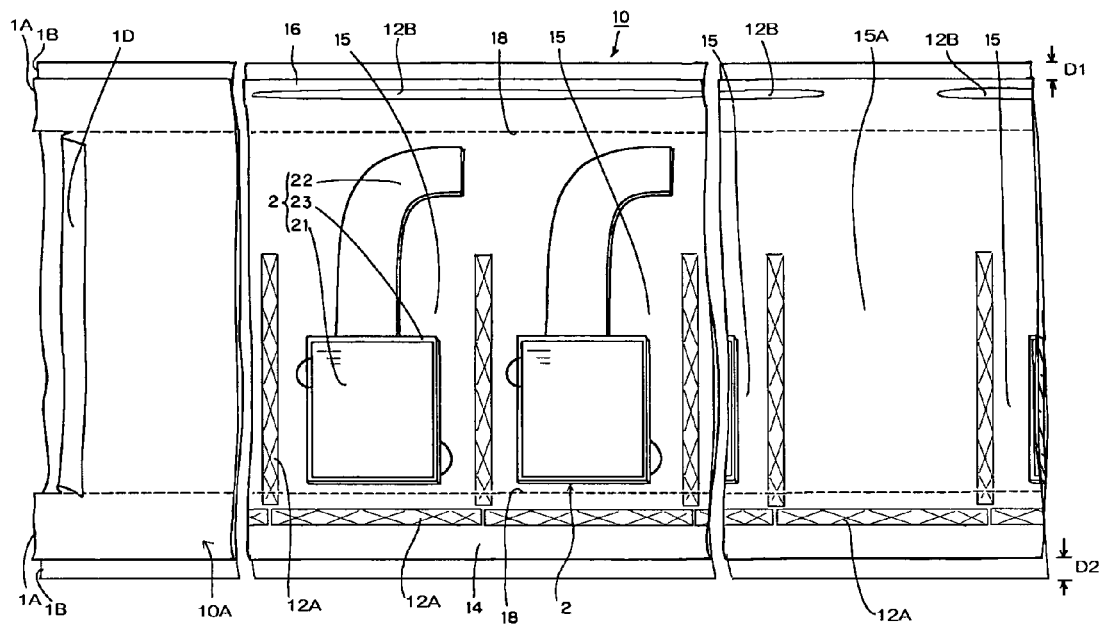
FIG. 37 is a plan-view-wise perspective view showing a band-shaped package in which the obverse sheet part 1A protrude from the reverse sheet part on both fringes, in otherwise similar with that in FIG. 10.

In an example shown in FIG. 37, the obverse sheet and reverse sheet parts 1A and 1B are formed of respective resin sheets separately supplied. On both fringes of the package 10, the obverse sheet part 1A protrude from the reverse sheet part 1B. Width of the fringe extension area 14 along the bottoms of the receptacles 15 is larger than that of the fringe extension area 16 along the openings 15C for the insertion. This is in correspondence with the fact that the packages 10 are placed as to be vertical when placed in the cardboard box 4, so that the fringe extension area 16 at bottom become wider than the other.

As for preferable dimensions "D1" and "D2" of protrusion of the obverse sheet part 1A from the reverse sheet part 1B at fringes of the packages 10, at least one of the dimensions "D1" and "D2" is no less than 10 mm. Same goes for occasions where only one double-margin fringe is formed on the package 10. By disposing enough width of "a finger-wise picking fringe area" or a single sheet area, separating fringe portions of the obverse and reverse sheet parts 1A and 1B may be easily made; when, for sampling test, unpacking at randomly chosen portion is needed.

5-2 Coloring

Figure 38:
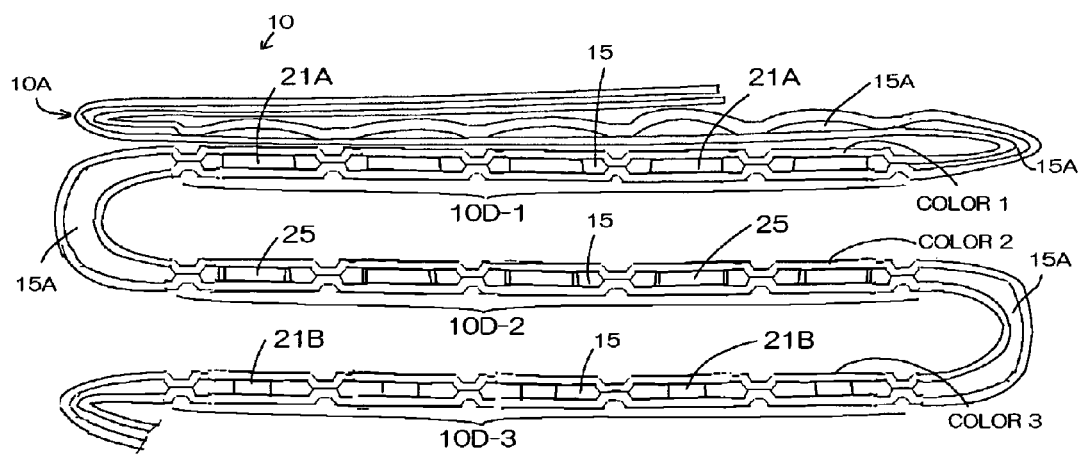
FIG. 38 is a plan-view-wise perspective view showing a band-shaped package which has plurality of regions that have different electronic parts and are respectively colored in different colors.

FIG. 38 shows a band-shaped package 10, which has plurality of regions 10D-1, 10D-2 and 10D-3 that are respectively colored in different colors "COLOR-1, COLOR-2 and COLOR-3" (blue, red and green for example). Each of the regions 10D-1, 10D-2 and 10D-3 is formed of consecutive receptacles 15. In an illustrated example, for assembling the display panel modules 2 for mobile phones, a row of five main-screen display panel proper 21A, a row of five backlight unit 25 and a row of five sub-screen display panel proper 21B are respectively placed in first, second and third regions 10D-1, 10D-2 and 10D-3. On the package 10, the vacant receptacles 15A are formed on interspaces between the regions 10D-1, 10D-2 and 10D-3. The package 10 enables taking out of five pieces of parts at every motions using the unpacking device 5 mentioned before.

By providing coloring for each regions or color coding, work efficiency on unpacking is enhanced, and errors in sorting are decreases. Moreover, the coloring on the resin sheet 1 contributes for protecting the display panels or the like in the receptacles from sunshine or ultraviolet lights. For different band-shaped packages 10, different coloring may be given, for designating destination place, packed place or the like. Color coding may be made by non-color transparency, blue, red, smoke, orange, brown, pink, green and so on. For example, the first, second, third and fourth band-shaped packages 10-1, 10-2, 10-3 and 10-4 may be given with colors different with each other.

The coloring may be made by blending of the color pigment in the resin material, or printing on the resin sheet 1 after molding. By printing, colors may be changed within one of the packages 10, in response of changing of types or variations of the parts. By printing, ornamental patterns with combination of differently colored areas may also be given on the package 10. The printing of colors may be made simultaneously with printing of barcodes or other marks or letters. In order for enabling appearance inspection or the like, color of the coloring may be chosen from the colors different with the electronic or electric products in the receptacles and with letters or marks for production lots or the like. Density of the coloring may be set in an extent as not to undermine transparency of the resin sheet 1 and to make outwardly visible the outlines and production lot numbers or the like of the electronic or electric products such as display panels. Additionally, the coloring may be made only to the obverse sheet part 1A.

5-3 Joined Areas

The joined areas 12 for defining the receptacles 15 may be made in different manners as explained below.

The procedure for forming the joined areas 12A or 12 (please see FIG. 22 or FIG. 32) on the band-shaped resin sheet 1 as to form the pockets 15B may be made typically by a tool in which a plurality of strip-shaped tool elements are combined together in a shape of "T" or "L" letter. The tool face is consisting of; parts corresponding to the joined areas 12C or branches that partitioning consecutive receptacles; and parts corresponding to the joined areas 12D that is along bottom of the pockets 15B, as to form the "T" or "L" shape. With intermittently feeding of the resin sheet 1, the tool successively abuts on the resin sheet 1 as to form the joined areas for connecting obverse and reverse sheet parts 1A and 1B.

Figure 39:
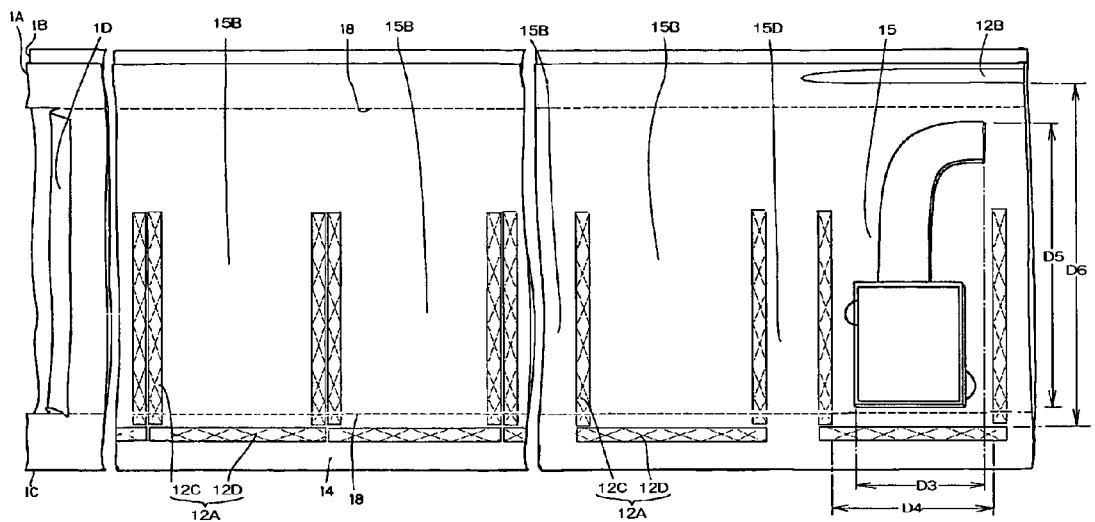
FIG. 39 is a plan-view-wise perspective view showing a resin sheet band having pockets in angled-C shape, in otherwise same with that in the FIG. 22.

As shown in FIG. 39, the tool for forming the pockets 15B may be in an angled-C-shape that is consisting of portions corresponding two branch-shaped joined areas 12C, and a portion corresponding to the joined areas 12D that is along bottom of the pockets 15B. The branch-shaped joined areas 12C formed by two consecutive procedure may be overlapped or continuous as in left part of the FIG. 39; and in otherwise, vacant spaces 15D may be made between the pockets 15B as shown in right part of the FIG. 39.

Figure 40:
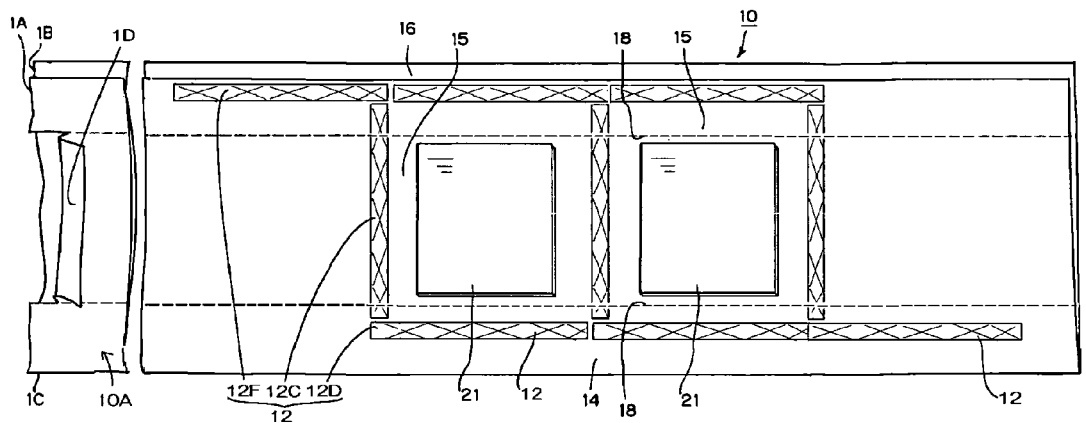
FIG. 40 is a plan-view-wise perspective view showing a state joined areas encircling the display panels proper are successively formed by right-angled Z-shaped tool.

Meanwhile, as shown in FIG. 40, a right-angled Z-shaped tool may be successively abutted as to form the joined areas 12 that encircle the receptacles 15. Thus formed joined areas 12 is consisting of; joined areas 12F that run along the double-margin fringe; joined areas 12C that run in width direction of the resin sheet; and joined areas 12D that run along the folded portion 1C. Forming of the joined areas by this tool is successively made at every time the electronic or electric product is placed on a predetermined position.

The joined areas do not have to be linear ones and may be formed of a plurality of strips as above, and may be formed in dashed lines or chain lines as to further facilitate peel-wise separating at unpacking process. Dots for forming such joined areas may be squared, circular, or elongated rectangular; and may be combinations of same-sized dots or of different-sized dots such as one-dot or two-dot chain line.

The joined areas may be formed by ultrasonic bonding and/or by a heat-sealing technique such as impulse sealing; and width of each of the joined areas is at least 0.1 mm.

In FIG. 39, referential marks are given to dimensions of the display panel modules 2 and of the receptacles 15. In a preferred embodiments in respect of such dimensions, sheet-length-wise inside dimensions D3 of the receptacles 15 is larger than sheet-length-wise dimensions D4 of the display panel modules 2 by 5 mm or more and is smaller than width-wise inside dimensions D6 of the receptacles 15; resultantly satisfying equation of: $D6+5 \text{ mm} \leq D3 \leq D6$. On the other hand, the sheet-width-wise inside dimensions D6 of the receptacles 15 is larger than sheet-width-wise inside dimensions D5 of the display panel modules 2 b7 5 mm or more, and is smaller than two times of the sheet-width-wise inside dimensions D5 of the display panel modules 2; resultantly satisfying equation of: $D5+5 \text{ mm} \leq D6 \leq 2 \times D5$.

The joined areas 12 may be formed in otherwise by coating adhesives or ultraviolet (UV) curing resins by a dispenser attached on a distal end of robot arm. The joined areas 12 are possibly formed by adhesive films, double-faced adhesive tapes, or by stitching with strings, or stapling with staples. The joined areas 12 is possibly formed by forming detachable "Zip Lock"s, by forming Ω-section shaped rail-wise protrusions on either of the sheet parts 1A and 1B, and forming protrusions having C-section shaped grooves on the other of the sheet parts 1A and 1B. By such construction, receptacles-equipped sheet band may be used as the "returnable container".

5-4 Incisions for Forming the To-Be-Torn Line

Figure 41:
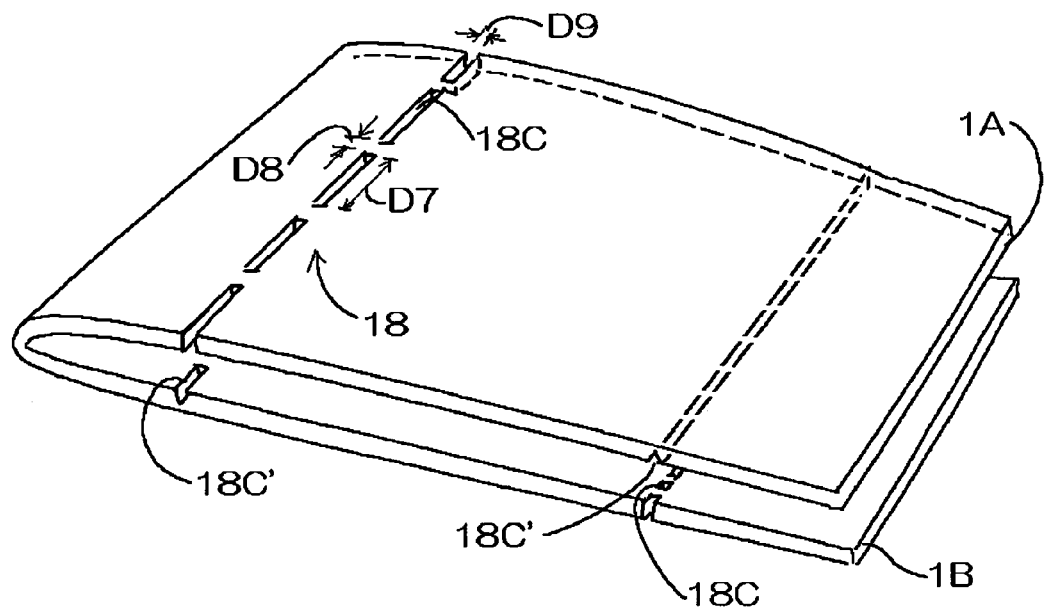
FIG. 41 is a perspective view showing a typical construction of to-be-torn lines.

FIG. 41 schematically shows shapes and incisions 18C for forming the to-be-torn line 18. In a preferred embodiment in respect of such dimensions, length D7 of the incisions 18C is larger than distance D8 between them; either of the length D7 and the distance D8 is no less than 0.01 mm; and width of the incisions 18C is no less than 0.01 mm. As showing in FIG. 41, the incisions 18C are formed at least one of the obverse and reverse sheet parts 1A and 1B; are not necessarily be through-holes on the sheet parts and may be formed by V-section groove 18C' on obverse or reverse faces of the at least one of the sheet parts 1A and 1B. As illustrated by broken lines in the FIG. 41, the incision may be the V-section groove 18C' continuous in sheet-length direction.

Figure 42:
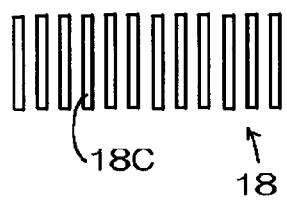
FIG. 42-44 are plan views respectively showing modified examples in respect of the incisions for forming the to-be-torn lines.
Figure 43:
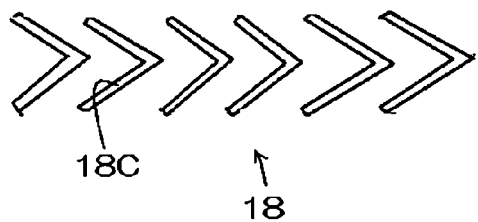
Figure 44:
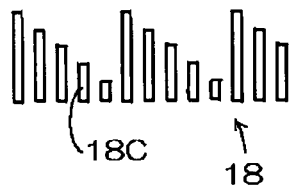

The incisions 18C are typically punched by Thomson blade or hard-metal tool in shapes of elongated rectangular; however, may be an elongated holes with rounded corners if appropriate. The incisions 18C may form a dotted line as shown in right-bottom portion of the FIG. 41, or may form one-dot or two-dot chain lines. As shown in FIG. 42, each of the incisions 18 may be rectangular elongated in width direction of the to-be-torn lines 18. As shown in FIG. 43, each of the incisions 18 may be dogleg shape as to enable tearing apart in a direction pointed by the dogleg shapes; and in otherwise may be trapezoidal. As shown in FIG. 44, the incisions 18 may be formed such that certain number of line-width-wise elongated rectangular in different line-width-wise dimensions are combined in a manner the line-width-wise is gradually reduced and such pattern is repeated along the to-be-torn line 18.

5-5 Layouts of the To-Be-Torn Lines

Figure 45:
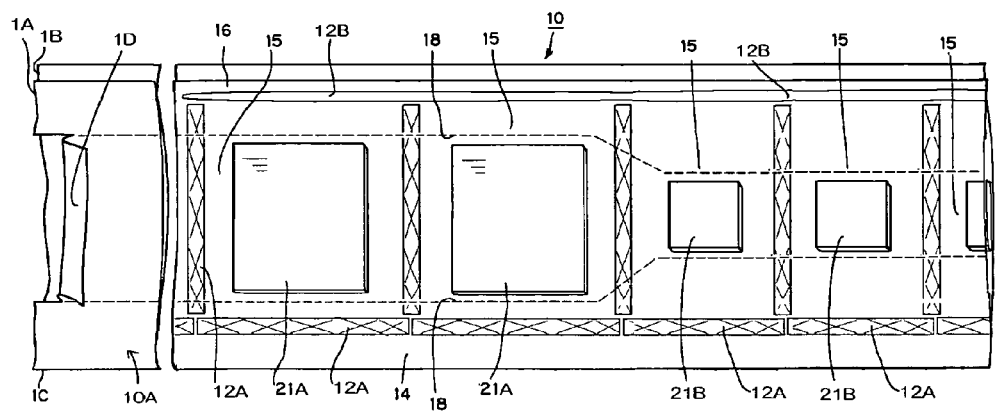
FIG. 45 is a plan-view-wise perspective view showing a construction of the to-be-torn lines, in which distance between the two to-be-torn lines fluctuated, and in otherwise same with that in the FIG. 36.
Figure 46:
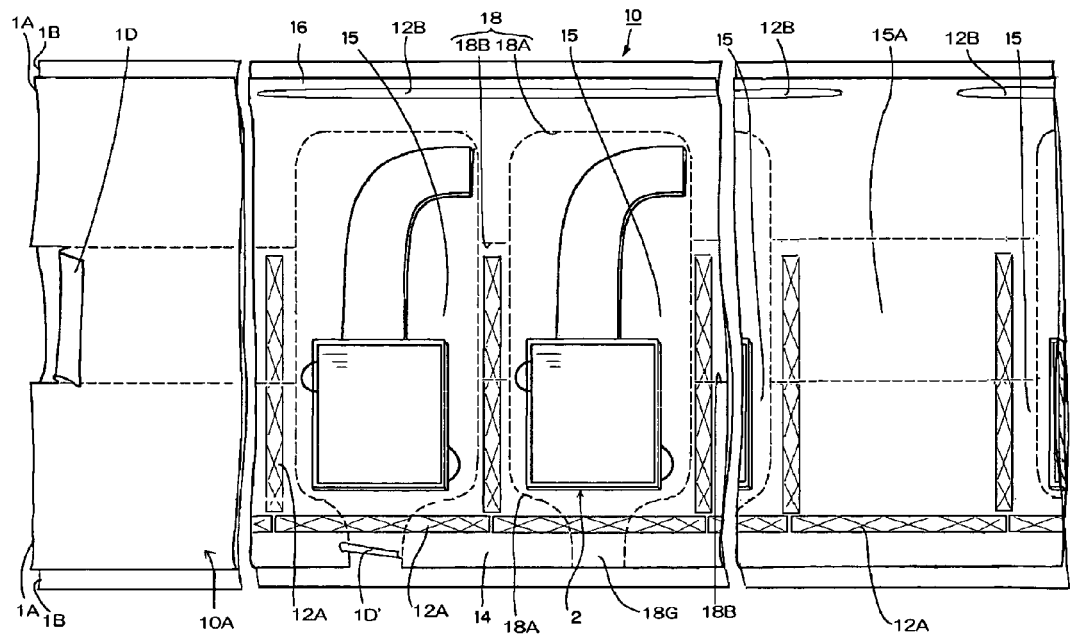
FIGS. 46 and 47 show constructions of the to-be-torn lines including individually taking-out lines, and in otherwise same with that in the FIG. 37.

As shown in FIGS. 45-46, the to-be-torn lines 18 may be broken-curved or smoothly curved. In an example shown in FIG. 45, the to-be-torn lines 18 is broken-curbed in correspondence with change of dimensions of the electric or electronic products in the receptacles; the to-be-torn lines 18 run along both fringes of the package 10 at just outside of outlines of the electric or electronic products; and distance between the to-be-torn lines 18 is large at along the main-screen display panels proper 21A and is smaller at along the sub-screen display panels proper 21B.

In an example shown in FIG. 46, the to-be-torn lines 18 as a whole is consisting of; an individually taking-out lines 18A in a roughly U-shape that run around respectively the display panel modules 2; and bridge lines 18B each linking side lateral sides of the U-shape. In an illustrated example, each of the individually taking-out lines 18A has a mouth 18G at along a double-margin fringe, sheet-length-wise dimension of which is smaller than other part of the taking-out lines 18A. When the obverse and reverse sheet parts 1A and 1B are pulls apart at the mouth 18G and nearby double-margin fringe, the cover sheet 1D' defined by the taking-out lines 18A may be removed from the obverse sheet part 1A. Hence, due to presence of the individually taking-out lines 18A, taking out of the electronic or electric product at randomly chosen portion for sampling test is facilitated. Because the bridge lines 18B are branched from the taking-out lines 18A by right angles, adjacent one of the receptacles 15 would not be unpacked. Moreover, due to presence of the bridge lines 18B, the band-shaped package 10 may be attached on the unpacking device 5 as mentioned before for example, as to continuously remove the cover sheet 1D.

In otherwise, the to-be-torn lines 18 as in FIGS. 9-10, which run along fringes of the package, may be formed on either one of the obverse and reverse sheet parts 1A and 1B; and in same time, only the individually taking-out lines 18A as in above may be formed on other one of the sheet parts 1A and 1B. In such construction, unpacking in continuous manner is easily made even after taking out a product at intermediate position for sampling inspection.

Figure 47:
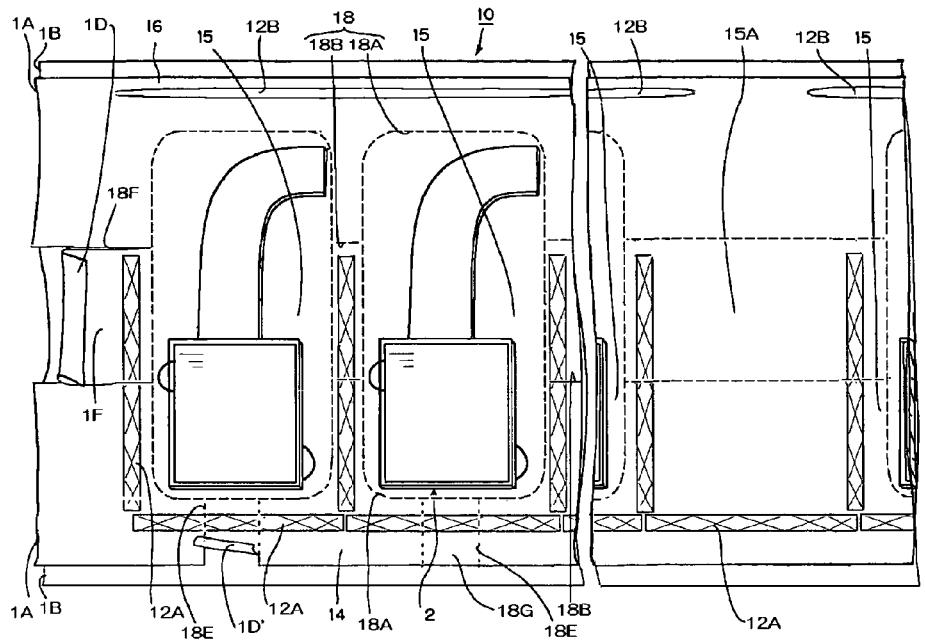

In FIG. 47, each of the individually taking-out lines 18A fully encircles the respective one of the display panel modules 2 as to form a rectangular shape of rounded corners; at along a double-margin fringe, auxiliary to-be-torn lines 18E are formed as to right-angle-wise branch out from the taking-out lines 18A along straight lines and reach the fringe; and in otherwise construction of the package 10 is identical with that of FIG. 46. The auxiliary to-be-torn lines 18E requires large stress than that for the other to-be-torn lines 18, may be formed of the incisions 18C with distance D8 (please see FIG. 41) larger than that of the other to-be-torn lines 18. In this construction of the package 10, the cover sheet 1D' of the individual product may be removed by opening from the double-margin fringe; and, in same time, the cover sheet 1D may be continuously removed. The package 10 of FIG. 47 has at its end, cut lines 18F are disposed in portion corresponding the bridge lines 18B, as to form a pull-out tab 18 between thereof for facilitating removal of the cover sheet 1D. In a construction of the to-be-torn lines in FIG. 47, two lines along the double-margin fringe for each receptacles may be formed of lines with same with the taking-out lines 18A; and in same time, the bridge lines 18B may be made of the auxiliary to-be-torn line 18E that require larger stress for tearing apart.

Figure 48:
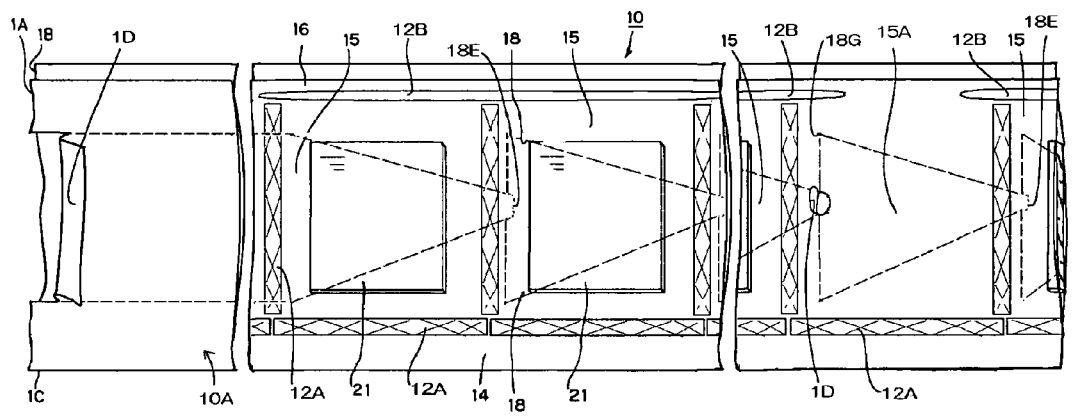
FIG. 48 shows a construction of the to-be-torn lines that run in sawtooth waveforms along a longitudinal direction of the band-shaped package, and in otherwise same with that in the FIG. 45.

FIG. 48 shows other construction of the to-be-torn lines 18, in which two to-be-torn lines 18 in sawtooth waveform run in length-wise direction of the band-shaped package 10 as to be symmetrical about centerline of the package 10. Thus, a region defined by the two to-be-torn lines 18 is shaped such that trapezoids are stacked along the centerline forming axis of the symmetry. The cover sheet 1D may be pulled out in a direction to which each of the trapezoids tapers. As shown in FIG. 48, the auxiliary to-be-torn lines 18E in an angled-C shape is disposed in an each portion, in which distance between the to-be-torn lines 18 has just been drastically increased after coming out from the narrowest portion, on tracking along the band-shaped package 10. Ends of the auxiliary to-be-torn lines 18E are linked with fold-wise bent portions 18H at the narrowest portion. When one of the auxiliary to-be-torn lines 18E is torn apart by applying some stress on the nearby portion of the resin sheet 1, a tab for individually taking out is formed; and by pulling the tab in a direction opposite to that of continuous removing of the cover sheet 1D, only one of the receptacles 15 is opened.

Figure 49:
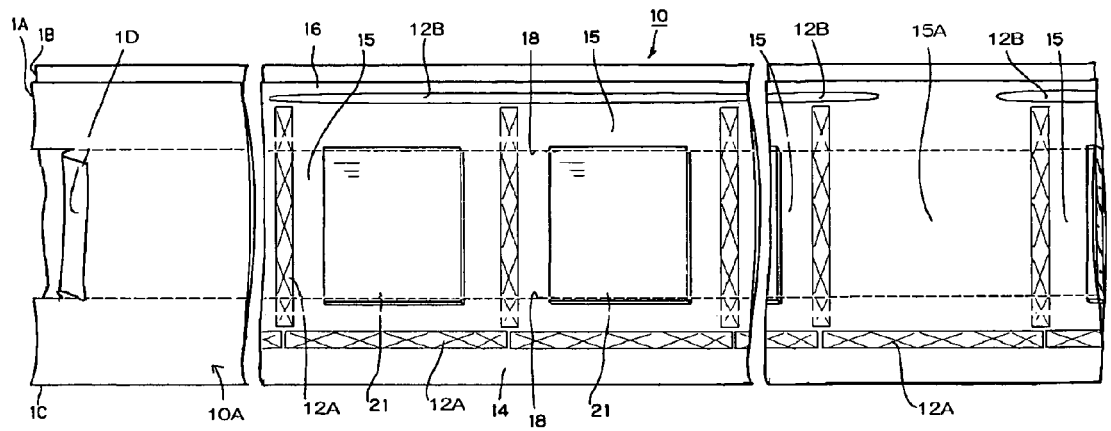
FIG. 49 shows a construction of the to-be-torn lines that run across outlines of the display panels proper, and in otherwise same with that in the FIG. 9.

FIG. 49 shows a band-shaped package, in which two to-be-torn line 18 are disposed to run across outlines of the display panels proper 21; and in otherwise same with the package 10 of the FIG. 9. Such construction is desirable in view of narrowing distance between the outlines of the panels and joined areas.

Figure 50:
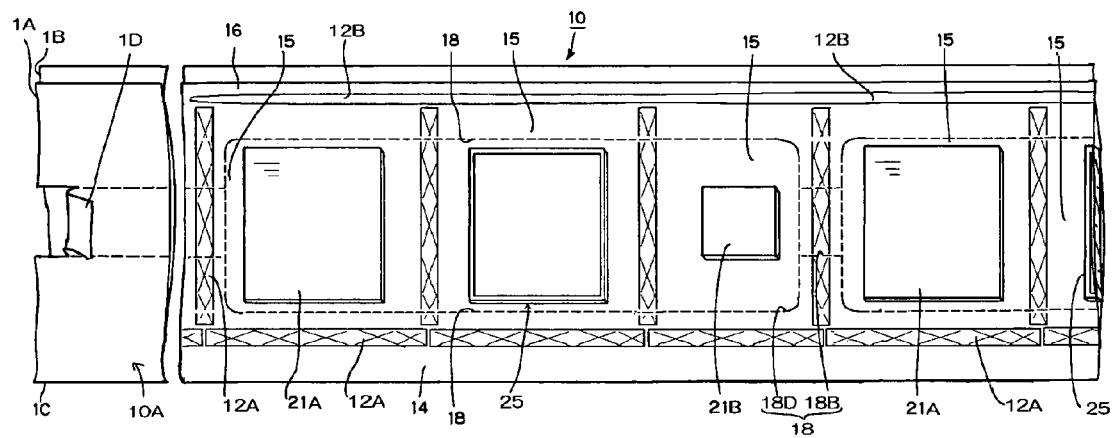
FIG. 50 shows constructions of the to-be-torn lines including kit-taking-out lines, and in otherwise similar with that in the FIG. 35.

FIG. 50 shows a band-shaped package, in which kit-taking-out lines 18D are formed as to enable taking out of a set of the parts. In and illustrated example, at each of three consecutive receptacles 15, a set of main-screen display panel proper 21A, a backlight unit 25 and a sub-screen display panel proper 21B is placed in a manner they are placed in the consecutive receptacles 15 in this order. By tearing apart one of the kit-taking-out lines 18D, the set of three parts becomes retrievable.

What is claimed is:

1. A method for manufacturing electronic or electric products, further comprising:
   sequentially placing first flat electronic or electric products as to be sandwiched by a resin-sheet band formed of one or pair of band-shaped flat resin sheet anal as to be arrayed in a longitudinal direction of the resin-sheet band;
   forming joined areas by bonding or fusing faces of the resin-sheet band as to form receptacles respectively for the first flat electronic or electric products;
   thus forming a band-shaped package in which the first flat electronic or electric products are arrayed in a row in a longitudinal direction; and
   then transporting or storing such array of the first flat electronic or electric products in the band-shaped package as to be used for producing second electronic or electric products;
   further comprising:
   pulling out first band part from the resin-sheet band of the band-shaped package to be wound around a first driving roller and pulling out second band part from the resin-sheet band of the band-shaped package to be wound around a second driving roller; and then,
   driving the first and second driving roller as to be synchronized with each other as to pull the first and second band parts in opposite direction;
   thereby sequentially pulling out and separating the first and second band parts from the resin-sheet band by tearing apart of the resin sheet or by peel-wise separating of the sheet parts, and in same time, introducing the band-shaped package into a place of the separating.

2. A method for manufacturing electronic or electric products, according to claim 1, further comprising:
   winding the first and second band part around a centrally bulging roller, diameter of which is smoothly increased as come closer to central portion as leaving from end portions, at before feeding to the first and second driving rollers; and
   the first and second band part being discharged after passing the first and second driving rollers respectively.

3. A method for manufacturing electronic or electric products, according to claim 2, further comprising:
   introducing the band-shaped package onto a platform, on which said separating of the first and second band parts is to be made and the electronic or electric products are to be retrieved, through an introducing or upstream portion of the platform part;
   winding the first and second band parts respectively around first and second centrally-bulging bracing rollers, each having a diameter which is smoothly increased as come closer to central portion as leaving from end portions and at between which the first and second band parts are pulled apart to upstream and downstream within a plane along a face of the platform, at before feeding to the first and second driving rollers, said pulling being made between the first and second centrally bulging rollers; and
   the first and second band part being discharged after passing the first and second driving rollers respectively;
   the second driving roller being disposed to be upwardly distanced from the second bracing roller, which is disposed in vicinity of the introducing portion, so that traverse-wise position of the band-shaped package on the introducing portion is adjusted to come to center of the introducing position by way of that the second band part is pulled upward across a distance between the second bracing roller and the second driving roller.

4. A method for manufacturing electronic or electric products, according to claim 1, further comprising:
   detecting a state where the first electronic or electric products are placed on the first band part as being retrievable and sent out to a predetermined retrieval position, and then stopping the driving of the first and second driving rollers; and
   picking up the first electronic or electric products and feeding them to process of assembling the second electronic or electric products.

5. A method for manufacturing electronic or electric products, according to claim 4, further comprising:
   introducing the band-shaped package onto a platform that has on its top face a cutout window for facilitating the picking up of the first electronic or electric products;
   said detecting and said picking up being made at a state a plurality of the first electronic or electric products are arrayed on the top face of the platform.

6. A method for manufacturing electronic or electric products, according to claim 1, wherein by said driving, the first and second band parts are pulled apart to upstream and downstream along a plane of the resin-sheet band.

7. A method of producing a band-shaped package for electronic or electric products, comprising:
   arraying flat electronic or electric products between obverse and reverse sheet parts of a resin-sheet band formed of one or pair of band-shaped flat, resin sheet, in a row; and
   forming joined areas by bonding or fusing the sheet parts as to form receptacles respectively holding the flat electronic or electric products in predetermined positions;
   further comprising:

providing the resin-sheet band in which the obverse and reverse sheet parts are continuous with each other at a folding portion of the resin sheet, and/or providing a first joined areas along one of fringes of the resin-sheet band, as to form receiving space for the electronic or electric products;

horizontally feeding the resin-sheet band to frontward while keeping the resin-sheet band as tilted as said one fringe to come to lower position;

inserting the electronic or electric products from said another fringe, during said feeding; and further feeding the resin-sheet band sliding along a smoothly curved face and then vertically downward, the curved face being configured to absorb difference in drop between the right and left sides and to thereby make constant path length along the curved face.

8. A method of producing a band-shaped package for electronic or electric products, according to claim 7, the curved face having a cutout.

9. A method for manufacturing electronic or electric products, according to claim 8, wherein the cutout is positioned at a center between right and left fringe of the curved face and extends in a right-left-wise range corresponding to a space and distance between a roller on right-hand side and a roller on left-hand side, which are for sending out the resin-sheet band from horizontally feeding area onto the curved face.

10. A method for manufacturing electronic or electric products, according to claim 7, further comprising:

adjusting of balance in feeding of the resin sheet band onto the curved face by way of 0.03-0.2 mm difference in diameters between a roller on right-hand side and a roller on left-hand side, which are for sending out the resin-sheet band from horizontally feeding area onto the curved face.

11. A method for manufacturing electronic or electric products, according to claim 7, further comprising:

forming second joined areas during such vertically downward feeding as to complete the receptacles that hold the electronic or electric products as not positionally shiftable.

12. A method for manufacturing electronic or electric products, comprising:

forming joined areas between faces of a resin-sheet band formed of one or pair of band-shaped flat resin sheet, thereby forming receptacles in a row for respectively receiving flat electronic or electric products or parts and forming fringe extension areas on both sides on a row of the receptacles in a manner that obverse and reverse sheet parts are overlapped without being joined in the fringe extension areas; then placing such products or parts in the receptacles of the resin-sheet band as to form a band-shaped package;

winding the band-shaped package around a shock-absorbent core to form a packing unit;

placing the band-shaped package in a cage or box, in a convoluted state or in a zigzaggedly folded state or in a state wound around a shock-absorbent core; and subsequently taking out such products or parts from the band-shaped package;

each opening of the respective receptacles being kept as opened so as to allow taking out and re-insertion of the electronic or electric products; in such a state, transporting or storing of the electronic or electric products being made; and reverse sheet parts being arranged substantially vertical during said transporting or storing.

13. A method for manufacturing electronic or electric products, comprising:

forming joined areas between faces of a resin-sheet band formed of one or pair of band-shaped flat resin sheet, thereby forming receptacles in a row for respectively receiving flat electronic or electric products or parts and forming fringe extension areas on both sides on a row of the receptacles in a manner that obverse and reverse sheet parts are overlapped without being joined in the fringe extension areas; then placing such products or parts in the receptacles of the resin-sheet band as to form a band-shaped package;

placing the band-shaped package in a cage or box, in a convoluted state or in a zigzaggedly folded state or in a state wound around a shock-absorbent core; and subsequently taking out the band-shaped package from the cage or box and then taking out such products or parts from the band-shaped package;

each opening of the respective receptacles being kept as opened so as to allow taking out and re-insertion of the electronic or electric products; in such a state, processing of the electronic or electric products being made; and reverse sheet parts being arranged substantially vertical during said placing in the cage or box and during said processing.

14. A method for manufacturing electronic or electric products, according to claim 13, said processing being vacuuming, pressurization, heating, cooling, pressing, warm air blowing, gas substitution, aging, or cleaning and being made after charging the band-shaped package into an autoclave, a reactor vessel or a processing chamber.

15. A method for manufacturing electronic or electric products, comprising:

sequentially placing first flat electronic or electric products as to be sandwiched by a resin-sheet band formed of one or pair of band-shaped flat resin sheet and as to be arrayed in a longitudinal direction of the resin-sheet band;

forming of joined areas by bonding or fusing faces of the resin-sheet band as to form receptacles respectively for the first flat electronic or electric products;

thus forming a band-shaped package in which the first flat electronic or electric products are arrayed in a row in a longitudinal direction;

then transporting or storing such array of the first flat electronic or electric products in the band-shaped package as to be used for producing second electronic or electric products;

feeding the flat resin sheet in a folded state forming a V-shaped section opened upward; and feeding the first flat electronic or electric products as to be dropped into or slid down into such opening of the V-shaped section so that dropping or sliding down of the first flat electronic or electric products is stopped at a position distanced from bottom end of the V-shaped section by a certain distance as to dispose the first flat electronic or electric products at a certain position in respect of width direction of the resin-sheet band; and said forming of joined areas being made at a state the first flat electronic or electric products are disposed in said certain position, in a manner that the joined areas are formed along a folded fringe and along an opening of the V-shaped section as well as at each interspace between the first flat electronic or electric products so as to form the receptacles and fringe extension areas on both sides on a row of the receptacles.

16. A method for manufacturing electronic or electric products, according to claim 15, wherein ridges of the first flat electronic or electric products are pressed with a tensional stress of the flat resin sheet when the joined areas are formed so that the first flat electronic or electric products are positioned further and retained in such position.

17. A method for manufacturing electronic or electric products, according to claim 15, wherein obverse and reverse sheet parts are overlapped without being joined in the fringe extension areas.

18. A method for manufacturing electronic or electric products, comprising:

sequentially placing first flat electronic or electric products as to be sandwiched by a resin-sheet band formed of one or pair of band-shaped flat resin sheet and as to be arrayed in a longitudinal direction of the resin-sheet band;

forming of joined areas by bonding or fusing faces of the resin-sheet band as to form receptacles respectively for the first flat electronic or electric products;

thus forming a band-shaped package in which the first flat electronic or electric products are arrayed in a row in a longitudinal direction;

then transporting or storing such array of the first flat electronic or electric products in the band-shaped package so as to be used for producing second electronic or electric products;

feeding the flat resin sheet in a folded state forming a V-shaped section opened upward so as to be continuously forwarded by sliding along inner face of a guide having the V-shaped section; and feeding the first flat electronic or electric products so as to slide down along the reverse sheet of the flat resin sheet that is sliding along a tilted inner face of a guide having a V-shaped section and having a readjusted opening angle of the V-shaped section so that a ridge of each of the first flat electronic or electric products abuts or rests on another inner face of the guide before reaching bottom end of the V-shaped section so as to dispose the first flat electronic or electric products at a certain position in respect of width direction of the resin-sheet band; and said forming of joined areas being made at a state the first flat electronic or electric products are disposed in said certain position, in a manner that the joined areas are formed along a folded fringe and along an opening of the V-shaped section as well as at each interspace between the first flat electronic or electric products so as to form the receptacles and fringe extension areas on both sides on a row of the receptacles.

19. A method for manufacturing electronic or electric products, according to claim 18, wherein an inner face of the guide is tilted from vertical line by 10 to 25 degrees.

* * * * *